US010035386B2

(12) United States Patent
Atsumi et al.

(10) Patent No.: US 10,035,386 B2
(45) Date of Patent: Jul. 31, 2018

(54) SEMICONDUCTOR DEVICE, METHOD FOR MANUFACTURING SEMICONDUCTOR DEVICE, TIRE, AND MOVING OBJECT

(71) Applicant: Semiconductor Energy Laboratory Co., Ltd., Atsugi-shi, Kanagawa-ken (JP)

(72) Inventors: Tomoaki Atsumi, Kanagawa (JP); Masayuki Sakakura, Kanagawa (JP); Kazuaki Ohshima, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 131 days.

(21) Appl. No.: 15/149,324

(22) Filed: May 9, 2016

(65) Prior Publication Data

US 2016/0332493 A1 Nov. 17, 2016

(30) Foreign Application Priority Data

May 11, 2015 (JP) .................................. 2015-096575

(51) Int. Cl.
| | |
|---|---|
| *B60C 23/00* | (2006.01) |
| *B60C 23/04* | (2006.01) |
| *H01L 29/786* | (2006.01) |

(52) U.S. Cl.
CPC ........ *B60C 23/0452* (2013.01); *B60C 23/009* (2013.01); *B60C 23/0454* (2013.01); *H01L 29/7869* (2013.01)

(58) Field of Classification Search
CPC ............ B60C 23/0433; B60C 23/0493; B60C 23/009; B60C 23/0428; B60C 23/0411;
(Continued)

(56) References Cited

U.S. PATENT DOCUMENTS 4,728,819 A * 3/1988 Vu .................. G11C 27/02
327/424
5,059,982 A * 10/1991 Bacrania ............. H03M 1/0836
341/161

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Hoi Lau
(74) *Attorney, Agent, or Firm* — Fish & Richardson P.C.

(57) ABSTRACT

To provide a circuit with low power consumption, a semiconductor device with low power consumption, a highly reliable semiconductor device, a tire whose performance is controlled, a moving object whose performance is controlled, or a moving object with a high degree of safety. A tire provided with a semiconductor device is provided. The semiconductor device includes a circuit portion, an antenna, and a sensor element. The circuit portion includes a transistor. The transistor includes an oxide semiconductor. The sensor element is configured to measure the air pressure of the tire.

16 Claims, 44 Drawing Sheets

(58) Field of Classification Search
CPC ............ B60C 23/0408; B60C 23/0494; B60C 23/0401; B60C 23/0452; G11C 27/02–27/028
USPC ............. 340/447, 455; 73/146, 146.4, 146.5, 73/146.8; 327/91, 94, 96; 365/149
See application file for complete search history.

(56) References Cited

U.S. PATENT DOCUMENTS

| | | | |
|---|---|---|---|
| 5,483,827 A * | 1/1996 | Kulka | B60C 23/0493 73/146.5 |
| 5,731,754 A * | 3/1998 | Lee, Jr. | B60C 23/0433 340/10.41 |
| 5,731,856 A | 3/1998 | Kim et al. | |
| 5,744,864 A | 4/1998 | Cillessen et al. | |
| 6,087,930 A * | 7/2000 | Kulka | B60C 23/0493 200/61.22 |
| 6,294,274 B1 | 9/2001 | Kawazoe et al. | |
| 6,535,116 B1 * | 3/2003 | Zhou | B60C 23/009 340/438 |
| 6,563,174 B2 | 5/2003 | Kawasaki et al. | |
| 6,609,419 B1 * | 8/2003 | Bankart | B60C 23/0428 200/61.22 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,227,456 B2 | 6/2007 | Iijima | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,289,753 B2 * | 10/2012 | Yamazaki | G11C 11/405 365/149 |
| 8,610,611 B2 * | 12/2013 | Venkatraman | H03M 3/04 341/143 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0102966 A1 * | 6/2003 | Konchin | B60C 23/0428 340/445 |
| 2003/0189401 A1 | 10/2003 | Kido et al. | |
| 2003/0209064 A1 * | 11/2003 | Adamson | B60C 23/0411 73/146 |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0081042 A1 * | 4/2006 | Silverbrook | B60C 23/0408 73/146 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0272402 A1 * | 12/2006 | Yin | B60C 23/0494 73/146.8 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0125161 A1 * | 6/2007 | Bryzek | B60C 23/0408 73/146.4 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140802 A1 * | 6/2009 | Kitagawa | H03F 3/45192 330/9 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0141417 A1 * | 6/2010 | Boes | B60C 23/0408 340/447 |
| 2012/0176233 A1 * | 7/2012 | Petrucelli | B60C 23/0401 340/447 |
| 2012/0218095 A1 * | 8/2012 | Zhou | B60C 29/064 340/447 |
| 2016/0094236 A1 * | 3/2016 | Shionoiri | H03M 1/002 341/122 |
| 2016/0332493 A1 * | 11/2016 | Atsumi | B60C 23/0452 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-107140 A | 4/1993 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-099812 A | 4/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-008086 A | 1/2006 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 8, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW'02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

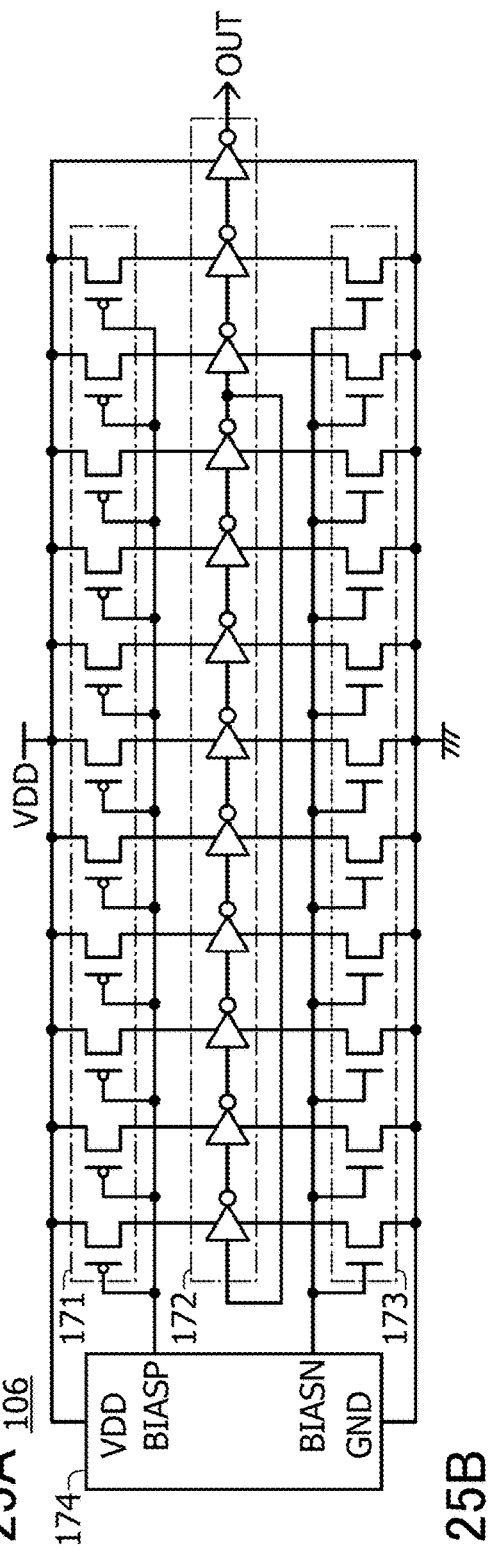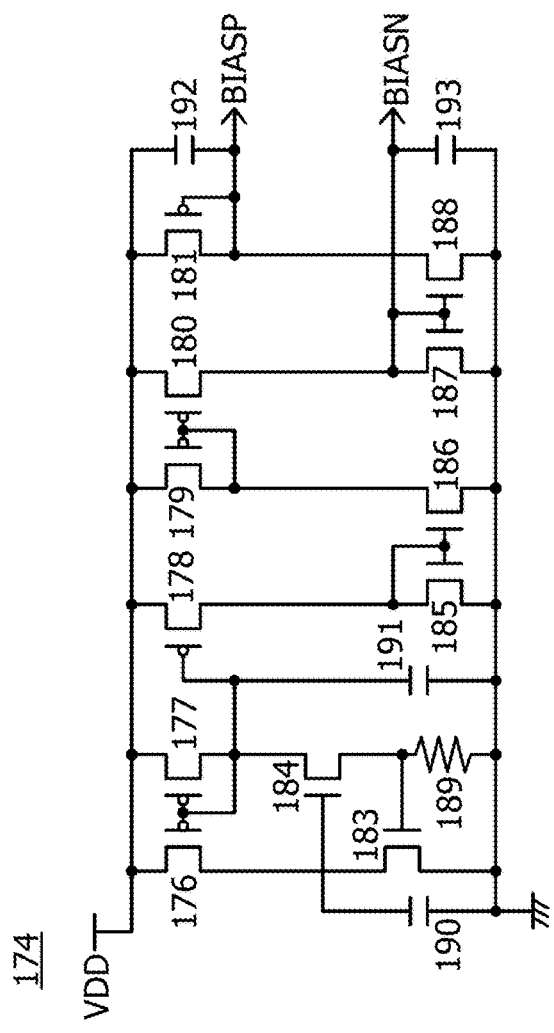
FIG. 25A
FIG. 25B

104

194,195,196

FIG. 43A
FIG. 43B
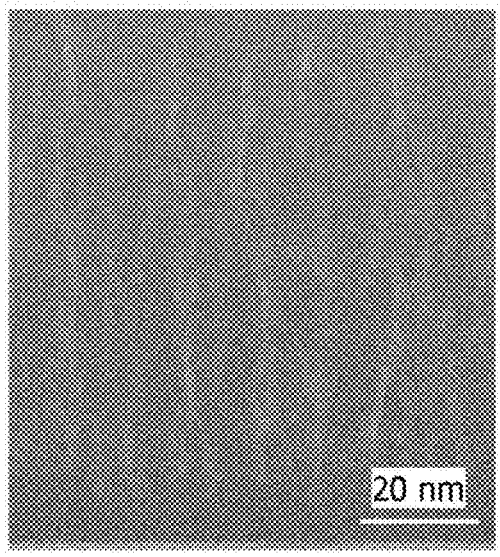
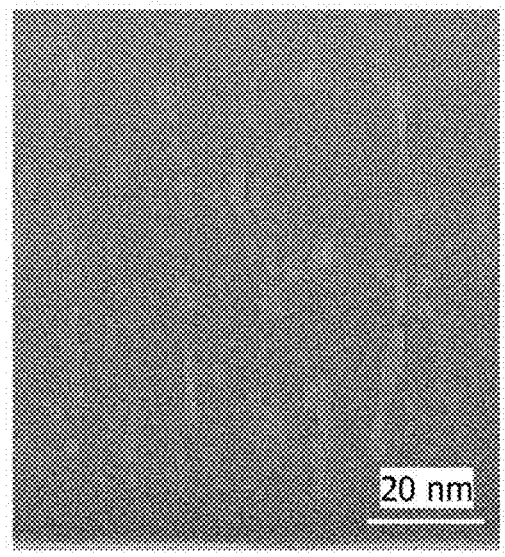

SEMICONDUCTOR DEVICE, METHOD FOR MANUFACTURING SEMICONDUCTOR DEVICE, TIRE, AND MOVING OBJECT

BACKGROUND OF THE INVENTION

1. Field of the Invention

One embodiment of the present invention relates to a semiconductor device, an electronic device, a tire, and a moving object.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

To keep the safety of a moving object provided with a tire, it is important to check the degradation level of a tire. For example, to analyze the degradation of a tire, the air pressure of a tire is measured. Patent Document 1 discloses an example of a device for detecting the air pressure of a tire. As the device, a pressure detecting type charge generator is mounted on a wheel of a tire, and a radio wave receiving antenna is installed in a vehicle.

REFERENCE

Patent Document

[Patent Document 1] Japanese Published Patent Application No. H11-99812

SUMMARY OF THE INVENTION

An object of one embodiment of the present invention is to provide a circuit with low power consumption. Another object of one embodiment of the present invention is to provide a sensor with low power consumption. Another object of one embodiment of the present invention is to provide a highly reliable sensor. Another object of one embodiment of the present invention is to provide a semiconductor device with low power consumption. Another object of one embodiment of the present invention is to provide a highly reliable semiconductor device. Another object of one embodiment of the present invention is to provide a tire whose performance is controlled. Another object of one embodiment of the present invention is to provide a moving object whose performance is controlled. Another object of one embodiment of the present invention is to provide a moving object with a high degree of safety.

Another object of one embodiment of the present invention is to provide a novel circuit. Another object of one embodiment of the present invention is to provide a novel semiconductor device.

One embodiment of the present invention is a tire provided with a semiconductor device. The semiconductor device includes a circuit portion, an antenna, and a sensor element. The circuit portion includes a transistor. The transistor includes an oxide semiconductor. The sensor element is configured to measure the air pressure of the tire.

Another embodiment of the present invention is a tire provided with a semiconductor device. The semiconductor device includes a first circuit portion, an antenna, and a sensor element. The sensor element is configured to measure the air pressure of the tire. The first circuit portion includes an analog-to-digital converter circuit and a sample-and-hold circuit. The sample-and-hold circuit includes a buffer circuit and a second circuit portion. The second circuit portion includes a transistor and a capacitor. An analog potential is supplied to one of a source and a drain of the transistor through the buffer circuit. Charge corresponding to the analog potential is held at the other of the source and the drain of the transistor and in the capacitor by turning off the transistor. Supply of a power supply voltage to the buffer circuit is stopped when the charge corresponding to the analog potential is held.

In the above structure, it is preferable that the transistor include an oxide semiconductor.

In the above structure, it is preferable that the semiconductor device be capable of wireless communication.

In the above structure, it is preferable that the semiconductor device be positioned on a side surface of the tire.

Another embodiment of the present invention is a semiconductor device including a first circuit portion, an antenna, and a plurality of sensor elements. The first circuit portion includes an analog-to-digital converter circuit and a plurality of sample-and-hold circuits. Each of the sample-and-hold circuits includes a buffer circuit and a second circuit portion. The second circuit portion includes a transistor and a capacitor. An analog potential is supplied to one of a source and a drain of the transistor through the buffer circuit. In the second circuit portion, charge corresponding to the analog potential is held at the other of the source and the drain of the transistor and in the capacitor by turning off the transistor. Supply of a power supply voltage to the buffer circuit is stopped when the charge corresponding to the analog potential is held. The plurality of sensor elements are configured to measure two or more of the pressure, the temperature, strain, and the acceleration.

Another embodiment of the present invention is a semiconductor device disposed in a sealed space. The semiconductor device includes a first circuit portion, an antenna, and a plurality of sensor elements. The first circuit portion includes an analog-to-digital converter circuit and a plurality of sample-and-hold circuits. Each of the sample-and-hold circuits includes a buffer circuit and a second circuit portion. The second circuit portion includes a transistor and a capacitor. An analog potential is supplied to one of a source and a drain of the transistor through the buffer circuit. Charge corresponding to the analog potential is held at the other of the source and the drain of the transistor and in the capacitor by turning off the transistor. Supply of a power supply voltage to the buffer circuit is stopped when the charge corresponding to the analog potential is held. The plurality of sensor elements are configured to measure two or more of the pressure, the temperature, strain, and the acceleration.

In the above structure, it is preferable that the analog-to-digital converter circuit include a comparator, a successive approximation register, and a digital-to-analog converter circuit.

In the above structure, it is preferable that the transistor include an oxide semiconductor.

Another embodiment of the present invention is a semiconductor device disposed in a sealed space. The semiconductor device includes a circuit portion, an antenna, and a sensor element. The sensor element is configured to measure the air pressure of a tire. The circuit portion includes a transistor. The transistor includes an oxide semiconductor.

Another embodiment of the present invention is a tire provided with any of the above semiconductor devices.

Another embodiment of the present invention is a moving object provided with any of the above semiconductor devices and an interrogator. The semiconductor device is positioned inside a tire. The interrogator is positioned outside the tire.

Another embodiment of the present invention is a moving object provided with any of the above semiconductor devices and an interrogator. The distance between the semiconductor device and the interrogator is greater than or equal to 5 cm and less than or equal to 2 m.

Another embodiment of the present invention is a method for driving a semiconductor device. The semiconductor device includes a wireless circuit including a circuit portion, an antenna, and m (m is an integer) sensor elements. The circuit portion includes an analog-to-digital converter circuit and n (n is an integer) sample-and-hold circuits. An x-th (x is an integer of greater than or equal to 1 and less than or equal to m) sensor element is connected to the corresponding one of the n sample-and-hold circuits. The method includes a first step in which analog potentials output from the m sensor elements are each input to the corresponding one of the n sample-and-hold circuits, a second step in which the analog potentials input to the n sample-and-hold circuits are held, and a third step in which the analog potentials output from first to n-th sample-and-hold circuits are sequentially input to the analog-to-digital converter circuit.

In the above structure, it is preferable that a y-th (y is an integer of greater than or equal to 1 and less than or equal to n) sample-and-hold circuit include a buffer circuit and a y-th circuit, the y-th circuit include a y-th transistor and a y-th capacitor, an analog potential be supplied to one of a source and a drain of the y-th transistor through the buffer circuit, charge corresponding to the analog potential be held at the other of the source and the drain of the y-th transistor and in the y-th capacitor by turning off the y-th transistor, supply of a power supply voltage to the buffer circuit be stopped when the charge corresponding to the analog potential is held, and the y-th transistor include an oxide semiconductor.

In the above structure, it is preferable that n be greater than or equal to m.

In the above structure, it is preferable that the semiconductor device be mounted on a tire, and at least one of the m sensor elements be configured to measure the air pressure of the tire.

In the above structure, it is preferable that the semiconductor device be positioned on a side surface of the tire.

According to one embodiment of the present invention, a circuit with low power consumption can be provided. According to one embodiment of the present invention, a sensor with low power consumption can be provided. According to one embodiment of the present invention, a highly reliable sensor can be provided. According to one embodiment of the present invention, a semiconductor device with low power consumption can be provided. According to one embodiment of the present invention, a highly reliable semiconductor device can be provided. According to one embodiment of the present invention, a tire whose performance is controlled can be provided. According to one embodiment of the present invention, a moving object whose performance is controlled can be provided. According to one embodiment of the present invention, a moving object with a high degree of safety can be provided.

According to one embodiment of the present invention, a novel circuit can be provided. According to one embodiment of the present invention, a novel semiconductor device can be provided.

BRIEF DESCRIPTION OF THE DRAWINGS

FIGS. 25A and 25B are circuit diagrams illustrating one embodiment of the present invention.

FIGS. 43A and 43B are cross-sectional TEM images of an a-like OS.

DETAILED DESCRIPTION OF THE INVENTION

Figure 1:
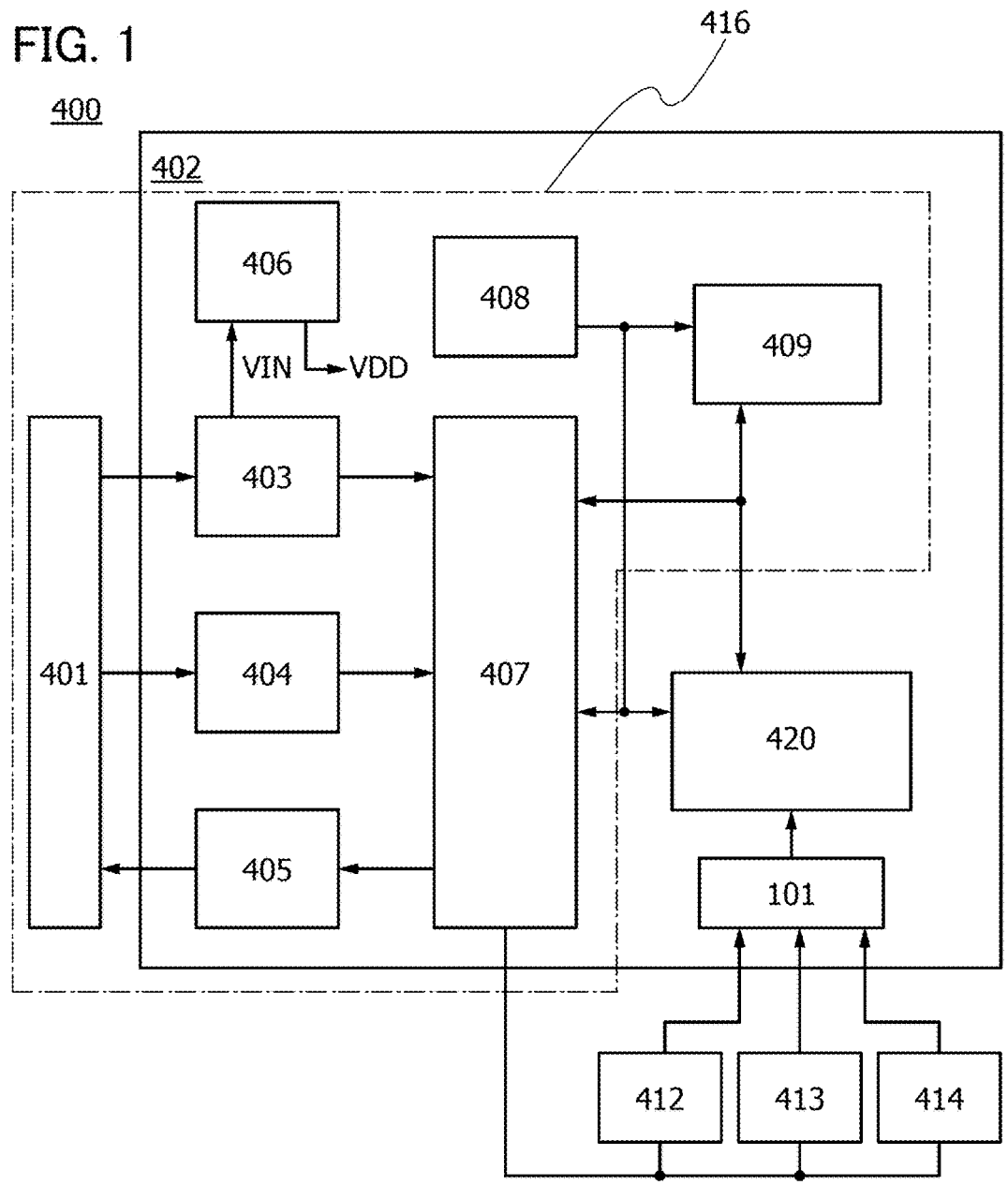
FIG. 1 illustrates an example of a semiconductor device of one embodiment of the present invention.

Hereinafter, embodiments will be described with reference to the drawings. Note that the embodiments can be implemented in many various modes. It will be readily appreciated by those skilled in the art that modes and details thereof can be changed in various ways without departing from the spirit and the scope of the present invention. Therefore, the present invention should not be interpreted as being limited to the description of the embodiments below.

In this specification and the like, ordinal numbers such as "first", "second", and "third" are used in order to avoid confusion among components. Thus, the terms do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

The same components or components having similar functions, components formed using the same material, components formed at the same time, or the like in the drawings are denoted by the same reference numerals, and the description thereof is not repeated, in some cases.

(Embodiment 1)

In this embodiment, a semiconductor device of one embodiment of the present invention and a mounting example of the semiconductor device will be described.

<Example of Semiconductor Device>

An example of a semiconductor device of one embodiment of the present invention will be described.

FIG. 1 illustrates a structure example of a semiconductor device of one embodiment of the present invention. A semiconductor device 400 illustrated in FIG. 1 includes a circuit portion 402. In addition, the semiconductor device 400 preferably includes an antenna 401 and sensor elements 412 to 414. The circuit portion 402 includes an analog-to-digital converter circuit 420 and a sample-and-hold circuit 101. The circuit portion 402 can also include a rectifier circuit 403, a demodulation circuit 404, a modulation circuit 405, a constant-voltage circuit 406, a control circuit 407, an oscillator circuit 408, and a memory circuit 409. An interface may be provided between the sample-and-hold circuit 101 and the sensor elements 412 to 414. The interface may include a selector. The selector can select one or more of signals from the sensor elements 412 to 414, for example.

The antenna 401, the rectifier circuit 403, the demodulation circuit 404, the modulation circuit 405, the constant-voltage circuit 406, the control circuit 407, the oscillator circuit 408, and the memory circuit 409 are collectively referred to as a wireless tag 416 in some cases. For example, a device including an antenna and a sensor element is referred to as a wireless sensor in some cases. The semiconductor device of one embodiment of the present invention preferably includes a wireless sensor. The wireless sensor is a sensor capable of wireless communication, for example. The wireless sensor is referred to as a radio frequency (RF) sensor or the like.

The wireless sensor is capable of receiving a wireless signal from a wireless communication device and transmitting data obtained in a sensor element to the wireless communication device. Note that any wireless communication device can be used as long as it can transmit and receive a wireless signal; for example, an interrogator, a smart meter, a mobile phone, a personal computer, or a wireless terminal that collects data can be used.

The frequency band of a wireless signal is appropriately selected in accordance with the laws and the like. For example, a long wave band, a short wave band, a UHF band, or a microwave band can be used. Specifically, a 135 kHz band, a 13.56 MHz band, a 900 MHz band, a 2.45 GHz band, or the like can be used. Depending on the frequency band of a wireless signal, the structure of an antenna included in the wireless sensor can be determined. Here, a 900 MHz band refers to a range from 860 MHz to 960 MHz.

The semiconductor device 400 preferably includes a plurality of sensor elements having different functions. In the example illustrated in FIG. 1, the semiconductor device 400 includes three sensors, the sensor elements 412 to 414. For example, the sensor elements 412 to 414 can each include a sensor selected from a pressure sensor, a temperature sensor, a strain sensor, an acceleration sensor, and the like. One sensor element can have a plurality of functions. For example, the sensor element 412 can have a plurality of functions. Specifically, the sensor element 412 can include a plurality of sensors selected from a pressure sensor, a temperature sensor, a strain sensor, an acceleration sensor, and the like.

The antenna 401 is capable of converting a wireless signal into an electric signal or converting an electric signal into a wireless signal to receive and transmit a signal from/to an external terminal such as an interrogator. A plurality of antennas can also be provided depending on the frequency band of a wireless signal carrying a signal. Note that the wireless signal is a modulated carrier wave. Examples of a modulation method include analog modulation and digital modulation, for example, and any of amplitude modulation, phase modulation, frequency modulation, and spread spectrum can be used.

The circuit portion 402 includes a circuit that operates with a voltage and an electric signal that are generated by receiving a wireless signal. The circuit portion 402 includes a circuit that transmits an electric signal obtained by operation of the above circuit through the antenna 401.

The rectifier circuit 403 is capable of rectifying and smoothing an electric signal from the antenna 401. A wireless signal rectified and smoothed becomes a voltage VIN having a constant potential. The voltage VIN is output to the constant-voltage circuit 406.

The rectifier circuit 403 may include a protection circuit (a limiter circuit). The protection circuit is capable of preventing damage to the circuits in the circuit portion 402 when an electric signal from the antenna 401 has an extremely high voltage.

The demodulation circuit 404 is capable of demodulating an electric signal from the antenna 401. A demodulated signal is output to the control circuit 407.

The modulation circuit 405 is capable of modulating an electric signal generated in the control circuit 407. The modulated electric signal is transmitted as a wireless signal on a carrier wave through the antenna 401.

The constant-voltage circuit 406 is capable of generating a voltage based on the voltage VIN. A voltage VDD generated in the constant-voltage circuit 406 is supplied to the circuits in the circuit portion 402. Note that one or more voltages may be generated in the constant-voltage circuit 406.

The control circuit 407 is capable of generating a signal to be input to the circuits in the circuit portion 402, a signal to be output from the circuits in the circuit portion 402, a signal for operating the circuits in the circuit portion 402, and the like, and controlling the circuits in the circuit portion 402.

The oscillator circuit 408 is capable of generating a clock signal used as reference. For example, the clock signal is transmitted to the control circuit 407, the memory circuit 409, the analog-to-digital converter circuit 420, and the sample-and-hold circuit 101.

The memory circuit 409 is capable of holding data that is obtained in the sensor element 412 and converted from analog to digital in the analog-to-digital converter circuit 420. Power is supplied to the semiconductor device 400 when a wireless signal is received, that is, intermittently. In that case, power is supplied to the memory circuit 409 also intermittently. Therefore, the memory circuit 409 preferably includes a nonvolatile memory element that can hold data even when power is supplied intermittently. As the nonvolatile memory element, a flash memory, a ferroelectric random access memory (FeRAM), a magnetoresistive random access memory (MRAM), a phase change random access memory (PRAM), a resistance random access memory (ReRAM), or the like can be used, for example. Alternatively, an OS transistor may be used for the memory element. Since the off-state current of the OS transistor is very low, the off-state can be maintained, and thus, charge can be held for a long time. When the OS transistor is used for the memory element, the OS transistor and a transistor including a silicon layer can be stacked.

The memory circuit 409 may store a unique number (ID) of a wireless sensor of the semiconductor device 400. If the wireless sensor has a unique number, communication with a plurality of wireless sensors is possible, for example. For example, it becomes possible to read only data of a wireless sensor having a unique number corresponding to desired data. Furthermore, the memory circuit 409 may have a structure that can write, read, and hold data of a wireless signal received from an external interrogator or the like. In that case, conditions corresponding to usage environment of the semiconductor device 400 or the like can be written, so that application can be broadened.

With the use of a transistor with a very low source-drain current in the off-state for the sample-and-hold circuit 101, power consumption can be reduced. For a transistor having the above function, a transistor whose channel formation region includes an oxide semiconductor (an OS transistor) is preferred. In addition, the performance of the analog-to-digital converter circuit, such as the resolution or sampling rate, does not degrade, or the semiconductor device does not need a dedicated circuit for holding analog data, such as a high-voltage generation circuit or a peripheral circuit. The details of the sample-and-hold circuit 101 with low power consumption will be described in an embodiment below.

The sensor elements 412 to 414 are capable of outputting a variety of information such as thermal or electromagnetic information as analog data. The sensor element can include any of various sensors. For example, a pressure sensor, a temperature sensor, a strain sensor, an acceleration sensor, an inclination sensor, a gyro sensor, an optical sensor, a gas sensor, a flame sensor, a smoke sensor, a humidity sensor, a flow sensor, a vibration sensor, a touch sensor, a voice sensor, a magnetic sensor, a radiation sensor, a smell sensor, a pollen sensor, a direction sensor, and/or a power sensor can be used.

An analog potential obtained in the sensor element may be constant or may be always variable. When sampling a variable analog potential, the sampling may be performed with the use of a correlated double sampling (CDS) circuit. The CDS circuit is used to remove noise by obtaining a relative difference between potentials at two timings.

Figure 2A:
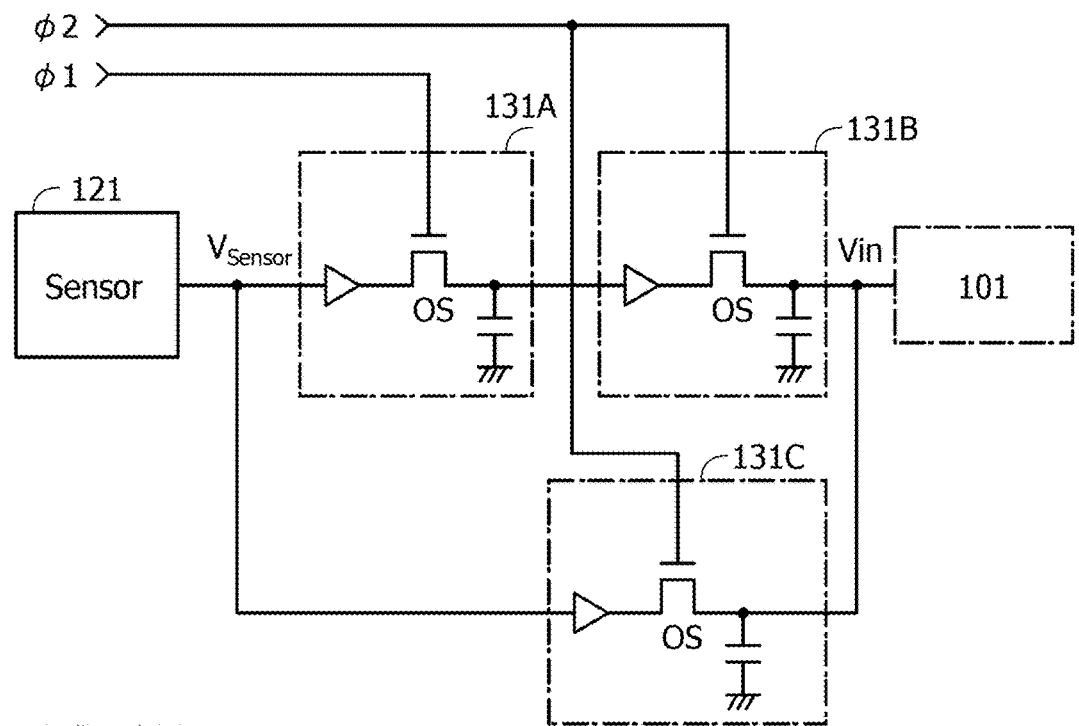
FIGS. 2A and 2B are a circuit diagram and a timing chart of one embodiment of the present invention.

FIG. 2A illustrates an example of the CDS circuit. The CDS circuit includes a plurality of sample-and-hold circuits 131A to 131C. For the sample-and-hold circuits 131A to 131C, a circuit similar to the sample-and-hold circuit 101 illustrated in FIG. 1 or the like can be used. A control signal $\phi 1$ is supplied to a transistor in the sample-and-hold circuit 131A, and a control signal $\phi 2$ is supplied to transistors in the sample-and-hold circuits 131B and 131C.

The use of OS transistors as the transistors that are turned off by the control signals $\phi 1$ and $\phi 2$ can reduce changes in potentials sampled for obtaining the difference. Thus, the accuracy of the CDS circuit can be improved. In addition, after once sampling a potential, power supply to buffer circuits in the sample-and-hold circuits 131A to 131C can be stopped, so that power consumption can be reduced.

Figure 2B:
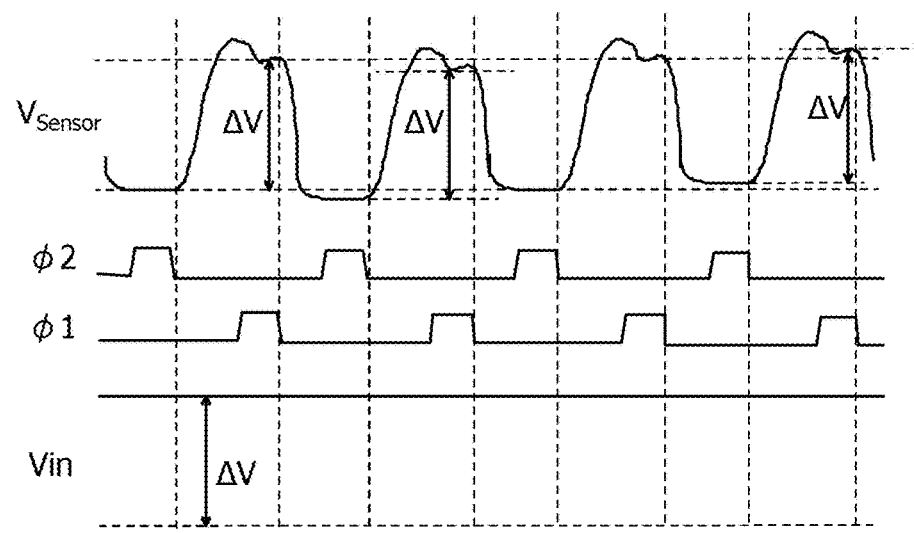

FIG. 2B is a timing chart illustrating an operation example of the CDS circuit illustrated in FIG. 2A. Note that a potential $V_{Sensor}$ is a variable potential obtained in a sensor element 121, and a potential Vin is an analog potential obtained through the CDS circuit. As illustrated in FIG. 2B, even when the potential $V_{Sensor}$ is variable, performing sampling to obtain the difference in a regular cycle makes it possible to obtain the potential Vin as an analog potential that is constant at a voltage $\Delta V$.

<Mounting Example 1 of Semiconductor Device>

Next, a mounting example of a semiconductor device of one embodiment of the present invention will be described.

It is important to check the condition of the inside of a sealed space of an object in order to keep the performance and improve the reliability of the object.

According to one embodiment of the present invention, for example, the pressure and the like of a sealed space of an object can be measured. By measuring the pressure and the like of the sealed space, airtightness can be maintained, or the operation or usage of the object can be stopped when airtightness cannot be maintained. Maintaining airtightness refers to, for example, keeping the pressure of the sealed space at a certain value or more, or at a certain value or less.

To check the condition of the inside of a sealed space of an object, for example, a sensor is preferably provided inside the sealed space in some cases. In such a case, it is preferable to use the semiconductor device of one embodiment of the present invention as the sensor and to receive the value measured by the sensor outside the sealed space through wireless communication.

The semiconductor device of one embodiment of the present invention preferably includes a passive wireless sensor that operates with a received wireless signal used as power. The passive wireless sensor does not include a secondary battery, which leads to miniaturization. In addition, replacing of the secondary battery is not needed. Accordingly, for example, the degree of freedom in disposing the sensor is increased. Furthermore, the passive wireless sensor does not include a secondary battery and the like and thus can be simplified as compared with an active wireless sensor, leading to cost reduction.

The semiconductor device of one embodiment of the present invention including a passive wireless sensor does not need the replacing of batteries; accordingly, the wireless sensor is replaced with a new wireless sensor less frequently. Airtightness of a sealed space might be damaged when the sensor is replaced. Therefore, preferably, the wireless sensor is replaced less frequently. The passive wireless sensor can be reduced in size and thus can be disposed in a narrow space.

For example, preferably, a sensor that is disposed under the floor of a building is replaced less frequently. Accordingly, a wireless sensor of one embodiment of the present invention is preferably disposed under the floor of a building or the like. For example, it is preferable to dispose a sensor that senses the temperature, humidity, water leakage, or the like.

Examples of an object having a sealed space include a tire.

A wireless sensor in the semiconductor device of one embodiment of the present invention is preferably a passive wireless sensor because the semiconductor device is easily disposed inside the tire.

A circular component including a wheel and a tire that is mounted on a moving object rotates when the moving object moves, for example. A wireless sensor is preferably used as a sensor provided in an object which moves, e.g., rotates as described above. The sensor of one embodiment of the present invention is mounted on the circular component of a moving object, in which case data on strain, temperature, or the like of the component can be obtained. With the obtained data, the degradation level or the like of the component can be checked and managed, so that the safety of the moving object can be increased, for example. Examples of the moving object include a vehicle and an airplane. Examples of the vehicle include a car (including a large-sized vehicle such as a truck), a motorcycle, a bicycle, and a rail car (e.g., a train and a diesel locomotive).

A wireless sensor provided with a secondary battery (an active wireless sensor) can operate with power from the secondary battery. Also, the active wireless sensor can output a radio wave and transmit the obtained data to an interrogator (also referred to as a communication device, a reader/writer, or a master device).

The interrogator includes an antenna and a circuit portion. The circuit portion preferably includes a radio wave interface and a control system. The interrogator may further include an operation portion. For example, the operation portion may include an input button, a touch panel, and the like.

The active wireless sensor includes a secondary battery, and there might be leakage of an electrolytic solution. In addition, when the active wireless sensor is mounted on a circular component including a wheel and a tire, the secondary battery might be detached by vibration of the component. Accordingly, the wireless sensor mounted on the circular component including a wheel and a tire is preferably a passive wireless sensor.

The active wireless sensor has a long communication distance in some cases. When the distance between the interrogator and the wireless sensor is long, crosstalk might occur between the wireless sensor and another interrogator close to the wireless sensor. For example, the wireless sensor is mounted on a circular component including a wheel and a tire, and an interrogator is provided near the driver's seat. In such a case, the distance between the interrogator and the wireless sensor is long, and the interrogator might receive a radio wave from another closely disposed wireless sensor mounted on a moving object.

An example of the operation of the passive wireless sensor is described. The passive wireless sensor generates internal voltage from received power to operate a sensor element. The value obtained by the sensor element is converted into a digital signal through an analog-to-digital converter circuit. The obtained digital signal is subjected to load modulation and transmitted to the interrogator. The passive wireless sensor performs responding by utilizing backscatter technology.

The wireless sensor of one embodiment of the present invention is preferably driven with low power, which enables the wireless sensor to be driven without mounting a secondary battery. Accordingly, the wireless sensor in the semiconductor device of one embodiment of the present invention can be a passive wireless sensor.

To drive the passive wireless sensor, power consumption of an integrated circuit of the wireless sensor needs to be reduced. An integrated circuit of one embodiment of the present invention can be driven with low power and is thus preferably mounted on the passive wireless sensor. For example, a transistor including an oxide semiconductor in a channel formation region (an OS transistor) is preferably used because an integrated circuit which is driven with very low power can be achieved. The integrated circuit including an OS transistor will be described in detail in an embodiment below.

An example of mounting the semiconductor device of one embodiment of the present invention on a tire of a moving object will be described below. In the example below, the semiconductor device of one embodiment of the present invention includes a wireless sensor.

To keep the safety of a moving object provided with a tire, it is important to check the degradation level of a tire. For example, to analyze the degradation of a tire, the air pressure of a tire is measured, or the abrasion level of the surface of a tire is examined.

The air pressure of a tire can be measured by a pressure sensor.

Described below is a tire pressure monitoring system (TPMS). TPMS includes indirect TPMS in which an anti-lock braking system (ABS) is utilized to detect the state of a tire by using software and direct TPMS in which a sensor is mounted on a tire to directly detect the state of a tire. In indirect TPMS, the state of a tire is obtained indirectly according to the ABS system, leading to lower reliability. In contrast, in direct TPMS, a slave unit equipped with a sensor is provided inside a tire, data obtained by the sensor is transmitted on a radio wave, and a master unit receives the data to obtain the state of the air pressure. That is, in direct TPMS, the pressure inside the tire is directly obtained, leading to higher reliability than that in indirect TPMS.

A pressure sensor can be mounted on, for example, a valve cap of the tire. The pressure sensor is preferably mounted inside the tire. With the pressure sensor inside the tire, the pressure can be measured more precisely in some cases, for example. In addition, for example, the pressure sensor inside the tire is protected by the tire and is thus less likely to be damaged or broken.

The abrasion level of the surface of the tire is influenced by an increase in temperature of the surface of the tire or by friction with the road surface, for example. To control the abrasion level of the surface of the tire, for example, it is preferable to measure the temperature of the surface of the tire and to collect data. Therefore, it is preferable to use a temperature sensor as a sensor element in the semiconductor device mounted on the tire. The wheel is frequently formed using a metal material with high thermal conductivity. On the other hand, the tire is often formed using a resin material with lower thermal conductivity than a metal material. The temperature of the wheel greatly differs from the temperature of the tire in some cases. Therefore, to obtain a temperature closer to the temperature of the surface of the tire, the temperature sensor is preferably mounted on the inner wall of the tire. By mounting the temperature sensor on the inner wall of the tire, the temperature and the air pressure of the tire can be measured.

With the use of an acceleration sensor or a strain sensor, the load on the tire can be analyzed in some cases. Therefore, it is preferable to use an acceleration sensor or a strain sensor as a sensor element in the semiconductor device mounted on the tire. To measure the strain level of the tire, the strain sensor is preferably mounted on the inner wall of the tire, for example.

For example, a semiconductor device including a passive wireless sensor is mounted on a tire of a moving object, and an interrogator or a receive portion of the interrogator is disposed in the vicinity of the tire; in this manner, the communication distance between the wireless sensor of the semiconductor device and the interrogator can be shortened. When the communication distance is short, communication is less influenced by a wireless sensor mounted on a closely positioned tire of a moving object, thereby suppressing crosstalk and the like. The receive portion of the interrogator is, for example, an antenna of the interrogator. Alternatively, the receive portion may include an antenna and a radio wave interface.

The tire is classified into, according to its structure, a radial-ply tire and a bias-ply tire. Examples of the tire include a tubeless tire and a tire with an inner tube (a tire which is used by inserting a tube thereinto).

The radial-ply tire includes a tread that is a rubber layer in contact with the road surface and further includes a belt and a carcass that are provided on the inner side of the tread. The carcass is a layer of cords coated with rubber. In the radial-ply tire, a cord included in the carcass is perpendicular to the center line of the tire. The cord is fiber or a metal line, for example. The carcass is fastened by the belt.

The bias-ply tire includes a tread and a carcass that is provided on the inner side of the tread. In the bias-ply tire, a cord included in the carcass is oblique to the center line of the tire. The bias-ply tire may also include a breaker. The carcass is fastened by the breaker.

Figure 3A:
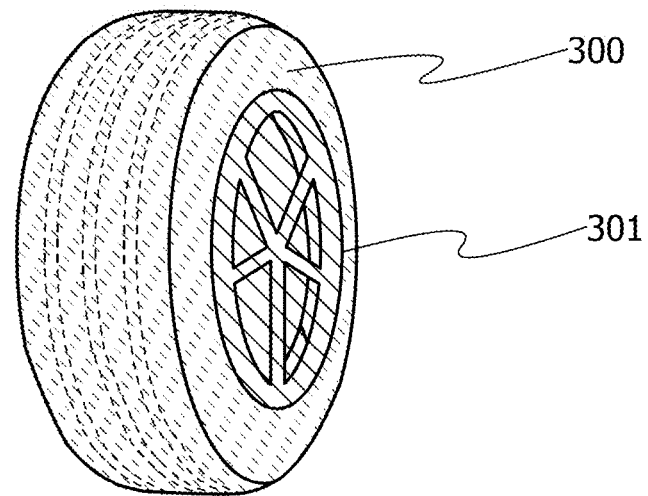
FIGS. 3A and 3B are an external view and a cross-sectional view of a tire and a wheel.
Figure 3B:
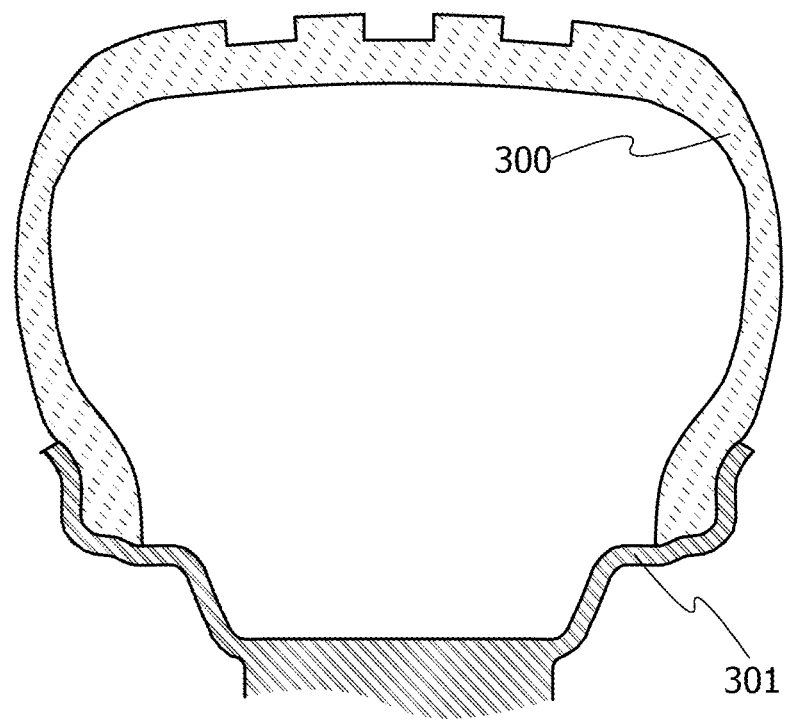

FIG. 3A is an external view illustrating a tire 300 and a wheel 301. FIG. 3B illustrates part of the cross section of the tire 300 and the wheel 301. The tire 300 is mounted on the wheel 301.

Figure 4A:
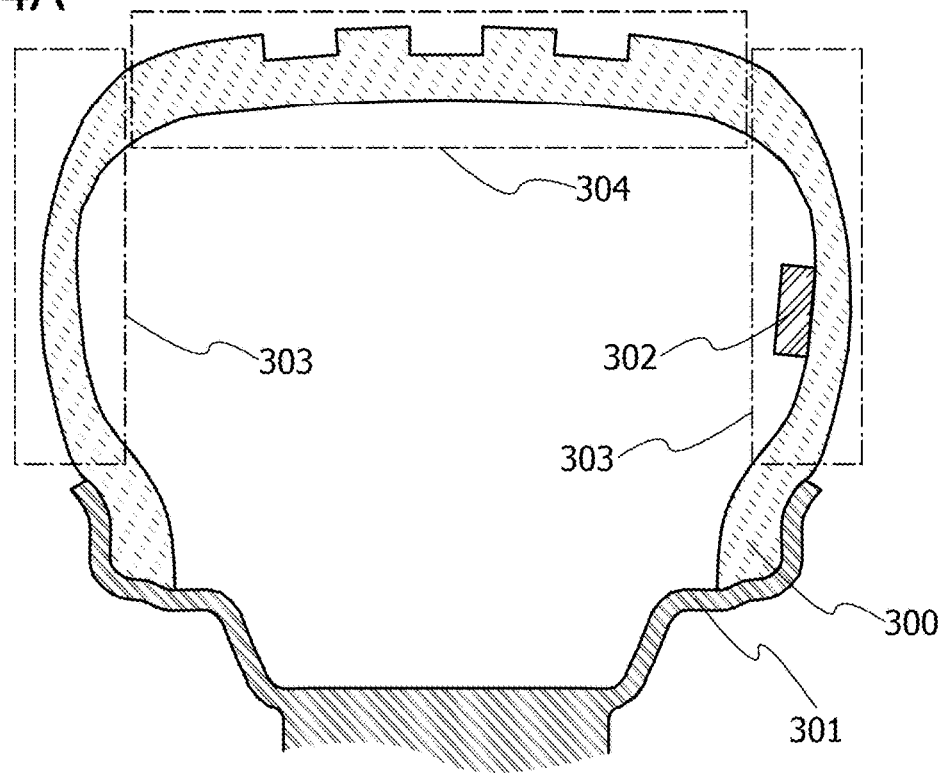
FIGS. 4A and 4B each illustrate a mounting example of a semiconductor device.
Figure 4B:
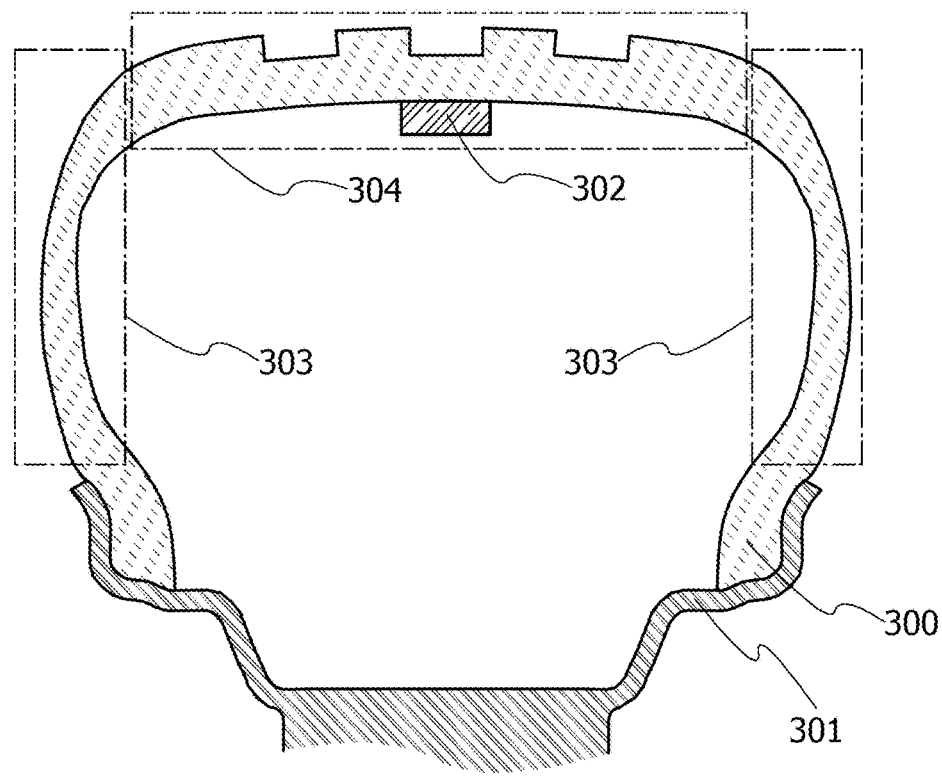

FIGS. 4A and 4B each illustrate an example of mounting a semiconductor device 302 inside the tire 300. The semiconductor device 302 preferably includes a pressure sensor as a sensor element. The semiconductor device 302 includes an antenna. For the semiconductor device 302, the description of the semiconductor device 400 can be referred to. For the antenna, the description of the antenna 401 can be referred to.

In FIG. 4A, the semiconductor device 302 is mounted on a side portion 303 of the tire 300. In FIG. 4B, the semiconductor device 302 is mounted on a bottom portion 304 of the tire 300. The bottom portion is a region including a surface in contact with the road surface and the like when a moving object moves.

The tire 300 preferably includes a resin material. To increase the strength of the tire, components of the tire, such as a carcass and a belt, include a metal material in some cases. A metal highly blocks a radio wave. When the content of a metal material in the tire is high, the semiconductor device 302 inside the tire 300 and an interrogator communicate with each other with difficulty in some cases.

It is particularly important to increase the strength of the bottom surface of the tire. Therefore, the content of a metal material in the bottom portion of the tire is higher than in the side portion in some cases. The semiconductor device 302 is preferably mounted on the side portion 303 of the tire 300.

Figure 5A:
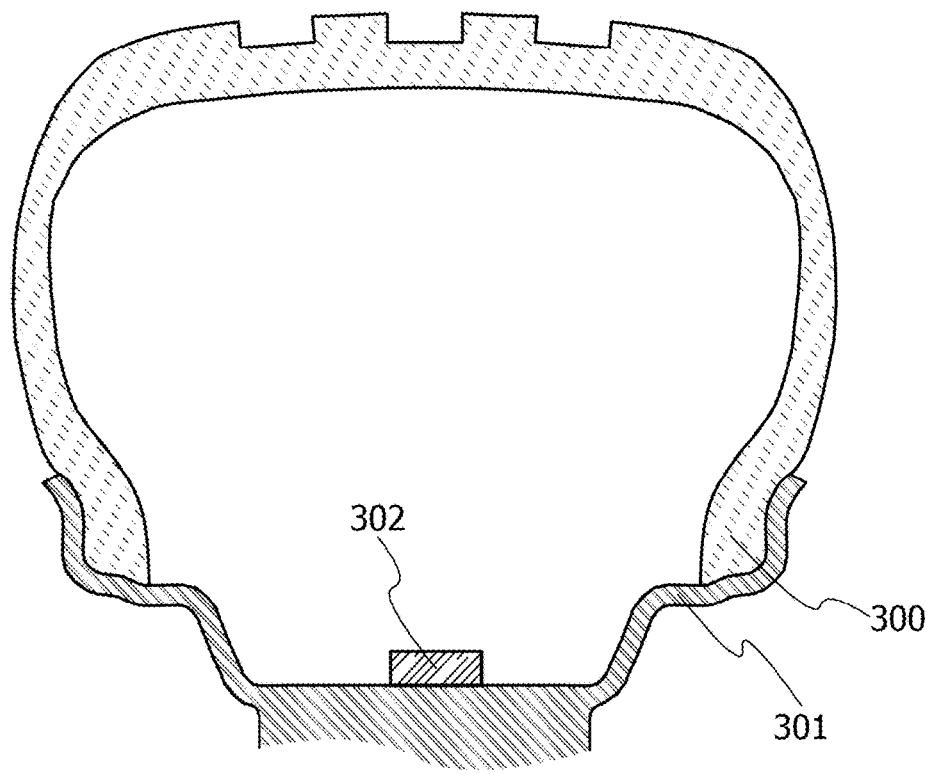
FIG. 5A illustrates a mounting example of a semiconductor device.

The semiconductor device 302 may also be mounted on the wheel 301 as illustrated in FIG. 5A. The wheel 301 is often formed of a metal material; thus, by mounting the semiconductor device 302 on the wheel 301, a radio wave from the semiconductor device 302 is blocked by the wheel 301 in some cases.

The antenna of the semiconductor device 302 has directivity in some cases. An antenna 302a of the semiconductor device 302 and an antenna 306a of a receive portion 306 of the interrogator are preferably arranged so as to face each other, for example.

Figure 5B:
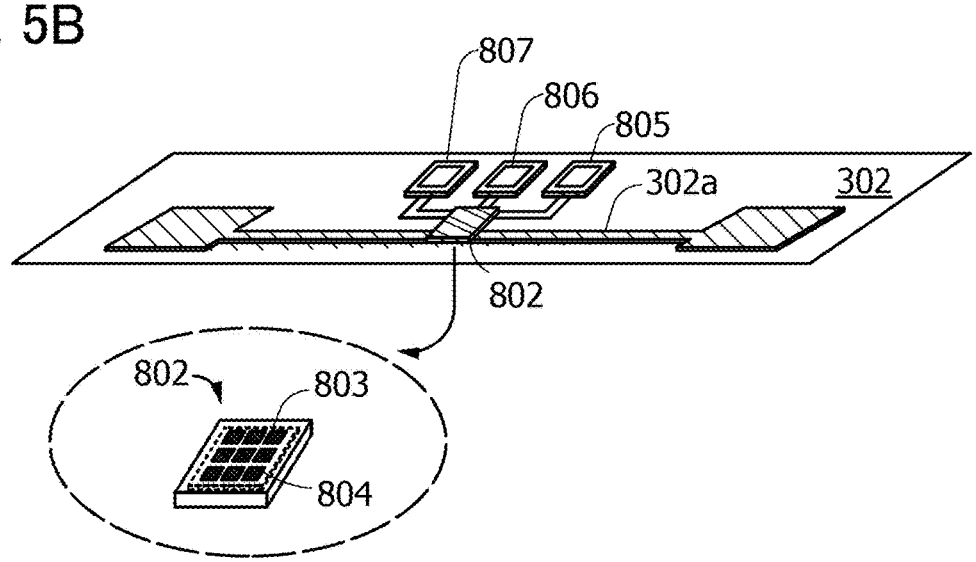
FIG. 5B is a schematic view of the semiconductor device.

FIG. 5B is a schematic view of the semiconductor device 302. As illustrated in FIG. 5B, the semiconductor device 302 includes the antenna 302a, a circuit portion 802, and sensor elements 805 to 807.

The antenna 302a may have a size and a shape suitable for the application in the range determined by the Radio Act. For example, a dipole antenna, a patch antenna, a loop antenna, a Yagi antenna, or the like can be used.

The circuit portion 802 includes a circuit portion 803 including a Si transistor and an OS transistor and a terminal portion 804 for connection to the antenna. The circuit portion 803 is formed through the pre-process for forming the Si transistor and the OS transistor. The terminal portion 804 is formed through the post-process for forming a chip, which includes a dicing step and a bonding step. The circuit portion 802 is also referred to as a semiconductor package or an IC package. Note that the sensor elements 805 to 807 are provided in or externally attached to the circuit portion 802.

The sensor elements 805 to 807 are capable of outputting a variety of information such as thermal or electromagnetic information as analog data. The sensor elements 805 to 807 can also be provided outside the semiconductor device 302 depending on their sizes.

Figure 6A:
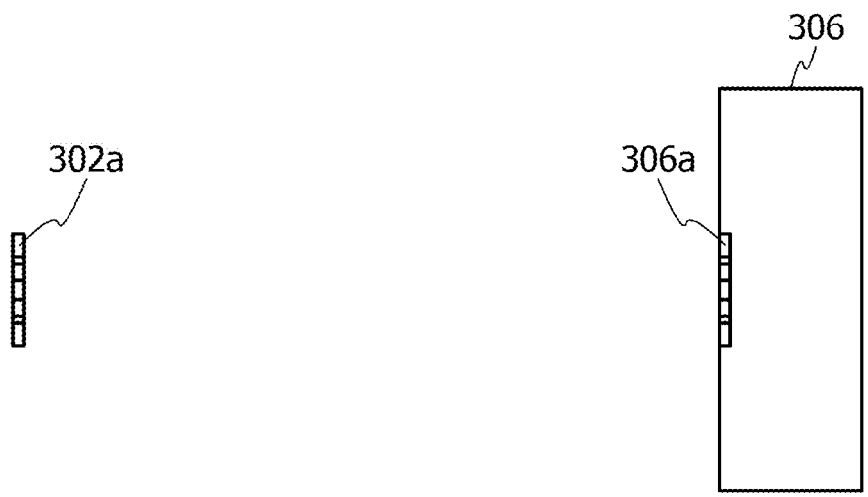
FIGS. 6A and 6B are a cross-sectional view and a perspective view of an antenna and a receive portion.
Figure 6B:
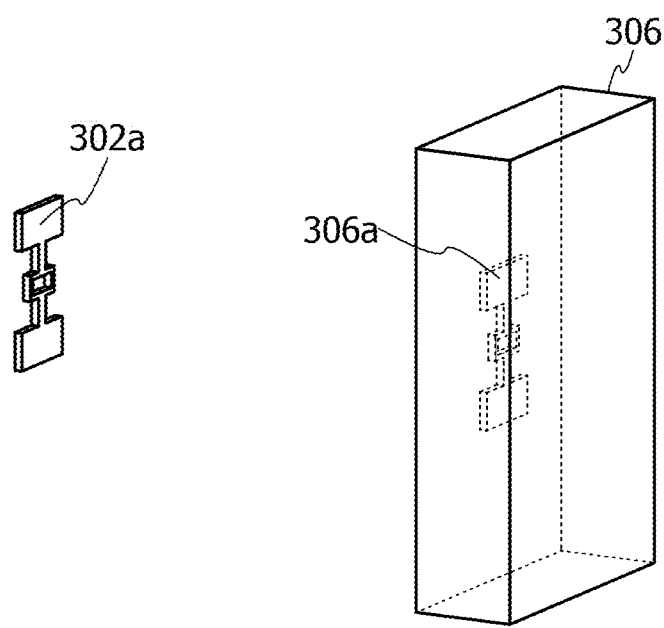

FIG. 6A is a top view illustrating an example of the arrangement of the antenna 302a and the receive portion 306 and the antenna 306a of the interrogator. It is preferable that the antenna 302a and the antenna 306a face each other and be substantially parallel to each other. FIG. 6B is a perspective view illustrating the arrangement of the antenna 302a and the receive portion 306 and the antenna 306a of the interrogator, which is illustrated in FIG. 6A.

Figure 7A:
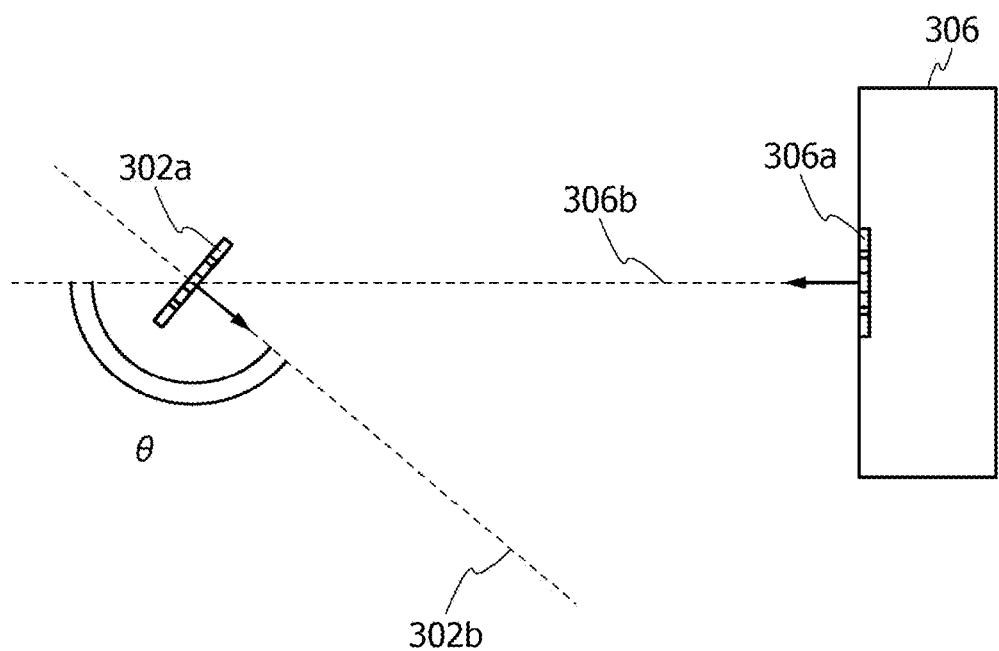
FIGS. 7A and 7B are a cross-sectional view and a perspective view of an antenna and a receive portion.
Figure 7B:
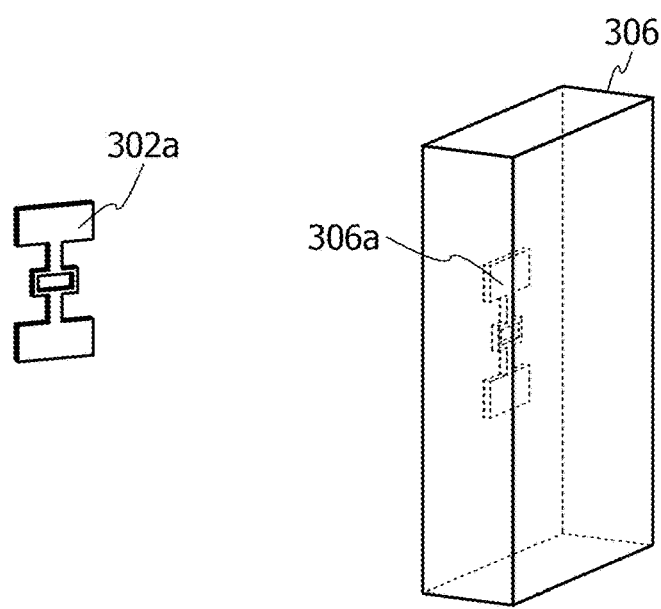

FIG. 7A is a top view illustrating an example of the arrangement of the antenna 302a and the antenna 306a which are not parallel to each other. FIG. 7B is a perspective view illustrating the arrangement of the antenna 302a and the receive portion 306 and the antenna 306a of the interrogator, which is illustrated in FIG. 7A. The angle between the antenna 302a and the antenna 306a is defined as an angle between the normal 302b to the surface of the antenna 302a and the normal 306b to the surface of the antenna 306a. In the case where the angle θ between the normal 302b and the normal 306b is 0° or 180°, the antenna 302a and the antenna 306a are parallel to each other. Therefore, the angle θ is preferably around 0° or 180°. For example, the angle θ is preferably greater than or equal to −45° and less than or equal to 45°, more preferably greater than or equal to −30° and less than or equal to 30°, more preferably greater than or equal to −15° and less than or equal to 15°. Alternatively, for example, the angle θ is preferably greater than or equal to 135° and less than or equal to 225°, more preferably greater than or equal to 150° and less than or equal to 210°, more preferably greater than or equal to 165° and less than or equal to 195°.

Figure 8:
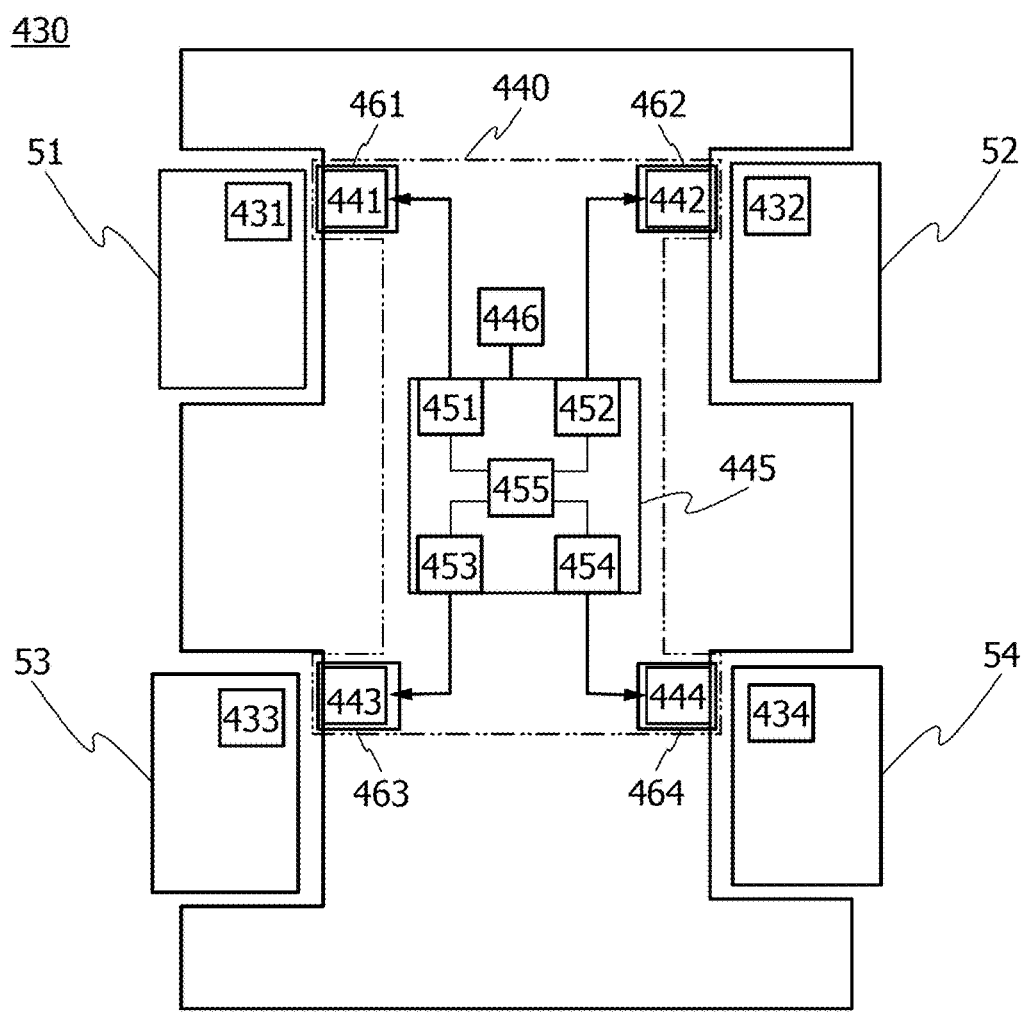
FIG. 8 illustrates an example of a moving object of one embodiment of the present invention.

FIG. 8 illustrates an example of mounting a semiconductor device including a passive wireless sensor on a tire of a moving object 430. The moving object 430 in FIG. 8 includes tires 51 to 54 and an interrogator 440. The moving object 430 further includes wheels provided with the tires 51 to 54. A semiconductor device 431 is mounted on the tire 51, a semiconductor device 432 is mounted on the tire 52, a semiconductor device 433 is mounted on the tire 53, and a semiconductor device 434 is mounted on the tire 54. Although FIG. 8 illustrates an example in which the moving object 430 is provided with four tires, the moving object 430 of one embodiment of the present invention needs to be provided with at least one tire and may be provided with five or more tires.

The interrogator 440 includes antennas 441 to 444 and a circuit portion 445. The circuit portion 445 preferably includes a radio wave interface and a control system. Preferably, the interrogator 440 further includes an operation portion 446. In the example illustrated in FIG. 8, radio wave interfaces 451 to 454 are connected to the antennas 441 to 444, respectively. A control system 455 is connected to the radio wave interfaces 451 to 454.

For the interrogator 440, the antennas 441 to 444, the tires 51 to 54, and the semiconductor devices 431 to 434, the description of the above-described interrogator, the antenna 306a, the tire 300, and the semiconductor device 302 can be referred to, respectively.

The interrogator 440 or the antennas 441 to 444 of the interrogator 440 are preferably provided around the tires. The antenna of the interrogator 440 transmits a radio wave to the tire which is rotating.

The operability is improved in some cases by disposing the operation portion 446 of the interrogator 440 in the vicinity of a driver's seat of the moving object 430. For example, in the case where the moving object 430 is a car, the operation portion 446 may be disposed in the vicinity of a speedometer of the car. For example, the operation portion 446 of the interrogator 440 or the like may be disposed in the vicinity of the driver's seat, and the antennas 441 to 444 may be disposed in regions around the tires 51 to 54, respectively.

In FIG. 8, the interrogator 440 includes the antennas 441 to 444 and the circuit portion 445. The antenna 441 is disposed in the vicinity of the tire 51. The antenna 442 is disposed in the vicinity of the tire 52. The antenna 443 is disposed in the vicinity of the tire 53. The antenna 444 is disposed in the vicinity of the tire 54.

The region around the tire is, for example, a region in the moving object 430, which is directly above the tire. This region is referred to as a tire house in some cases. Alternatively, the tire house is, for example, a region in the main body of the moving object 430 (also referred to as a car body), which is the closest to the tire.

Figure 9:
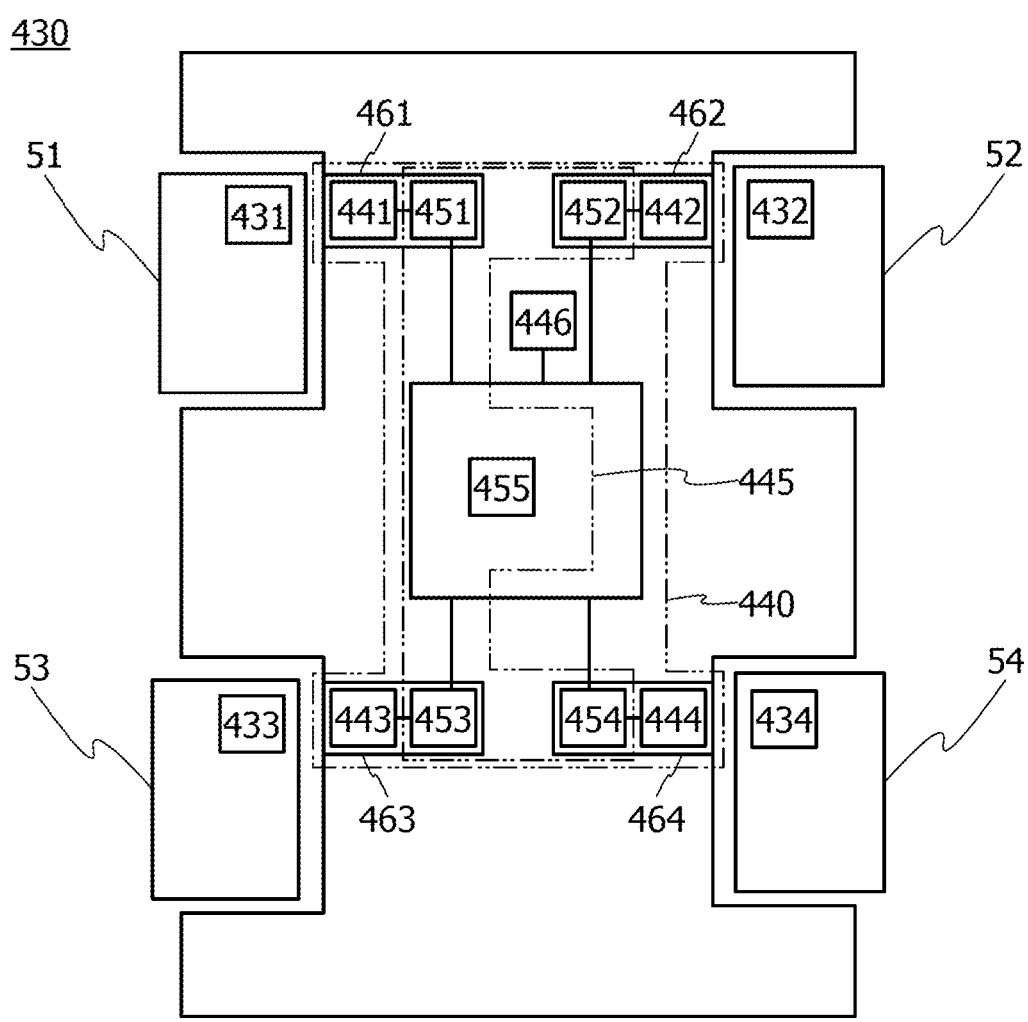
FIG. 9 illustrates an example of a moving object of one embodiment of the present invention.

Part of the circuit portion 445 may be disposed in the region around the tire. For example, the antenna 441 and the radio wave interface 451 connected to the antenna 441 may be disposed around the tire 51. FIG. 9 illustrates an example in which the radio wave interfaces 451 to 454 are disposed around the antennas 441 to 444, respectively. The radio wave interface generates and transmits a high-frequency wave to activate a wireless sensor in the semiconductor device, for example. In addition, the radio wave interface supplies power to the wireless sensor in the semiconductor device, for example. In addition, the radio wave interface modulates a transmission signal for transferring data to the wireless sensor in the semiconductor device, for example. In addition, the radio wave interface receives and demodulates a high-frequency wave transmitted from the wireless sensor in the semiconductor device, for example.

Figure 10A:
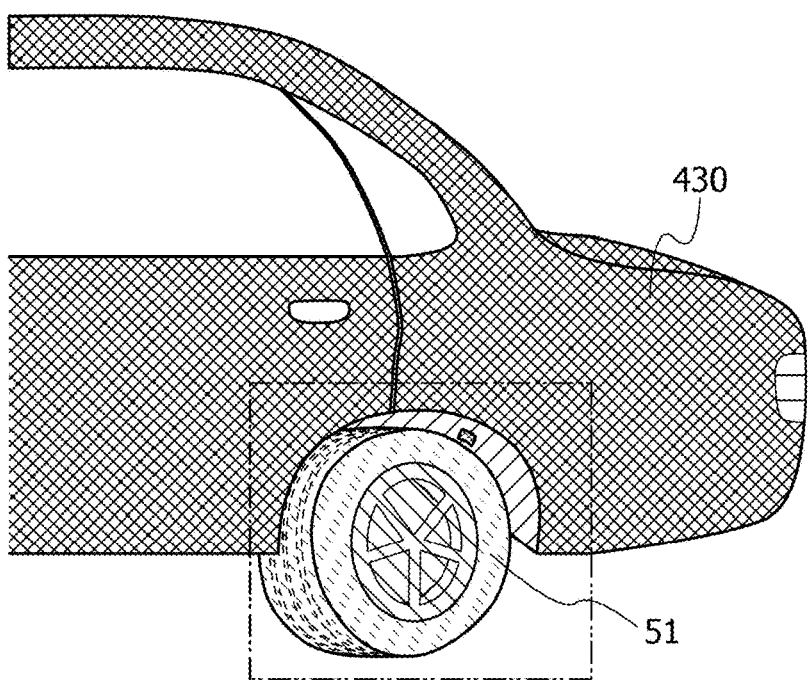
FIGS. 10A and 10B each illustrate a moving object and a tire of one embodiment of the present invention.
Figure 10B:
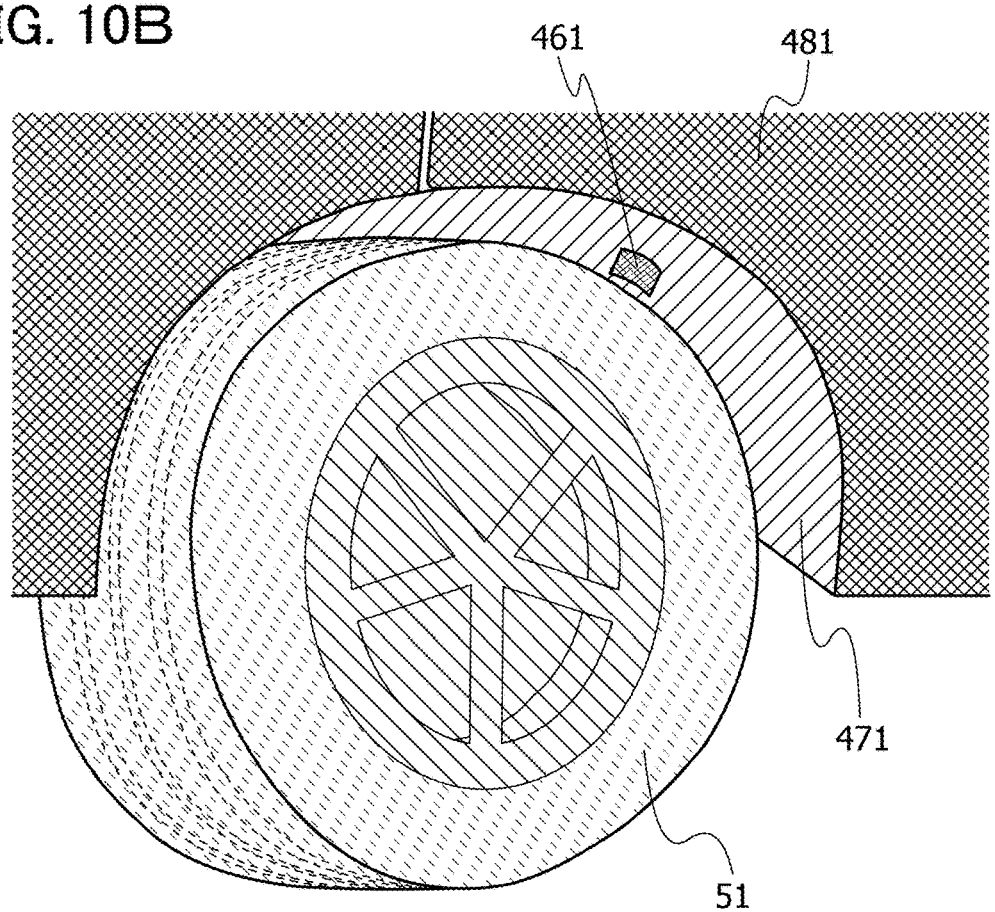

FIGS. 10A and 10B illustrate an example in which a receive portion 461 of the interrogator 440 is disposed in a tire house 471 of the moving object 430. FIG. 10A illustrates part of the moving object 430 and the tire 51. FIG. 10B is an enlarged view of a region surrounded by the dashed-double dotted line in FIG. 10A. As illustrated in FIG. 10B, the main body of the moving object 430 includes the tire house 471. The semiconductor device 431 is preferably provided inside the tire 51. The tire house 471 is positioned directly above the tire 51. The receive portion 461 is disposed in the tire house 471. The receive portion 461 is, for example, part of the interrogator 440 that is provided in the vicinity of a wireless sensor that communicates with the interrogator 440. The receive portion 461 includes the antenna 441. The receive portion 461 may include the radio wave interface 451. Alternatively, a structure in which the receive portion 461 does not include the radio wave interface 451 and the radio wave interface 451 is disposed in a region other than the tire house 471 may be employed.

Figure 11A:
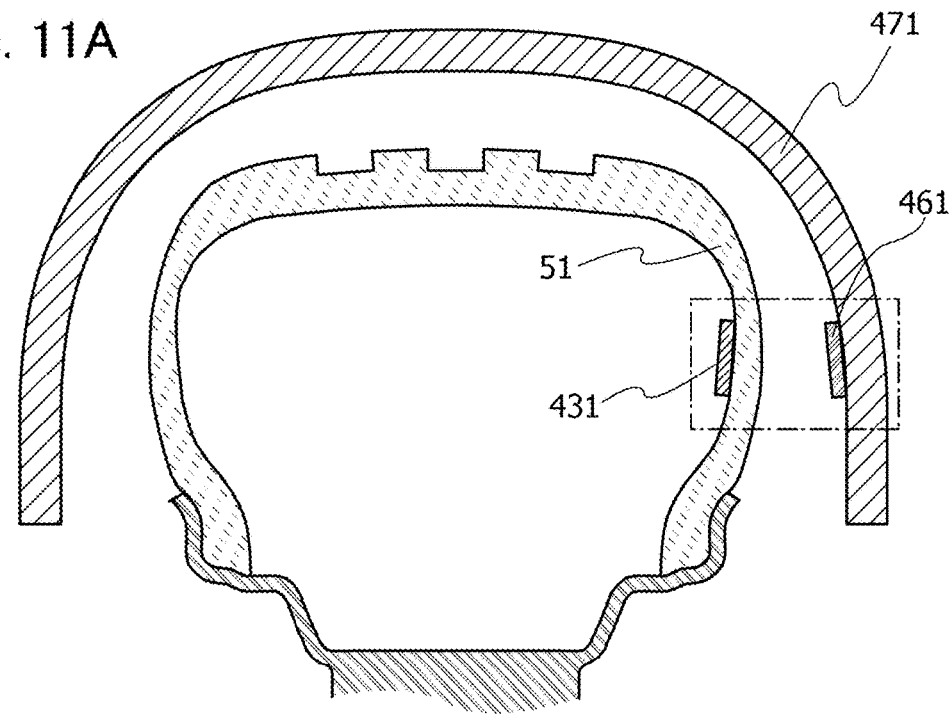
FIGS. 11A to 11D each illustrate a mounting example of a semiconductor device and a receive portion.
Figure 11B:
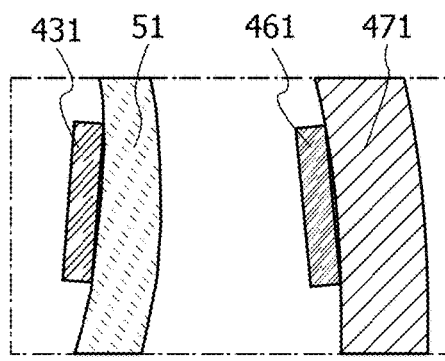

FIG. 11A is a cross-sectional view illustrating the arrangement of the tire 51, the semiconductor device 431, the tire house 471, and the receive portion 461. The semiconductor device 431 is mounted on the side portion of the tire 51. The receive portion 461 is mounted on the surface of the tire house 471. The receive portion 461 includes the antenna 441. In FIG. 11A, the semiconductor device 431 and the receive portion 461 face each other. FIG. 11B is an enlarged view of a region surrounded by the dashed-dotted line in FIG. 11A.

Figure 11C:
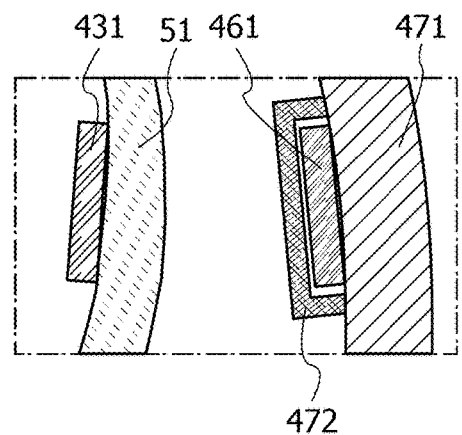

A cover 472 may be provided so as to cover the receive portion 461 as illustrated in FIG. 11C. The cover 472 is formed of a resin, for example.

Figure 11D:
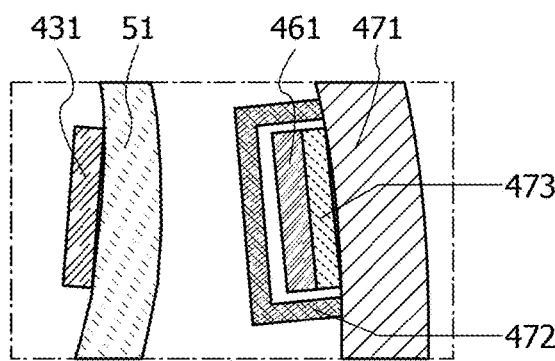

Furthermore, a plate 473 may be provided between the receive portion 461 and the tire house 471 as illustrated in FIG. 11D. When the antenna is provided in contact with the surface of a metal, eddy current induced in the metal by a magnetic flux passing through the metal might decrease the strength of the magnetic field of the antenna. Therefore, in the case where the receive portion 461 is provided over the metal, the plate 473 is preferably provided between the receive portion 461 and the metal. A magnetic material such as a ferrite is preferably used for the plate 473. With the use of a magnetic material such as a ferrite for the plate 473, decrease in the strength of the magnetic field can be suppressed.

Figure 12A:
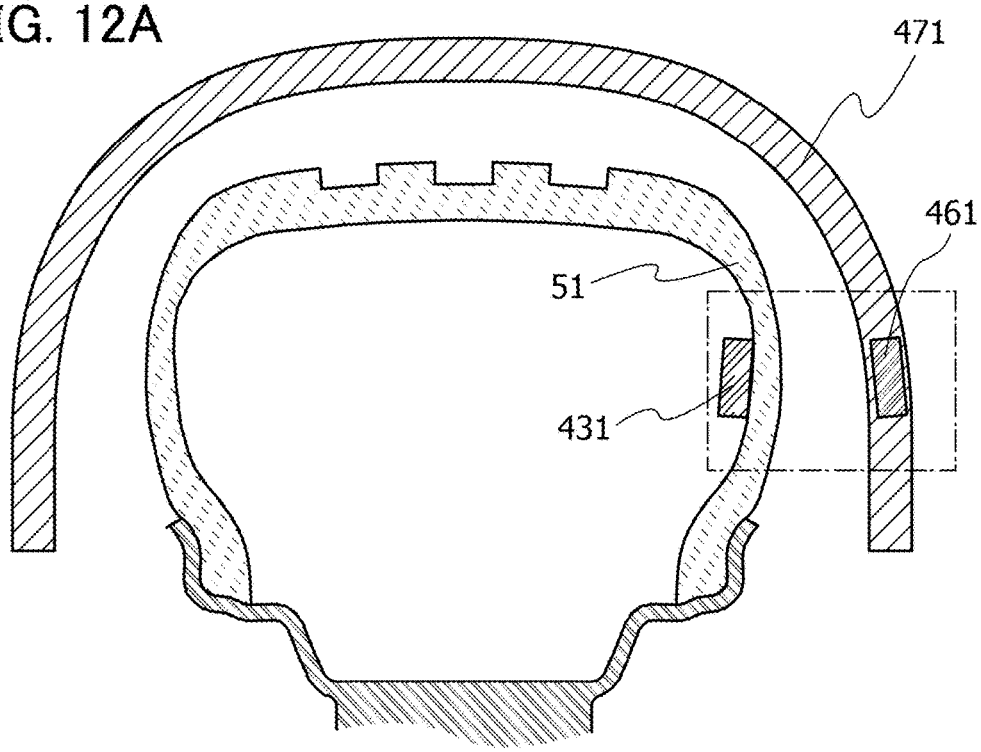
FIGS. 12A and 12B each illustrate a mounting example of a semiconductor device and a receive portion.
Figure 13A:
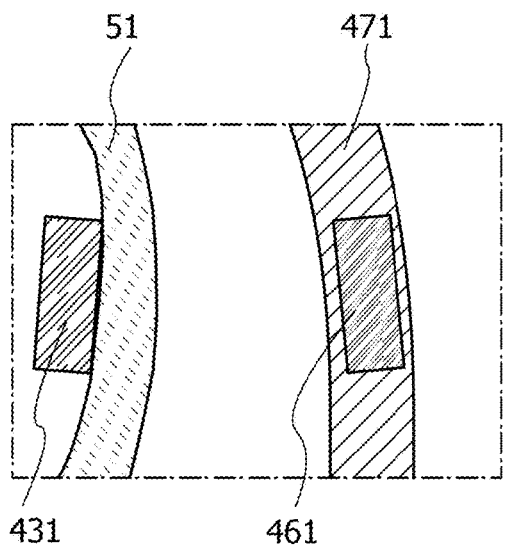
FIGS. 13A to 13D each illustrate a mounting example of a semiconductor device and a receive portion.
Figure 13B:
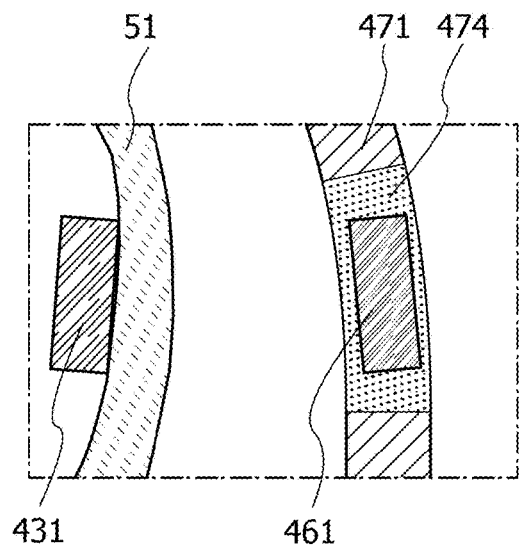

Furthermore, the receive portion 461 may be provided inside the tire house 471 as illustrated in FIG. 12A. FIG. 13A is an enlarged view of a region surrounded by the dashed-dotted line in FIG. 12A. FIG. 13B illustrates a modified example of FIG. 13A. As illustrated in FIG. 13B, a region 474 may be provided in the tire house 471, and the receive portion 461 may be provided in the region 474. The region 474 may be formed of a resin, for example.

Figure 12B:
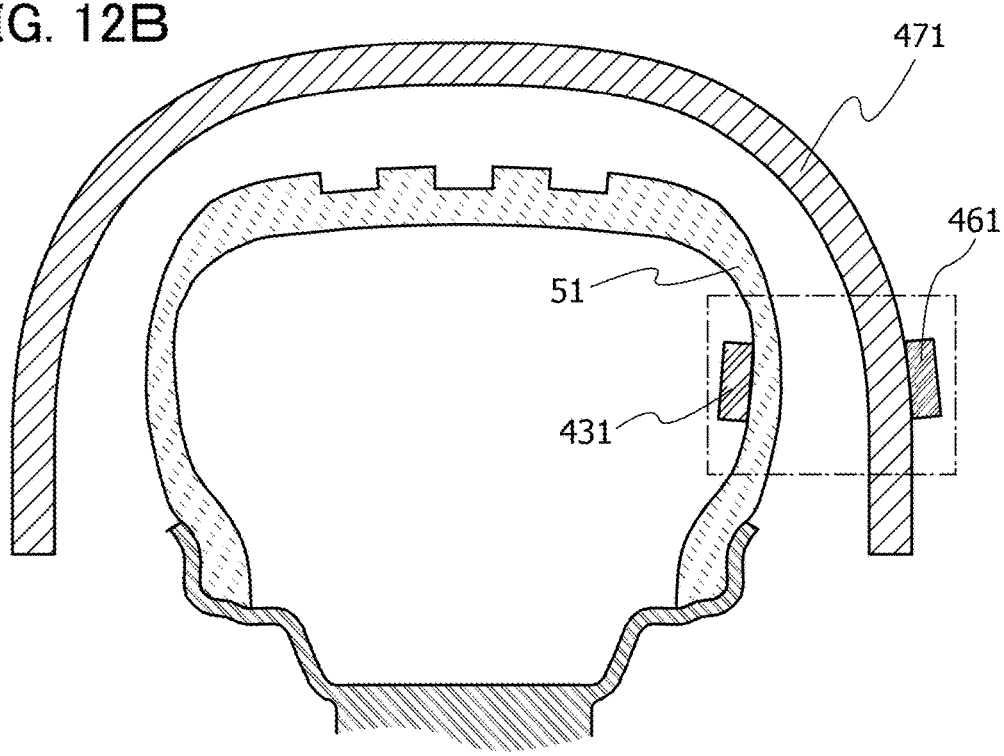
Figure 13C:
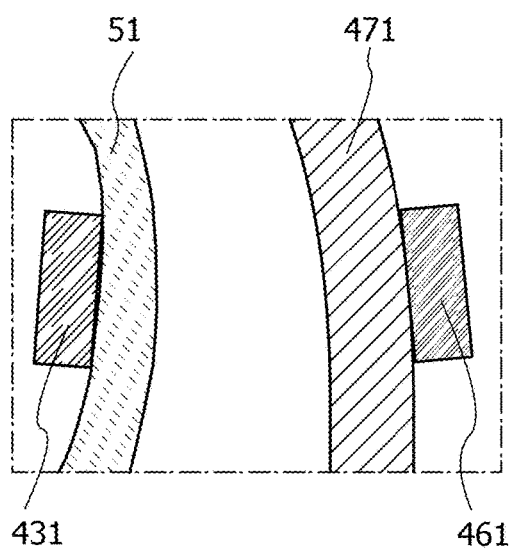
Figure 13D:
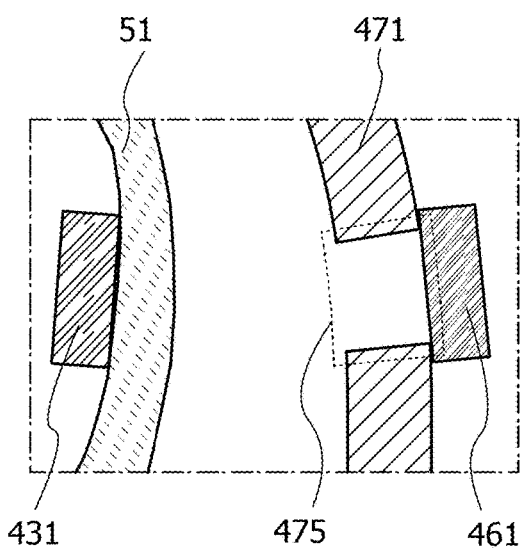

Furthermore, as illustrated in FIG. 12B, the tire house 471 may be provided between the semiconductor device 431 and the receive portion 461. FIG. 13C is an enlarged view of a region surrounded by the dashed-dotted line in FIG. 12B. FIG. 13D illustrates a modified example of FIG. 13C. As illustrated in FIG. 13D, a window 475 may be provided in the tire house 471, and a radio wave may be received through the window 475. Alternatively, the window 475 may be filled with a resin, glass, or the like.

The semiconductor devices 431 to 434 each preferably include a pressure sensor as a sensor element. The pressure sensor is, for example, a sensor element capable of measuring the pressure. When the semiconductor devices 431 to 434 each include a pressure sensor, the air pressure of each tire can be measured. For the semiconductor devices 432 to 434, the description of the semiconductor device 431 can be referred to.

Although the interrogator is used as a wireless communication device in FIG. 8, FIG. 9, and the like, the wireless communication device may be a smart meter, a mobile phone, a personal computer, or a wireless terminal that collects data, for example.

<Mounting Example 2 of Semiconductor Device>

The semiconductor device of one embodiment of the present invention includes a wireless sensor, and the semiconductor device is mounted on a tire of a moving object; when the distance between the tire and a driver's seat is short, an antenna of a wireless communication device may be provided on the driver's seat.

As an example, the case where the moving object 430 is a two-wheeled vehicle is described. The two-wheeled vehicle is, for example, a bicycle or a motorcycle. The semiconductor device of one embodiment of the present invention is mounted on a tire of the moving object 430.

Figure 14:
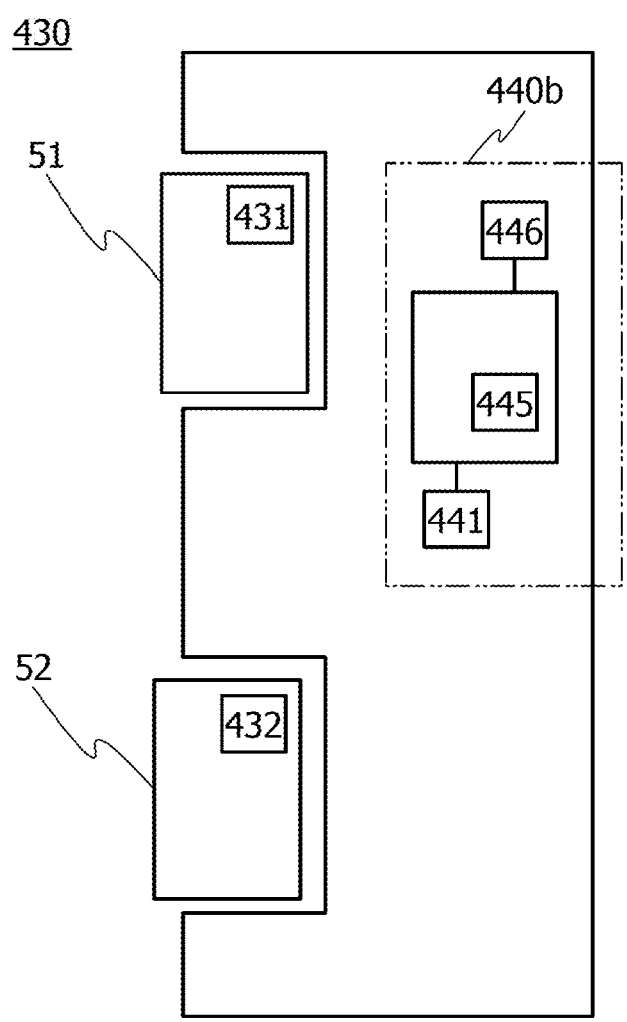
FIG. 14 illustrates an example of a moving object of one embodiment of the present invention.

The moving object 430 illustrated in FIG. 14 includes the tires 51 and 52. The moving object 430 illustrated in FIG. 14 is, for example, a bicycle. The semiconductor devices 431 and 432 are mounted on the tires 51 and 52, respectively. The semiconductor devices 431 and 432 may be provided inside the tires or on valve caps of the tires.

A wireless communication device 440b may be mounted on the moving object 430. Alternatively, a driver of the moving object 430 may hold or wear the wireless communication device 440b.

Figure 15A:
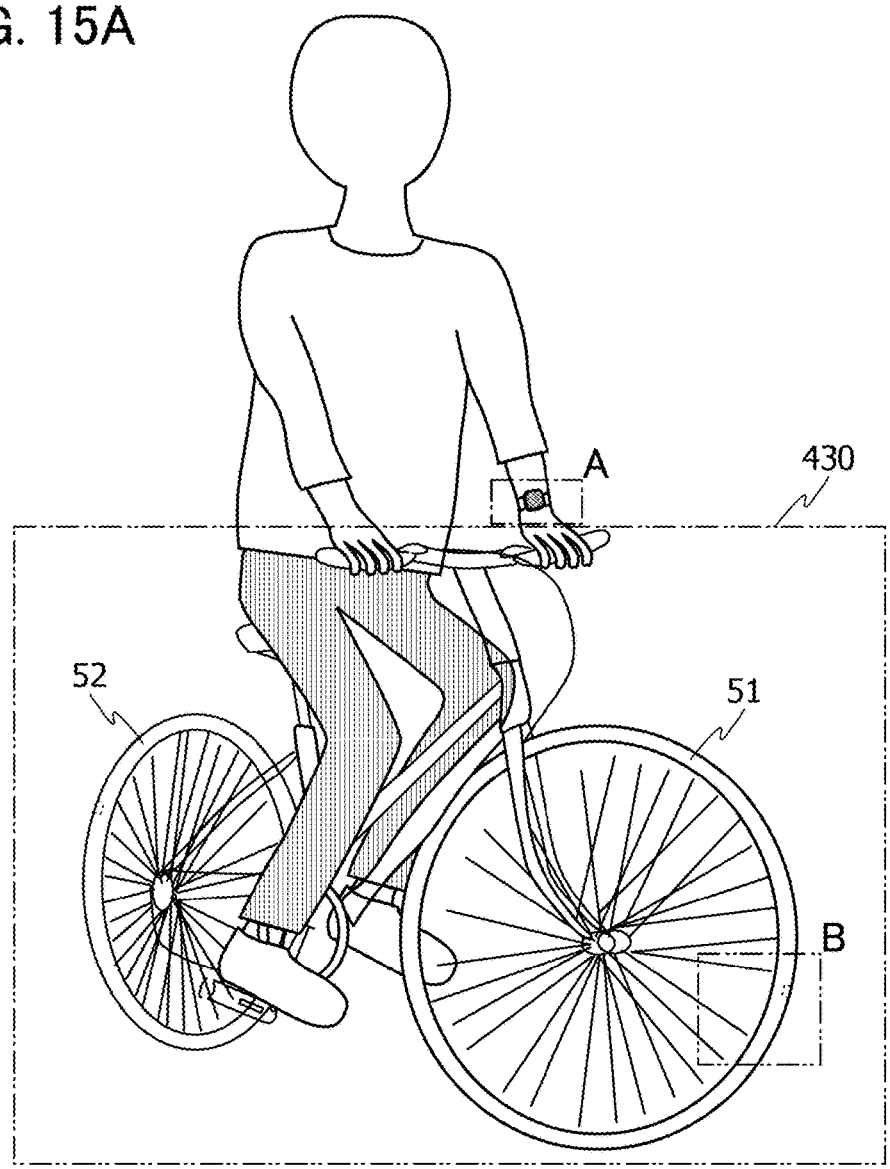
FIGS. 15A to 15C illustrate an example of a moving object of one embodiment of the present invention.
Figure 15B:
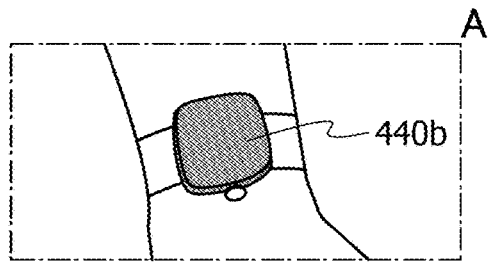
Figure 15C:
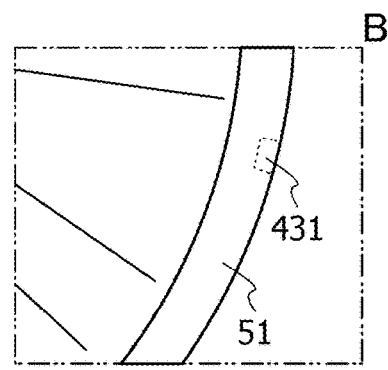

A mobile phone may be used as the wireless communication device 440b. The mobile phone also includes a smartphone in its category. Alternatively, a wireless terminal for collecting data may be used as the wireless communication device 440b. As the wireless terminal for collecting data, a terminal which can be worn on the body such as an arm (also referred to as a wearable terminal or a wearable device) may be used. FIG. 15A illustrates an example in which a watch-type wearable terminal is used as the wireless communication device 440b. FIG. 15B is an enlarged view of a region A in FIG. 15A, and FIG. 15C is an enlarged view of a region B in FIG. 15A.

<Collection of Data>

Data may be collected from the sensor element included in the semiconductor device continuously, periodically, or irregularly.

Collected data is transmitted to the interrogator through wireless communication. The collected data may also be analyzed in the circuit portion 402, and a signal may be transmitted to the interrogator only when a certain condition is satisfied.

For example, in the case where the sensor element measures the air pressure of the tire of the moving object 430, a signal may be transmitted to the interrogator only when the pressure is lower than or equal to a certain value.

The semiconductor devices 302 and 431 to 434 each preferably include a plurality of sensors, i.e., at least two sensors selected from a pressure sensor, a temperature sensor, an acceleration sensor, and a strain sensor.

<Strain Sensor>

As the strain sensor, for example, a strain gage which includes a wiring pattern over a thin insulator and detects a change in resistance due to strain can be used. By using a Wheatstone bridge, a change in resistance due to strain can be converted into a change in voltage.

<Pressure Sensor>

As the pressure sensor, for example, a piezoelectric element can be used. As the piezoelectric element, a capacitive displacement pressure sensor provided with a parallel-plate capacitor or a strain gage pressure sensor which detects a change in resistance due to strain can be used, for example.

An example of the strain gauge pressure sensor is a sensor in which p-type silicon crystal is doped with an n-type impurity by thermal diffusion and a compensated intrinsic semiconductor region with high resistance is used as a strain gage. Alternatively, a piezoelectric element formed of a polymer film may be used.

<Acceleration Sensor>

Examples of the acceleration sensor include a capacitance detecting type acceleration sensor which detects a change in capacitance between a movable portion and a fixed portion, a piezo resistance acceleration sensor which detects strain in a region which connects a movable portion to a fixed portion, and a heat detecting type acceleration sensor.

As the acceleration sensor, a gyro sensor can also be used. Examples of a vibration gyro sensor include a capacitive vibration gyro sensor and a piezo resistance vibration gyro sensor.

<Temperature Sensor>

Examples of the temperature sensor include a thermistor (a resistive element whose resistance varies depending on the temperature) and a sensor including a bimetallic strip.

In addition, a semiconductor temperature sensor which is formed as an IC can be used. For example, a temperature sensor which utilizes the temperature characteristics of base-emitter voltage of an NPN transistor or the like can be used.

Alternatively, the temperature sensor may include two or more kinds of semiconductor elements with different temperature characteristics. A semiconductor element including an oxide semiconductor and a semiconductor element including a silicon semiconductor may be provided in the temperature sensor. The temperature dependence of a semiconductor element including an oxide semiconductor is smaller than that of a conventional semiconductor element including silicon, germanium, or a compound thereof. With the use of a semiconductor element including an oxide semiconductor, the temperature sensor or the like can have excellent characteristics.

<MEMS Sensor>

A MEMS sensor can also be used as the sensor element provided in the semiconductor device of one embodiment of the present invention. For example, a MEMS sensor in which MEMS technology is applied to a piezoelectric element of a pressure sensor can be used. Alternatively, MEMS technology can be applied to a movable portion of a strain sensor. Further alternatively, a vibration gyro sensor using MEMS technology can be used as the acceleration sensor.

(Embodiment 2)

In this embodiment, an example of an integrated circuit of one embodiment of the present invention will be described.

Figure 16A:
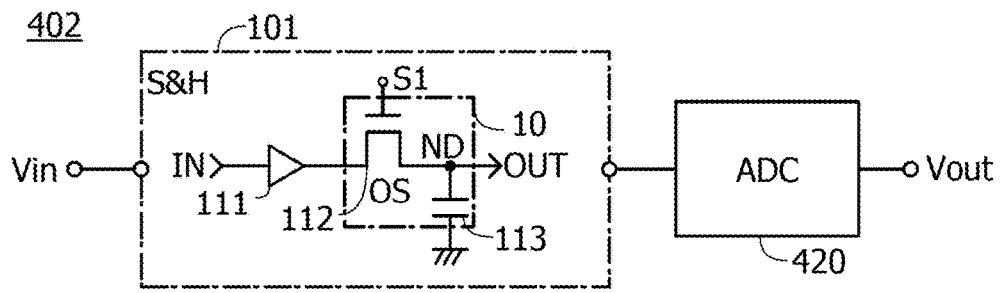
FIGS. 16A to 16C are each a block diagram illustrating one embodiment of the present invention.

The circuit portion 402 illustrated in FIG. 16A includes the sample-and-hold circuit (abbreviated as S&H in the drawing) 101 and the analog-to-digital converter circuit 420. The circuit portion 402 can also include, as described in Embodiment 1, a constant-voltage circuit, a rectifier circuit, a demodulation circuit, a modulation circuit, an oscillator circuit, a memory circuit, and the like. An analog potential Vin is input to the analog-to-digital converter circuit 420 through the sample-and-hold circuit 101. Digital data Vout is output from the analog-to-digital converter circuit 420.

The sample-and-hold circuit 101, to which a potential of analog data (the analog potential Vin) is input, is capable of holding charge corresponding to the analog potential Vin in accordance with control by a control signal S1. The control signal S1 is a signal supplied from a timing controller.

The sample-and-hold circuit 101 includes, for example, a buffer circuit 111, a transistor 112, and a capacitor 113. An input terminal of the sample-and-hold circuit 101 is connected to one of a source and a drain of the transistor 112. An output terminal of the sample-and-hold circuit 101 is connected to the other of the source and the drain of the transistor 112. Note that a node at the other of the source and the drain of the transistor 112 is referred to as a node ND for description.

The buffer circuit 111 is capable of amplifying a signal such as analog data input to the sample-and-hold circuit 101 and outputting the amplified signal. Although the buffer circuit 111 is provided between the input terminal of the sample-and-hold circuit 101 and the one of the source and the drain of the transistor 112 in FIG. 16A, the structure is not limited thereto, and the buffer circuit 111 may be connected to a gate of the transistor 112.

Figure 16B:
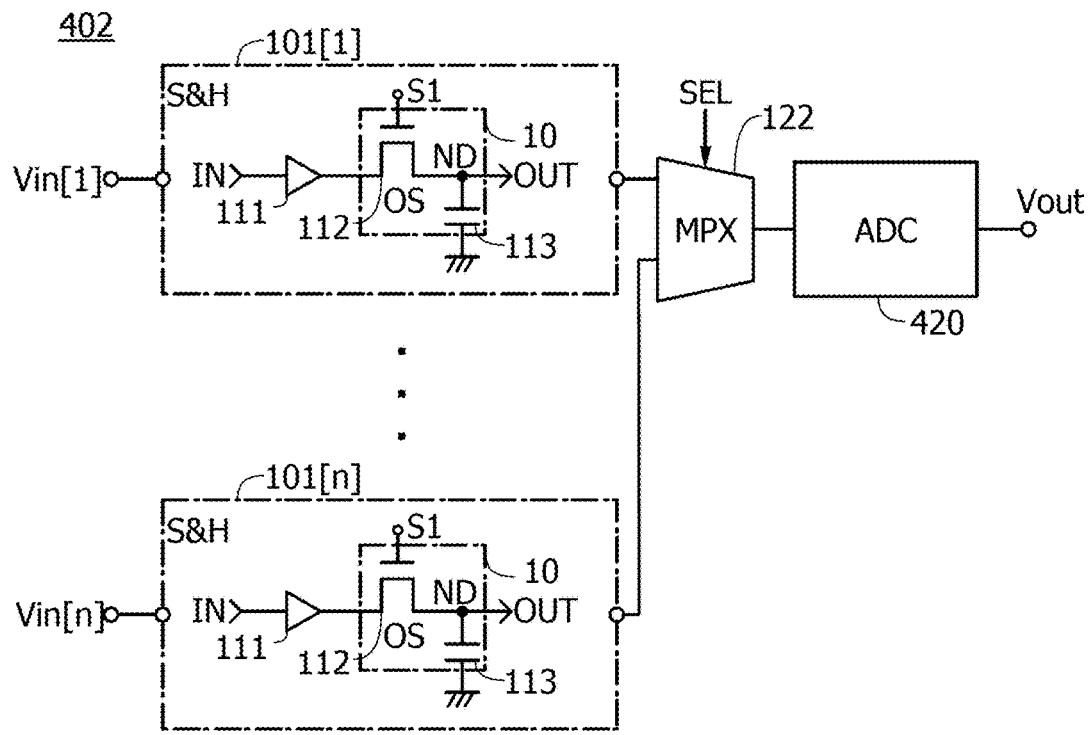
Figure 16C:
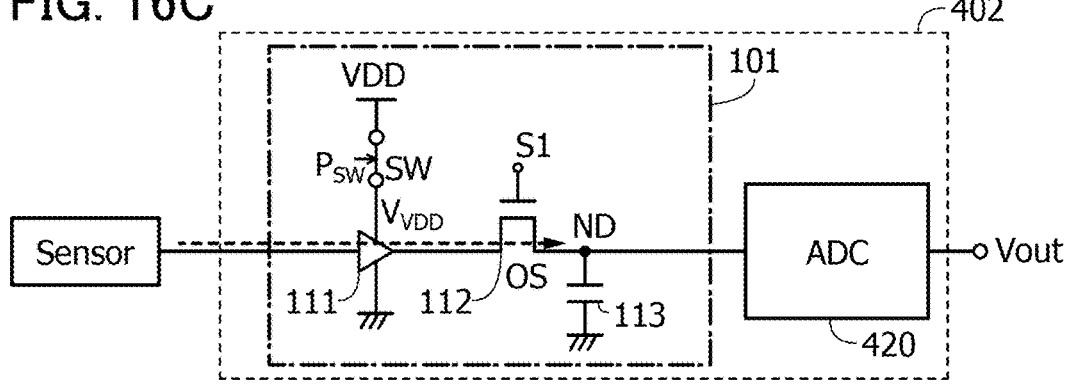

The transistor 112 has an extremely low off-state current flowing between the source and the drain. For a transistor having such a function, a transistor whose channel formation region includes an oxide semiconductor (an OS transistor) is preferred. An OS transistor will be described in detail in an embodiment below. In FIGS. 16A to 16C, "OS" is written beside a circuit symbol of an OS transistor for clarification. The one of the source and the drain of the transistor 112 is connected to the input terminal of the sample-and-hold circuit 101. The gate of the transistor 112 is connected to a wiring for supplying the control signal S1. The other of the source and the drain of the transistor 112 is connected to the output terminal of the sample-and-hold circuit 101 and the node ND.

The capacitor 113 is capable of holding charge corresponding to the analog potential Vin by turning off the transistor 112. In FIG. 16A, the capacitor 113 is connected to the other of the source and the drain of the transistor 112, that is, to the node ND; however, the capacitor 113 is not necessarily provided and can be omitted when gate capacitance or the like of an input terminal of a comparator included in the analog-to-digital converter circuit 420 is utilized. Note that a circuit including the transistor 112 and the capacitor 113 and holding charge corresponding to the analog potential Vin is denoted by a first circuit 10 in the drawing.

For example, one analog potential is input to one sample-and-hold circuit.

The circuit portion 402 preferably includes a plurality of sample-and-hold circuits. With a plurality of sample-and-hold circuits, a plurality of analog potentials can be input and held.

For example, m (m is an integer of one or more) analog-to-digital converter circuits of the analog-to-digital converter circuits in the circuit portion 402 are connected to the sample-and-hold circuit, and n (n is an integer of one or more) sample-and-hold circuits of the sample-and-hold circuits in the circuit portion 402 are connected to the analog-to-digital converter circuit.

Analog potentials input to the n sample-and-hold circuits are held at the nodes ND of the sample-and-hold circuits.

In the case where m is 1, analog potentials held in the n sample-and-hold circuits, i.e., an analog potential held in a first sample-and-hold circuit to an analog potential held in an n-th sample-and-hold circuit, are sequentially processed by one analog-to-digital converter circuit. Digital data obtained by processing the analog potentials is sequentially output from the analog-to-digital converter circuit.

Analog potentials held in the n sample-and-hold circuits may be processed by two or more analog-to-digital converter circuits. That is, m may be 2 or more. As the number of the analog-to-digital converter circuits is larger, that is, m is larger, a period for processing n analog potentials held in the n sample-and-hold circuits can be shorter in some cases. However, as m is larger, power consumption of the circuit portion 402 is higher.

That is, m is preferably small because power consumption of the circuit portion 402 can be reduced. Specifically, m is preferably less than or equal to n. In addition, m is preferably less than n, more preferably 1.

The successive approximation analog-to-digital converter circuit 420 is preferably used as the analog-to-digital converter circuit. In addition, the sample-and-hold circuit 101 is preferably used as the sample-and-hold circuit. An x-th analog-to-digital converter circuit 420 is represented as an analog-to-digital converter circuit 420[x], and a y-th sample-and-hold circuit 101 is represented as a sample-and-hold circuit 101[y]. Note that x is an integer of greater than or equal to 1 and less than or equal to m, and y is an integer of greater than or equal to 1 and less than or equal to n.

An analog potential Vin input to the y-th sample-and-hold circuit 101 is represented as Vin[y].

FIG. 16B illustrates an example in which m is 1. In the example illustrated in FIG. 16B, n sample-and-hold circuits 101 are connected to the analog-to-digital converter circuit 420 through a selector (also referred to as a multiplexer and abbreviated as MPX in the drawing) 122.

The selector 122 is capable of, in accordance with a selection signal SEL, selecting one of analog potentials of the sample-and-hold circuits 101[1] to 101[n] and outputting the potential to the comparator included in the analog-to-digital convertor circuit 420. The sample-and-hold circuits 101[1] to 101[n] can hold analog potentials Vin[1] to Vin[n], and power supply to the buffer circuits can be stopped. Accordingly, the operation can be performed so as to reduce power consumption.

Figure 17:
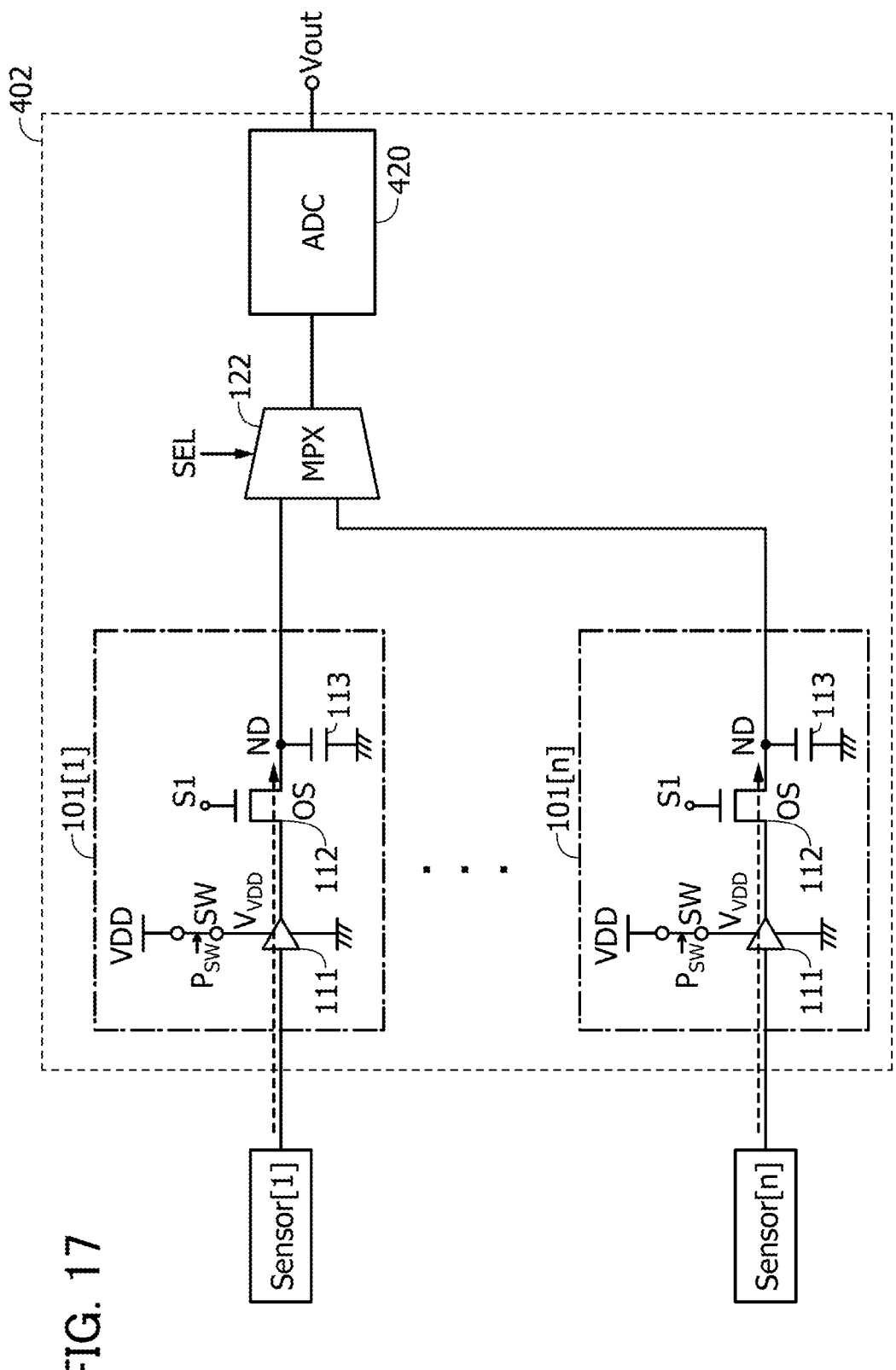
FIG. 17 is a block diagram illustrating one embodiment of the present invention.

FIG. 16C illustrates an example in which a sensor element is connected to the sample-and-hold circuit 101 in FIG. 16A, and FIG. 17 illustrates an example in which sensor elements are connected to the sample-and-hold circuits 101 in FIG. 16B. FIG. 17 illustrates the case where n sensor elements are connected to the n sample-and-hold circuits, for example. A y-th sensor element is represented as Sensor[y] or Sen.[y].

The sample-and-hold circuit 101 includes a switch SW through which power is supplied to the buffer circuit 111.

The on/off state of the switch SW is controlled by a control signal $P_{SW}$. When the switch SW is turned on, a node $V_{VDD}$ has a potential VDD, and thus, a voltage corresponding to a potential difference between the potential VDD and a ground potential GND can be supplied. When the switch SW is turned off, the node $V_{VDD}$ has the ground potential GND, and power supply can be stopped.

The switch SW is turned on, and the transistor 112 is turned on by the control signal S1, so that the analog potential Vin is transmitted to the node ND. Next, the switch SW is turned off after the transistor 112 is turned off, so that power supply to the buffer circuit 111 is stopped. As described above, since the transistor 112 has an extremely low off-state current, the analog potential Vin transmitted to the node ND can be continuously held by keeping the transistor 112 off even when the power supply to the buffer circuit 111 is stopped. Therefore, power supply to the sensor element supplying the analog potential can also be stopped.

Figure 18:
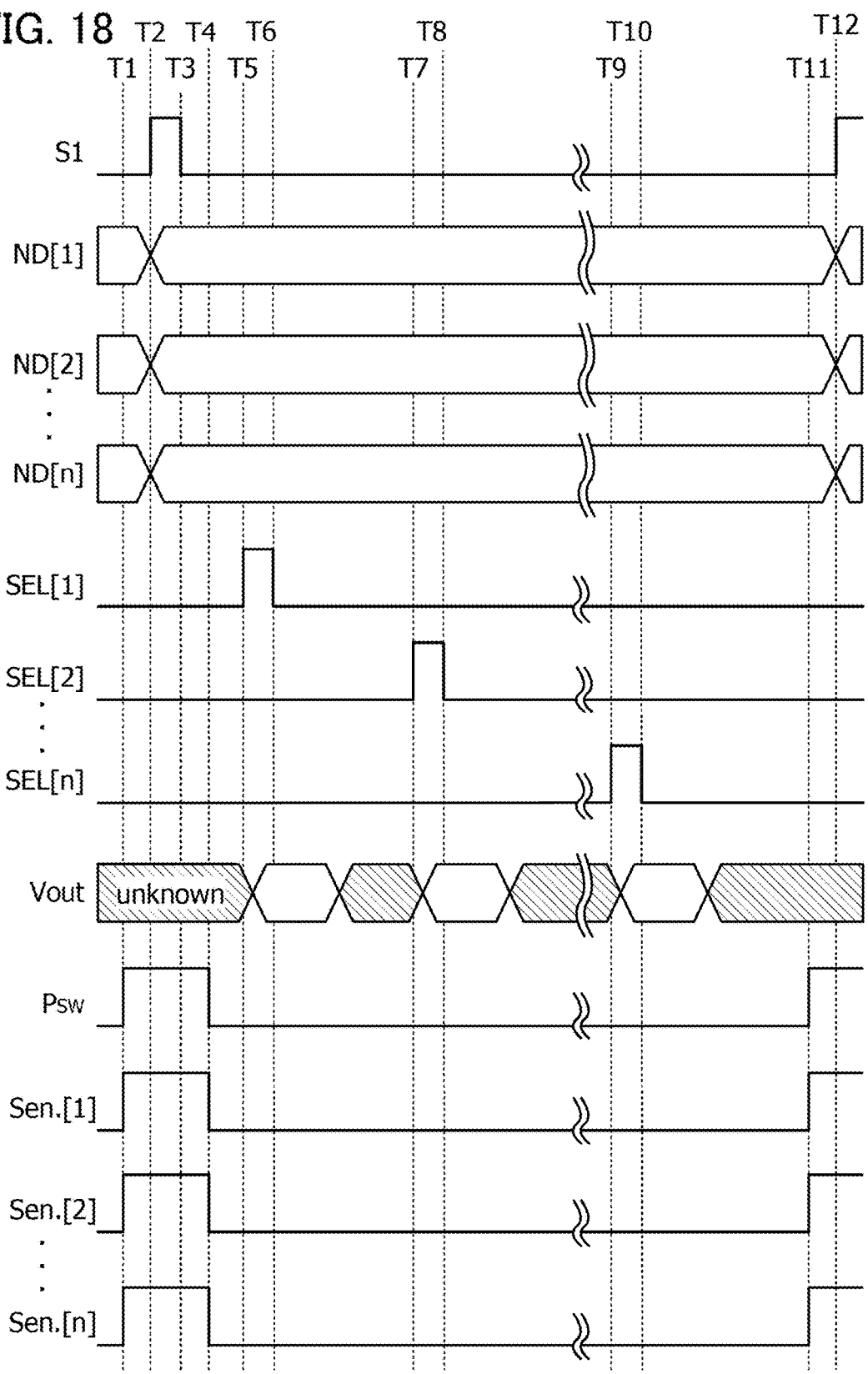
FIG. 18 is a timing chart of one embodiment of the present invention.

In the case where m is 1, analog potentials held in the n sample-and-hold circuits, i.e., the analog potential held in the first sample-and-hold circuit to the analog potential held in the n-th sample-and-hold circuit, are sequentially processed by one analog-to-digital converter circuit; this example is described using a timing chart in FIG. 18. Here, the case where n is 3 or more is described.

The control signal $P_{SW}$ is set high at time T1. Accordingly, VDD potentials are input to the buffer circuits 111 of the sample-and-hold circuits 101[1] to 101[n]. Also, Sensor[1] to Sensor [n] are turned on at the time T1.

Then, the control signal S1 is set high at time T2. Accordingly, the transistors 112 are turned on, and analog potentials of Sensor[1] to Sensor [n] are input to the nodes ND of the sample-and-hold circuits 101[1] to 101[n].

With the sample-and-hold circuit of one embodiment of the present invention, data of Sensor[1] to Sensor [n] in the same period (e.g., a period from the time T2 to time T3) can be held. Since data in the same period can be held, a phenomenon which occurs in a very short period can be detected in some cases, for example. For example, a moving object such as a vehicle stops suddenly in some cases; thus, it is possible that the analysis accuracy is increased when data in the same period is used.

Then, the control signal S1 is set low at the time T3. Accordingly, the transistors 112 are turned off, so that the potentials of the nodes ND in the sample-and-hold circuits 101[1] to 101[n] are held. Here, the node ND of the n-th sample-and-hold circuit 101 is represented as a node ND[n].

Then, the control signal $P_{SW}$ is set low at time T4. Accordingly, power supply to the buffer circuits 111 is stopped. By stopping the power supply to the buffer circuits 111, power consumption can be reduced. Also, Sensor[1] to Sensor [n] are turned off at the time T4. Sensor[1] to Sensor [n] may also be on after the time T4; however, power consumption can be reduced by turning off the sensor elements.

When a selection signal SEL[n] is input to the selector 122, the analog potential of the n-th sample-and-hold circuit 101 is selected. A selection signal SEL[1] is input to the selector 122 at time T5. When the selection signal SEL[1] is input, the analog potential of the node ND[1] is input to the analog-to-digital converter circuit 420. The input analog potential is output as Vout from the analog-to-digital converter circuit 420. Supply of the selection signal SEL[1] is stopped at time T6.

Then, a selection signal SEL[2] is input to the selector 122 at time T7. When the selection signal SEL[2] is input, the analog potential of the node ND[2] is input to the analog-to-digital converter circuit 420. The input analog potential is output as Vout from the analog-to-digital converter circuit 420. Supply of the selection signal SEL[2] is stopped at time T8.

In this manner, in the order from the analog potential of the node ND[1], analog potentials are input to the analog-to-digital converter circuit 420. The selection signal SEL[n] is input to the selector 122 at time T9, so that the analog potential of the node ND[n] is input to the analog-to-digital converter circuit 420. The input analog potential is output as Vout from the analog-to-digital converter circuit 420. Supply of the selection signal SEL[n] is stopped at time T10. Through the above process, the analog potentials of the nodes ND[1] to ND[n] are sequentially converted into digital signals and output.

The control signal $P_{SW}$ is set high at time T11. Also, Sensor[1] to Sensor [n] are turned on. Then, the control signal S1 is set high at time T12, so that the analog potentials are input to the nodes ND[1] to ND[n]. After that, the analog potentials of the nodes ND[1] to ND[n] may be sequentially converted into digital signals and output, as in the operation from the time T3 to the time T10. In accordance with the operation of the analog-to-digital converter circuit and the operation of the sample-and-hold circuits, whether to supply power to the circuits can be controlled. Therefore, the analog-to-digital converter circuit and the sample-and-hold circuits are not necessarily supplied with power continuously throughout a period in which a wireless signal is received. Thus, the proportion of power consumed by the analog-to-digital converter circuit and the sample-and-hold circuits in the semiconductor device 400 can be reduced, and the proportion of power consumed by transmitting a signal from the semiconductor device 400 to the outside can be increased; accordingly, the convenience of the semiconductor device 400 can be improved, e.g., the communication distance can be extended.

Although a timing controller, an oscillator circuit, or the like is included in the analog-to-digital converter circuit in this embodiment, any of them may be provided outside the analog-to-digital converter circuit 420. For example, an oscillator circuit included in the analog-to-digital converter circuit 420 can be omitted, and the oscillator circuit 408 included in the circuit portion 402 can be used instead.

Figure 19:
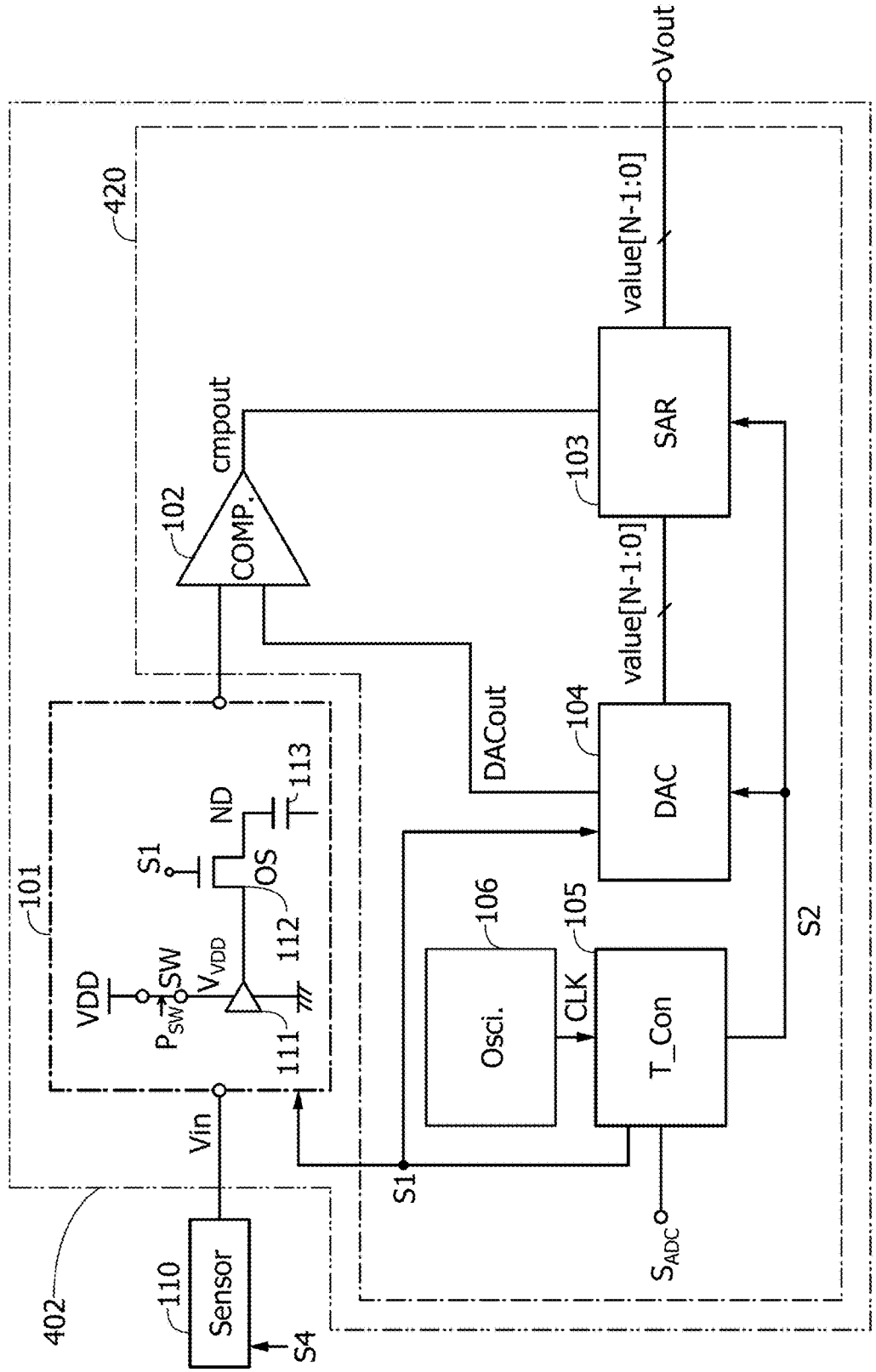
FIG. 19 is a block diagram illustrating one embodiment of the present invention.

The circuit portion 402 illustrated in FIG. 19 includes the sample-and-hold circuit 101 and the analog-to-digital converter circuit 420 connected to the sample-and-hold circuit 101. The analog-to-digital converter circuit 420 in FIG. 19 includes a comparator 102 (abbreviated as COMP. in the drawing), a successive approximation register 103 (abbreviated as SAR in the drawing), a digital-to-analog converter circuit 104 (also referred to as a DA converter and abbreviated as DAC in the drawing), a timing controller 105 (abbreviated as T_Con in the drawing), and an oscillator circuit 106 (abbreviated as Osci. in the drawing).

A circuit including a comparator, a successive approximation register, and a digital-to-analog converter circuit is referred to as a successive approximation analog-to-digital converter circuit in some cases.

A sensor element 110 is preferably connected to the circuit portion 402. In FIG. 19, the sensor element 110 is connected to the sample-and-hold circuit 101.

The comparator 102 is capable of comparing the level of the analog potential Vin held in the sample-and-hold circuit 101 and that of an analog potential DACout output from the digital-to-analog converter circuit 104 and outputting a signal cmpout in accordance with the comparison result.

The successive approximation register 103 is capable of holding and outputting N-bit digital data (N is a natural number of 2 or more) in accordance with a change in the analog potential DACout. The N-bit digital data, that is, digital data from the 0th bit to the (N−1)-th bit (abbreviated as value[N−1:0] in the drawing), is output to the outside as Vout and also output to the digital-to-analog converter circuit 104. The successive approximation register 103 includes a logic circuit including registers corresponding to the respective bits and can output digital data in accordance with control by a control signal S2. The control signal S2 is a signal supplied from the timing controller 105.

The digital-to-analog converter circuit 104 is capable of generating the analog potential DACout in accordance with the digital data and outputting the potential. The digital-to-analog converter circuit 104 may be the conversion type with a capacitor (C-DAC) or the conversion type with a resistor (R-DAC). In particular, a C-DAC including an OS transistor is preferable because a digital value can be held. The details of a C-DAC including an OS transistor will be described later.

Figure 20:
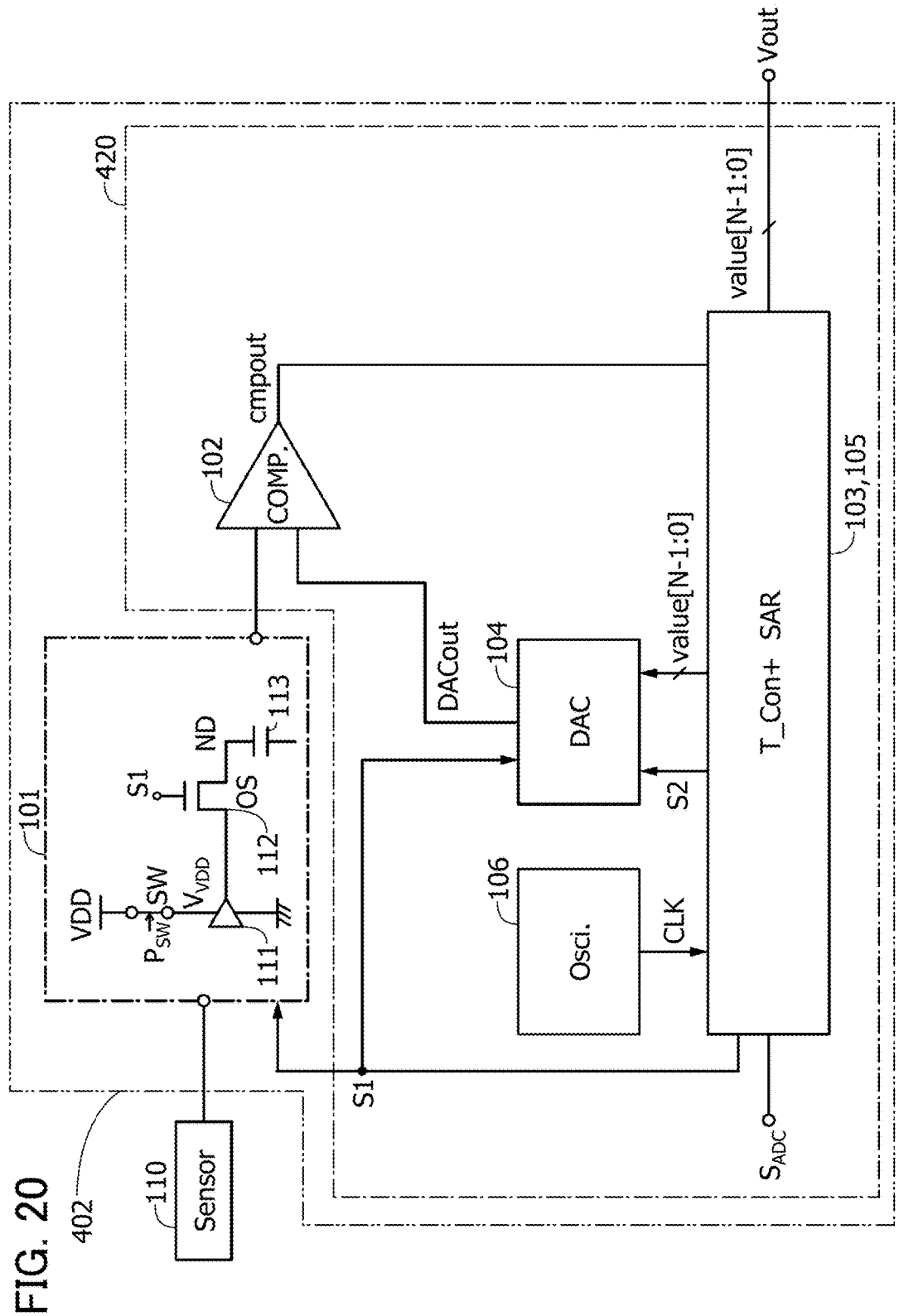
FIG. 20 is a block diagram illustrating one embodiment of the present invention.

The timing controller 105 is capable of generating and outputting the control signals S1 and S2 in synchronization with a clock signal CLK in accordance with a signal $S_{ADC}$. The timing controller 105 includes a logic circuit and can output the control signals S1 and S2 in accordance with the clock signal CLK and the signal $S_{ADC}$. The timing controller 105 including a logic circuit can be formed to be integral with the successive approximation register 103 including a logic circuit as illustrated in FIG. 20. The timing controller 105 is referred to as a control circuit in some cases.

The oscillator circuit 106 (abbreviated as Osci. in the drawing) is capable of generating and outputting the clock signal CLK. The oscillator circuit 106 may be a crystal oscillator or a ring oscillator.

The circuit portion 402 in FIG. 19 makes the sample-and-hold circuit 101 including the transistor 112 with an extremely low off-state current hold the analog potential Vin obtained by the sensor element or the like. In the sample-and-hold circuit 101, the node ND that can hold charge by turning off the transistor 112 holds the analog potential Vin. In one embodiment of the present invention, power consumption can be reduced by stopping power supply to the buffer circuit 111 included in the sample-and-hold circuit 101 or the like.

In one embodiment of the present invention, power consumption can be reduced without suppressing the drive voltage or the frequency of the clock signal, so that it is possible to avoid a decrease in performance of the analog-to-digital converter circuit, such as the resolution or sampling rate. In one embodiment of the present invention, the analog data can be held without the use of a flash memory or the like, whereby power consumption can be reduced without providing a dedicated high-voltage generation circuit or a dedicated periphery circuit.

Figure 21:
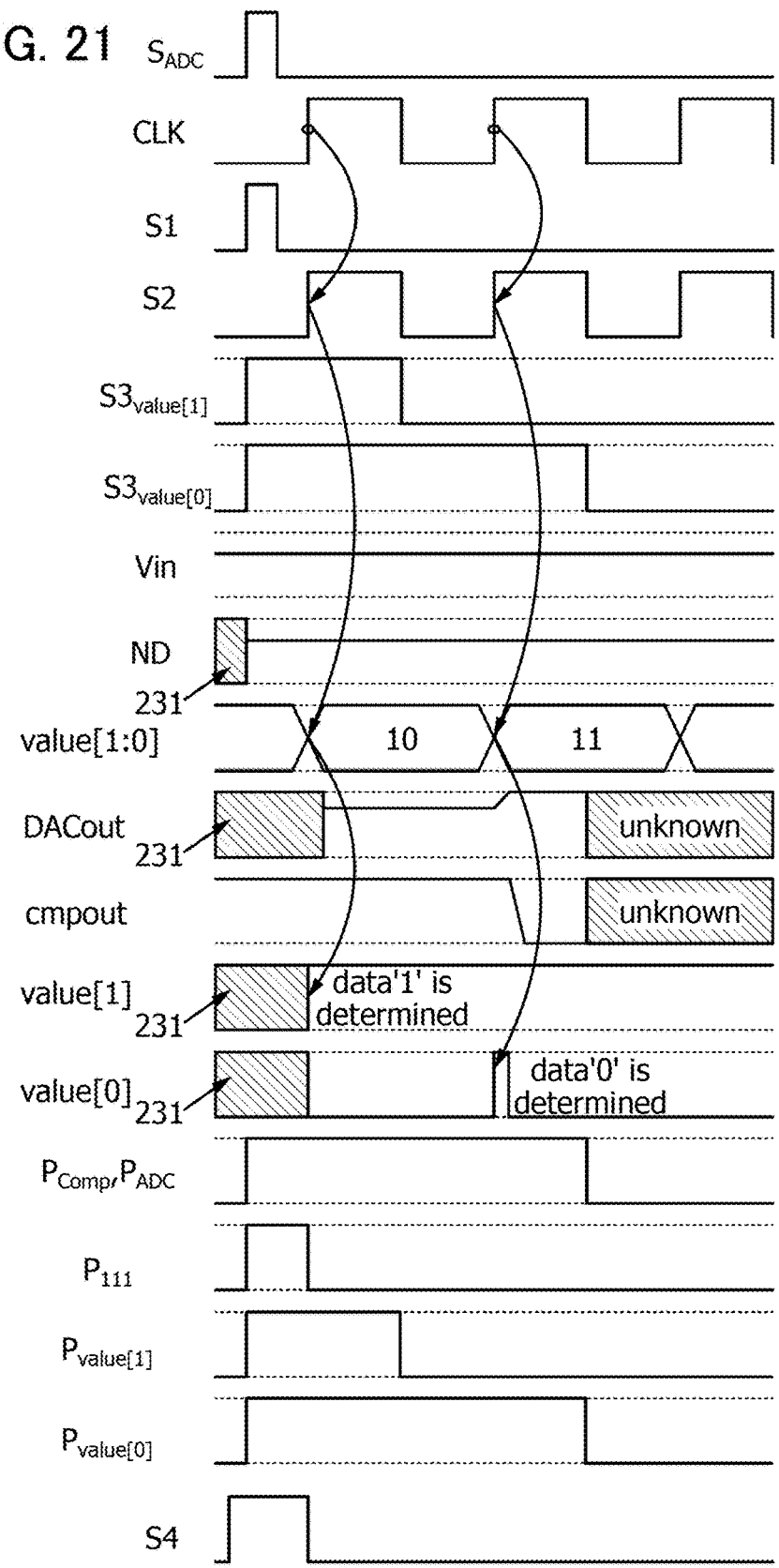
FIG. 21 is a timing chart of one embodiment of the present invention.

An operation example of the case where the circuit portion 402 includes the sample-and-hold circuit 101, the analog-to-digital converter circuit 420, and the sensor element 110 is described using a timing chart in FIG. 21.

The sensor element 110 is preferably controlled to be turned on or off by the control signal output from the timing controller 105. For example, the sensor element 110 is preferably controlled by a signal S4 or the like shown in FIG. 21.

The operation of the circuit portion 402 in FIG. 19 is described using the timing chart in FIG. 21. Note that VDD is 3 V, VSS is 0 V, Vref is 2 V, and Vin input from the sensor element 110 is 1.5 V, as an example. When an analog value of 1.5 V is converted into a 2-bit digital value, the description is made on the assumption that there are the states corresponding to the digital values "00", "01", "10", and "11", which correspond to analog values of 0.5 V, 1.0 V, 1.5 V, and 2.0 V, respectively. Note that a shaded portion 231 in the drawing represents the state where previous data is held.

When the signal $S_{ADC}$ is input to the timing controller 105, the timing controller 105 starts up the oscillator circuit 106 and makes it output the clock signal CLK. When the signal $S_{ADC}$ is input to the timing controller 105, the timing controller 105 outputs the control signal S1 to the sample-and-hold circuit 101. The timing controller 105 outputs the control signal S2 to the digital-to-analog converter circuit 104 and the successive approximation register 103. The timing controller 105 outputs a control signal $S3_{value[1:0]}$ to the digital-to-analog converter circuit 104 and the successive approximation register 103.

The operation of the sensor element 110 may also be started by the control signal S1, for example. Alternatively, the operation of the sensor element 110 may be started by a signal that is not the control signal S1, such as the control signal S4 shown in FIG. 21, for example. In the example shown in FIG. 21, the operation of the sensor element 110 is started by the control signal S4, and then, the signal $S_{ADC}$ is input to the timing controller 105.

Figure 22:
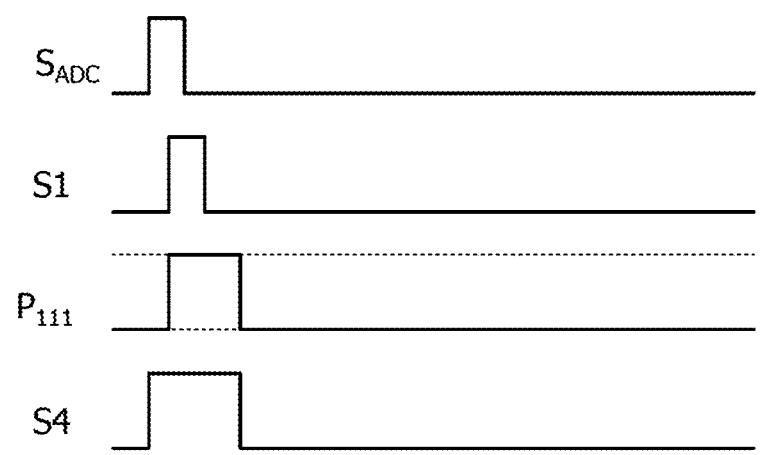
FIG. 22 is a timing chart of one embodiment of the present invention.

Alternatively, as shown in a timing chart in FIG. 22, the signal $S_{ADC}$ may be input to the timing controller 105, and the operation of the sensor element 110 may be started by the control signal S4. After that, the control signal S1 may be input to the sample-and-hold circuit 101 or the like. For simplification, only the signal $S_{ADC}$, the control signal S1, a control signal $P_{111}$, and the control signal S4 are shown in FIG. 22.

Although the control signal S1 has the same waveform as the signal $S_{ADC}$ in FIG. 21, the control signal S1 may have a different waveform as long as the circuit portion 402 operates normally. The operation of the sample-and-hold circuit 101 is started by the control signal S1. The analog potential Vin of 1.5 V input to the sample-and-hold circuit 101 from the sensor element 110 is amplified by the buffer circuit 111 and is supplied to the node ND by turning on the transistor 112, and then is held at the node ND as the analog potential of 1.5 V by turning off the transistor 112.

Although the control signal S2 has the same waveform as the clock signal CLK in FIG. 21, the control signal S2 may have a different waveform as long as the circuit portion 402 operates normally. The successive approximation register 103 is reset by the control signal S2. In addition, the digital-to-analog converter circuit 104 is reset by the control signals S1 and S2.

Although the control signal $S3_{value[1:0]}$ is set high until digital data of each bit is determined in FIG. 21, the control signal $S3_{value[1:0]}$ may have a different waveform as long as the circuit portion 402 operates normally. After digital data of each bit is determined by the control signal $S3_{value[1:0]}$, the on/off state of the transistor 112 is controlled so as to hold the digital data.

When the analog potential of 1.5 V is held at the node ND by turning off the transistor 112 with the control signal S1, power supply to the buffer circuit 111 of the sample-and-hold circuit 101 is stopped by the control signal $P_{111}$. Even when the power supply to the buffer circuit 111 is stopped, the analog potential can be held with power consumption reduced because the transistor 112 is off. It is preferable that the operation of the sensor element 110 also be stopped. For example, power supply to the sensor element 110 may be stopped. Even when the power supply to the sensor element 110 is stopped, the analog potential can be held with power consumption reduced because the transistor 112 is off. The operation of the sensor element 110 may be stopped by the control signal $P_{111}$. Alternatively, the operation of the sensor element 110 may be stopped by a signal that is not the control signal $P_{111}$, such as the control signal S4 shown in FIG. 21, for example.

The successive approximation register 103 is reset by the control signal S2, so that a first register and a second register included in the successive approximation register 103 are reset to "00". Alternatively, the first and second registers may be reset to "11".

The transistor 112 is turned on by the control signal $S3_{value\ [1:0]}$, so that digital data of each bit is supplied to the digital-to-analog converter circuit 104.

Next, the timing controller 105 sets digital data of the 1st-bit (i.e., the highest-order bit) in the second register of the successive approximation register 103 to "1" at the first leading edge of the clock signal CLK. In addition, by the control signal S2, the digital-to-analog converter circuit 104 converts the digital data "10" of the successive approximation register 103 into the analog potential DACout of 1.5 V and outputs the potential to the comparator 102. The comparator 102 compares 1.5 V that is the analog potential Vin held at the node ND and 1.5 V that is the analog potential DACout subjected to digital-to-analog conversion. The comparator 102 outputs a high-level signal cmpout when the analog potential Vin is higher than or equal to the analog potential DACout, and outputs a low-level signal cmpout when the analog potential Vin is lower than the analog potential DACout. Here, since the analog potentials that are 1.5 V are compared, the signal cmpout is a high-level signal. The signal cmpout is input to the successive approximation register 103.

Next, since the digital data of the 1st-bit that is the higher-order bit is set to "1", the timing controller 105 sets the control signal $S3_{value[1]}$ low at the first trailing edge of the clock signal CLK to turn off the transistor 112. This makes the 1st-bit digital data be held in the digital-to-analog converter circuit 104. In addition, the control signal $P_{value[1]}$ is set low, so that power supply to the second register of the successive approximation register 103 is stopped. Even when the power supply to the second register is stopped, the digital data can be held in the digital-to-analog converter circuit 104 with power consumption reduced because the transistor 112 is off.

Next, the timing controller 105 sets digital data of the 0th-bit (i.e., the lowest-order bit) in the first register of the successive approximation register 103 to "1" at the second leading edge of the clock signal CLK. In addition, by the control signal S2, the digital-to-analog converter circuit 104 converts the digital data "11" of the successive approximation register 103 into an analog potential of 2.0 V and outputs the potential to the comparator 102. The comparator 102 compares 1.5 V that is the analog potential Vin held at the node ND and 2.0 V that is the analog potential DACout subjected to digital-to-analog conversion. The comparator 102 outputs a high-level signal cmpout when the analog potential Vin is higher than or equal to the analog potential DACout, and outputs a low-level signal cmpout when the analog potential Vin is lower than the analog potential DACout. Here, since the analog potential Vin of 1.5 V and the analog potential DACout of 2.0 V are compared with each other, the signal cmpout is a low-level signal. The signal cmpout is input to the successive approximation register 103.

Next, since the digital data of the 0th-bit that is the lower-order bit is set to "0", the timing controller 105 sets the control signal $S3_{value[0]}$ low at the second trailing edge of the clock signal CLK to turn off the transistor 112. This makes the 0th-bit digital data be held in the digital-to-analog converter circuit 104. In addition, the control signal $P_{value[0]}$ is set low, so that power supply to the first register of the successive approximation register 103 is stopped. Even when the power supply to the first register is stopped, the digital data can be held in the digital-to-analog converter circuit 104 with power consumption reduced because the transistor 112 is off.

The timing controller 105 also sets the control signals $P_{Comp}$ and $P_{ADC}$ low at the second trailing edge of the clock signal CLK, so that power supply to the comparator 102 and the digital-to-analog converter circuit 104 is stopped. Even when the power supply to the comparator 102 and the digital-to-analog converter circuit 104 is stopped, the digital data can be held in the digital-to-analog converter circuit 104 with power consumption reduced because the transistor 112 is off.

In this way, the analog potential Vin of 1.5 V is converted into the 2-bit digital data "10".

Figure 23A:
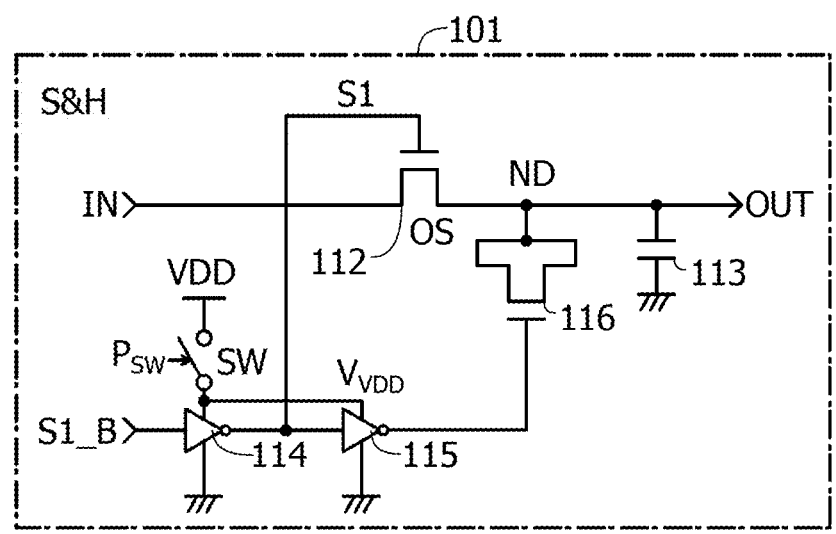
FIGS. 23A and 23B are a circuit diagram and a timing chart of one embodiment of the present invention.

FIG. 23A illustrates another structure example different from those of the sample-and-hold circuits illustrated in FIGS. 16A to 16C and the like. The sample-and-hold circuit 101 illustrated in FIG. 23A includes inverter circuits 114 and 115 and a MOS capacitor 116 in addition to the transistor 112 and the capacitor 113. By including the MOS capacitor 116, the sample-and-hold circuit 101 can suppress charge injection.

Like the buffer circuit 111 illustrated in FIG. 16C and the like, the inverter circuits 114 and 115 are connected to the switch SW, and whether to supply power is controlled by the control signal $P_{SW}$. A control signal S1_B whose logic is inverted from the logic of the control signal S1 is input to the inverter circuit 114, and the control signal S1 is supplied to the gate of the transistor 112 through the inverter circuit 114. To a gate of the MOS capacitor 116, a signal that is inverted from the control signal S1 through the inverter circuit 115 is supplied. A semiconductor layer of the MOS capacitor 116 is connected to the node ND.

Figure 23B:
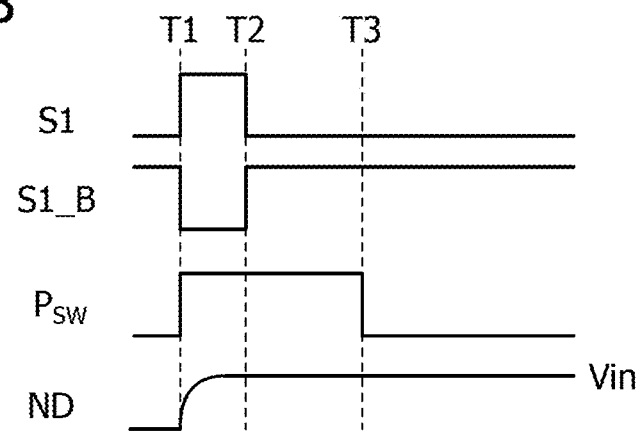

FIG. 23B is a timing chart illustrating an operation example of the sample-and-hold circuit in FIG. 23A.

First, the control signal $P_{SW}$ is set high at time T1, so that power is supplied to the inverter circuits 114 and 115. Conversely, if the control signal $P_{SW}$ is set low, power supply to the inverter circuits 114 and 115 will be stopped. The control signal S1 is set high, and the control signal S1_B is set low, so that the transistor 112 is turned on and the potential of the node ND is increased to the potential Vin, which is the potential of the input terminal IN.

At time T2, the control signal S1 is set low, and the control signal S1_B is set high, so that the transistor 112 is turned off. Accordingly, the potential Vin of the node ND is held.

Next, at time T3, the control signal $P_{SW}$ is set low. At this time, the control signal S1 is low, and the control signal S1_B is high, so that the potential Vin of the node ND is continuously held.

That is the operation example of the sample-and-hold circuit in FIG. 23A.

Figure 24:
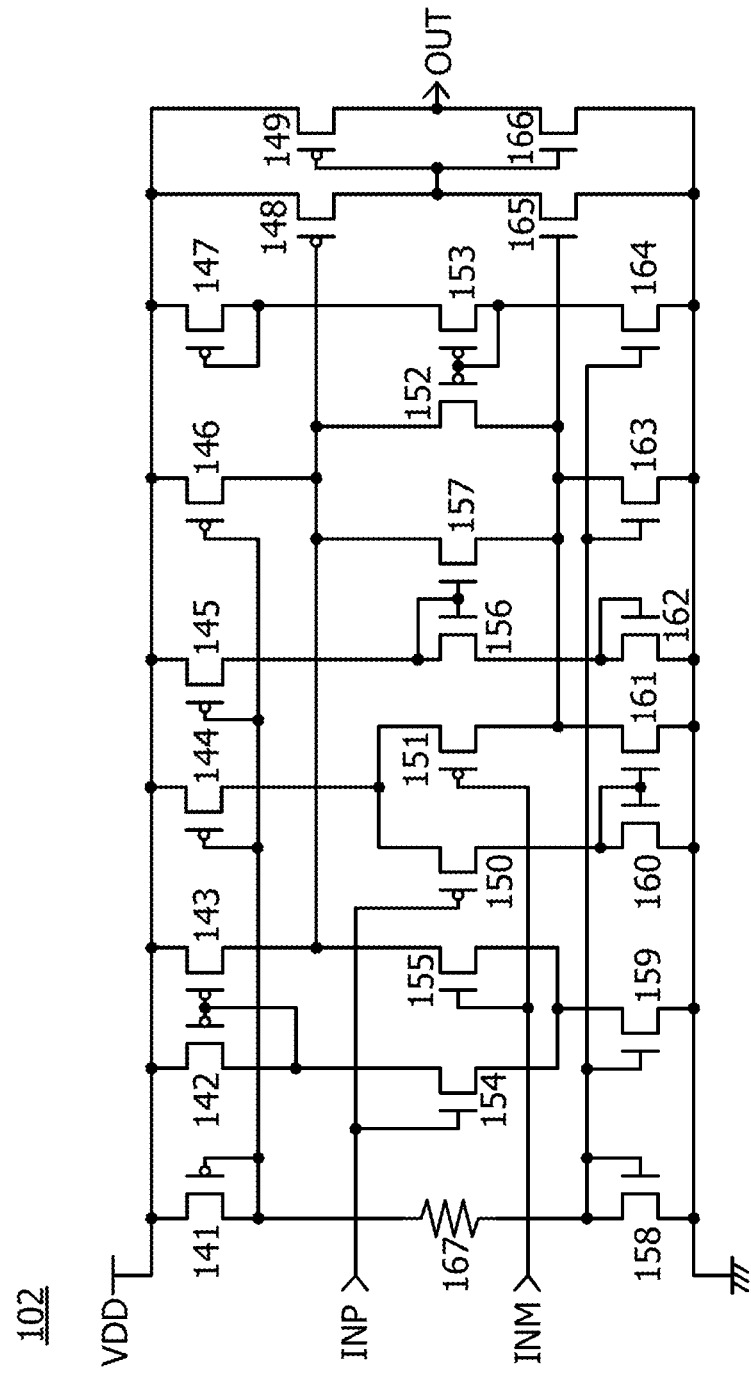
FIG. 24 is a circuit diagram illustrating one embodiment of the present invention.

FIG. 24 illustrates a circuit structure example of the comparator 102. The comparator 102 illustrated in FIG. 24 includes p-channel transistors 141 to 153, n-channel transistors 154 to 166, and a resistor 167. In FIG. 24, a terminal INP corresponds to a non-inverting input terminal, and a terminal INM corresponds to an inverting input terminal.

FIG. 25A illustrates a circuit structure example of the oscillator circuit 106. The oscillator circuit 106 illustrated in FIG. 25A includes p-channel transistors 171, inverter circuits 172, n-channel transistors 173, and a bias voltage generation circuit 174. In FIGS. 25A and 25B, a terminal BIASP corresponds to a terminal supplying a positive bias voltage, and a terminal BIASN corresponds to a terminal supplying a negative bias voltage.

FIG. 25B illustrates a circuit structure example of the bias voltage generation circuit 174 illustrated in FIG. 25A. The bias voltage generation circuit 174 in FIG. 25B includes p-channel transistors 176 to 181, n-channel transistors 183 to 188, a resistor 189, and capacitors 190 to 193.

Figure 26A:
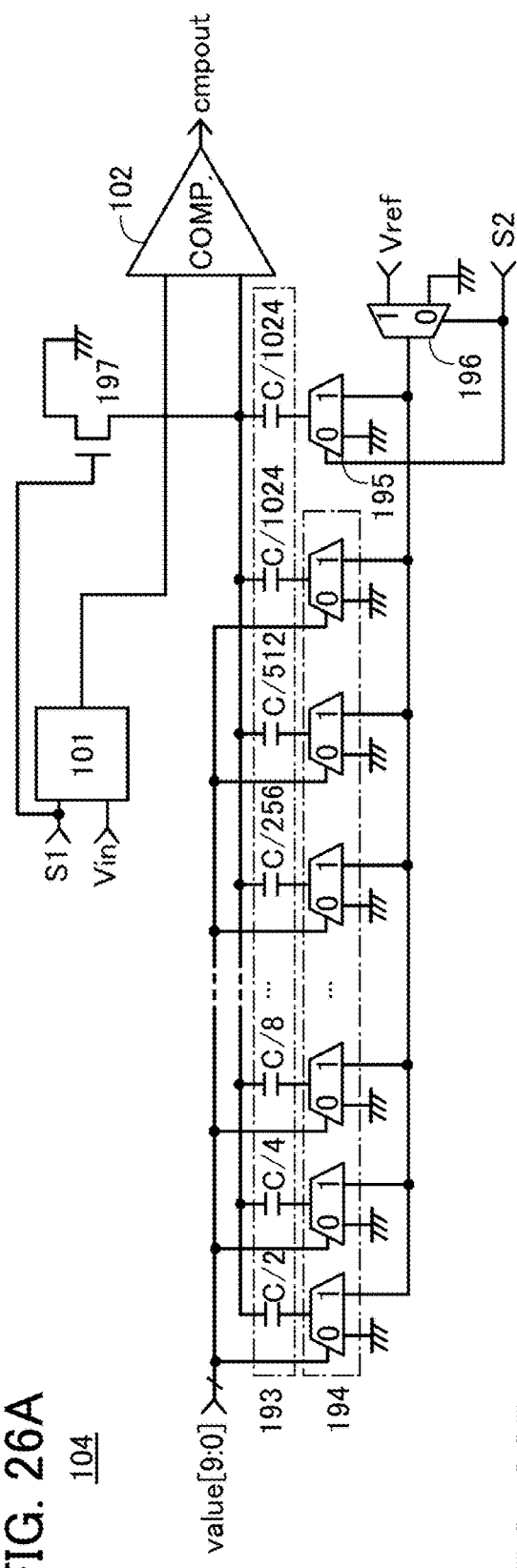
FIGS. 26A to 26C are circuit diagrams illustrating one embodiment of the present invention.

FIG. 26A illustrates a circuit structure example of the digital-to-analog converter circuit 104. Note that FIG. 26A illustrates a 10-bit C-DAC. In FIG. 26A, the sample-and-hold circuit 101 and the comparator 102 are also illustrated for description. The digital-to-analog converter circuit 104 illustrated in FIG. 26A includes capacitors 193, selectors 194, 195, and 196, and a transistor 197. The capacitor 193 has capacitance corresponding to the bit number. Examples of the capacitance are written beside the capacitors 193 in FIG. 26A. The selectors 194 and 195 are provided corresponding to the capacitors 193.

Figure 26C:
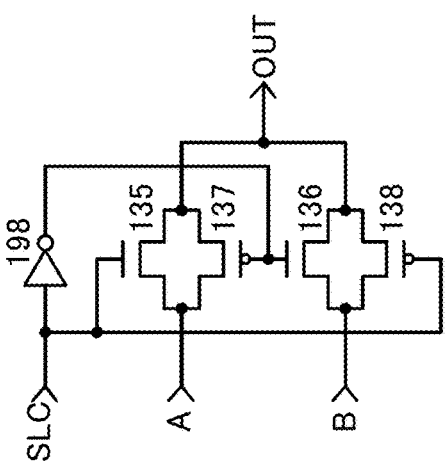
Figure 26B:
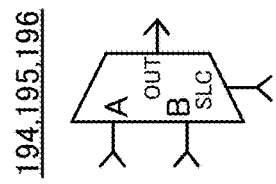

FIG. 26B illustrates a circuit structure example of the selectors 194, 195, and 196 in FIG. 26A. The control signal S2 is supplied to terminals SLC of the selectors 195 and 196. A potential selected by the selector 196 is supplied to terminals A of the selectors 194 and 195. A reference potential Vref is supplied to a terminal A of the selector 196. A ground potential is supplied to terminals B of the selectors 194, 195, and 196. Note that the reference potential Vref may be a potential generated by a constant voltage circuit or the like outside the circuit portion 402, or may be a potential generated inside the circuit portion 402 on the basis of a potential supplied from an external constant voltage circuit or the like.

FIG. 26C illustrates a more specific circuit structure example of the selectors in FIG. 26B. The selector illustrated in FIG. 26C includes an inverter circuit 198, n-channel transistors 135 and 136, and p-channel transistors 137 and 138.

The circuit portion 402 described above makes the sample-and-hold circuit 101 including a transistor with an extremely low off-state current hold the analog potential Vin obtained by the sensor or the like. In the sample-and-hold circuit 101, the node ND that can hold charge by turning off the transistor 112 holds the analog potential Vin. In one embodiment of the present invention, power consumption can be reduced by stopping power supply to the buffer circuit 111 included in the sample-and-hold circuit 101 or the like.

In the circuit portion 402, power consumption can be reduced without suppressing the drive voltage or the frequency of the clock signal, so that it is possible to avoid a decrease in performance of the analog-to-digital converter circuit, such as the resolution or sampling rate. In the circuit portion 402, the analog data can be held without the use of a flash memory or the like, so that power consumption can be reduced without providing a dedicated high-voltage generation circuit or a dedicated periphery circuit.

The digital-to-analog converter circuit 104 may also include a transistor 211 and a capacitor 212 for holding digital data.

Figure 27:
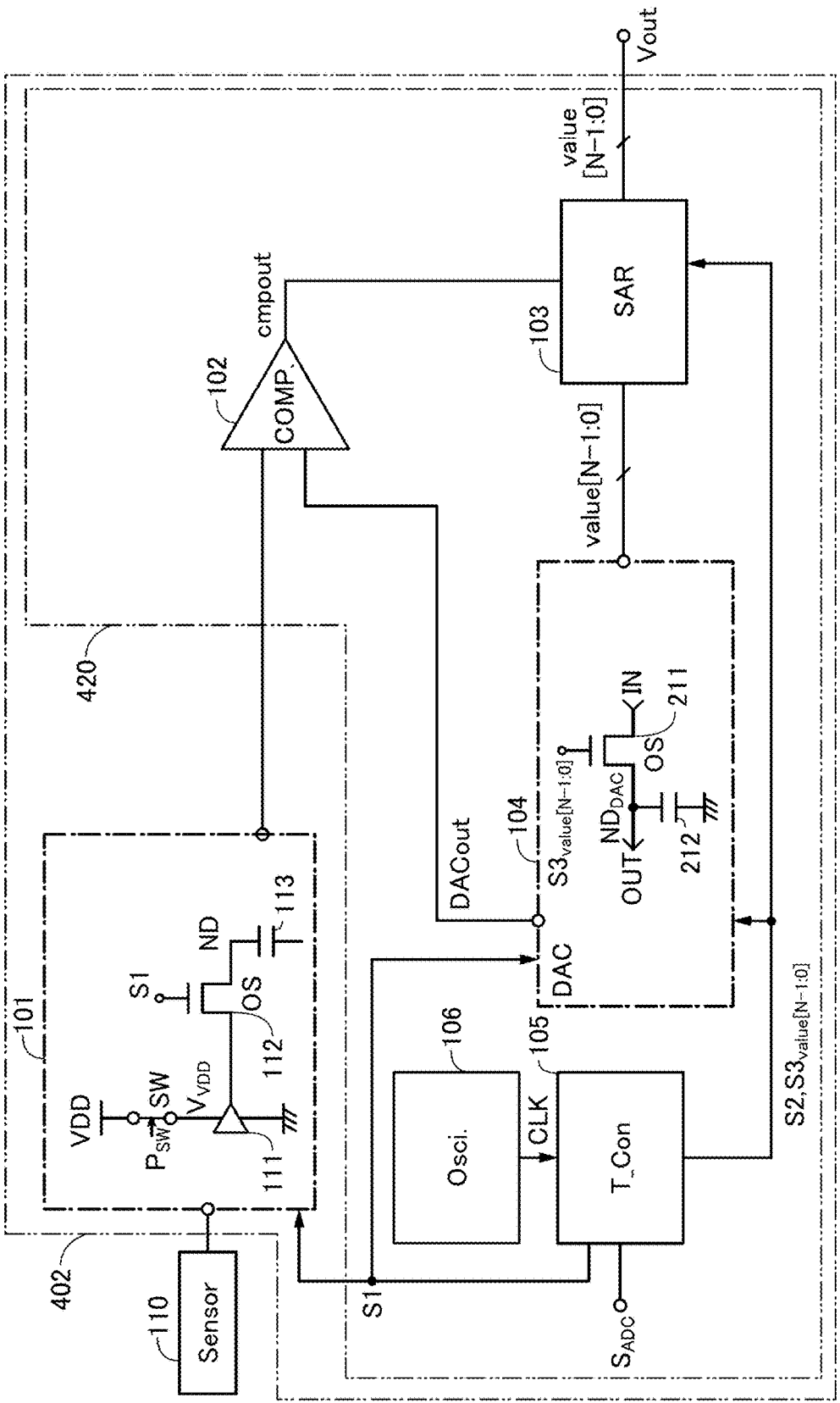
FIG. 27 is a block diagram illustrating one embodiment of the present invention.

The circuit portion 402 illustrated in FIG. 27 includes the sample-and-hold circuit 101 and the analog-to-digital converter circuit 420. The analog-to-digital converter circuit 420 includes the successive approximation register 103, the digital-to-analog converter circuit 104, the timing controller 105, and the oscillator circuit 106.

The circuit portion 402 illustrated in FIG. 27 is different from that illustrated in FIG. 19 in that the digital-to-analog converter circuit 104 includes the transistor 211 and the capacitor 212 for holding digital data. A gate of the transistor 211 is supplied with the control signal $S3_{value[N-1:0]}$ for controlling the on/off state in accordance with each bit from the timing controller 105.

When the transistor 211 is turned off, charge corresponding to the potential of digital data is held at a node $ND_{DAC}$. In this way, the transistor 211 and the capacitor 212 hold the digital data. Like the transistor 112, the transistor 211 is a transistor with an extremely low off-state current flowing between a source and a drain, and is preferably an OS transistor.

Figure 28:
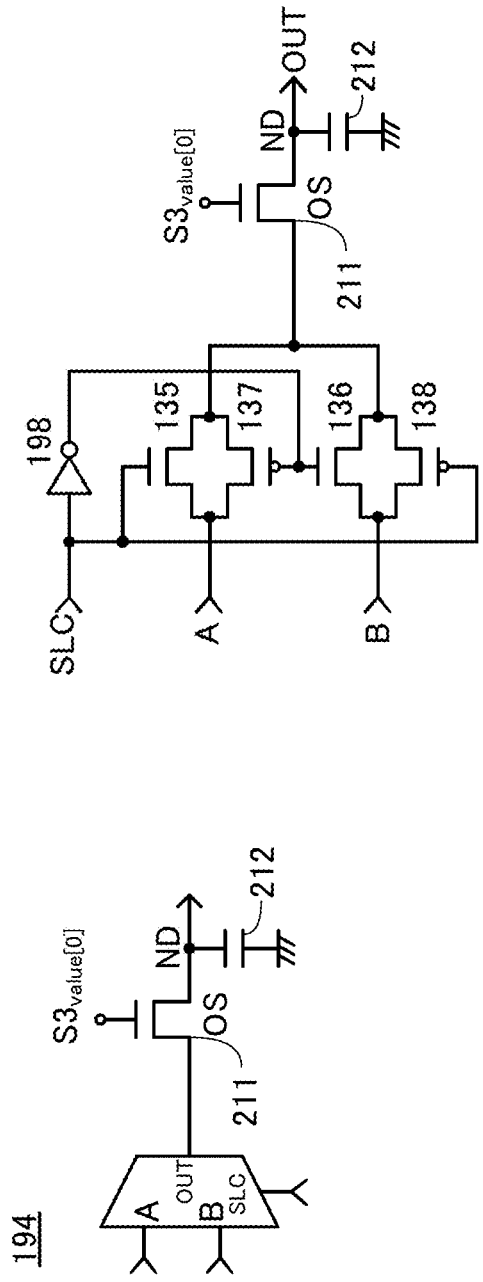
FIGS. 28A and 28B are circuit diagrams illustrating one embodiment of the present invention.

In the case where the digital data is held in the digital-to-analog converter circuit 104, the transistor 211 and the capacitor 212 may be added to the selector 194 in FIGS. 26A to 26C. FIGS. 28A and 28B illustrate an example of a circuit diagram in which the transistor 211 and the capacitor 212 are added to the selector 194 in FIGS. 26B and 26C. In the example illustrated in FIGS. 28A and 28B, as the control signal $S3_{value[N-1:0]}$, a control signal $S3_{value[0]}$ of the 0th bit is supplied to the gate of the transistor 211.

With the structure in FIG. 27, power consumption can be reduced by stopping power supply to the sample-and-hold circuit 101, the comparator 102, the successive approximation register 103, and the digital-to-analog converter circuit 104. Specifically, when the analog potential Vin is held in the sample-and-hold circuit 101, power supply to the buffer circuit 111 can be stopped. In addition, every time digital data of a certain bit is determined in the digital-to-analog converter circuit 104, power supply to the corresponding register in the successive approximation register 103 can be stopped. Furthermore, power supply to the comparator 102 and the digital-to-analog converter circuit 104 can be stopped.

In addition, by providing a backup circuit in which an OS transistor and a capacitor are connected to a flip-flop of a logic circuit such as a control circuit, power supply to a block which is not needed to operate can be stopped while the state of the block is being kept. Accordingly, the logic circuit can be operated with lower power consumption.

(Embodiment 3)
<Structure Example of Memory Circuit>

A structure example of the above-mentioned memory circuit 409 will be described with the use of specific examples. Note that the memory circuit 409 has a circuit structure in which a memory element is formed with the use of an OS transistor (the memory element is also referred to as an OS memory).

Figure 29:
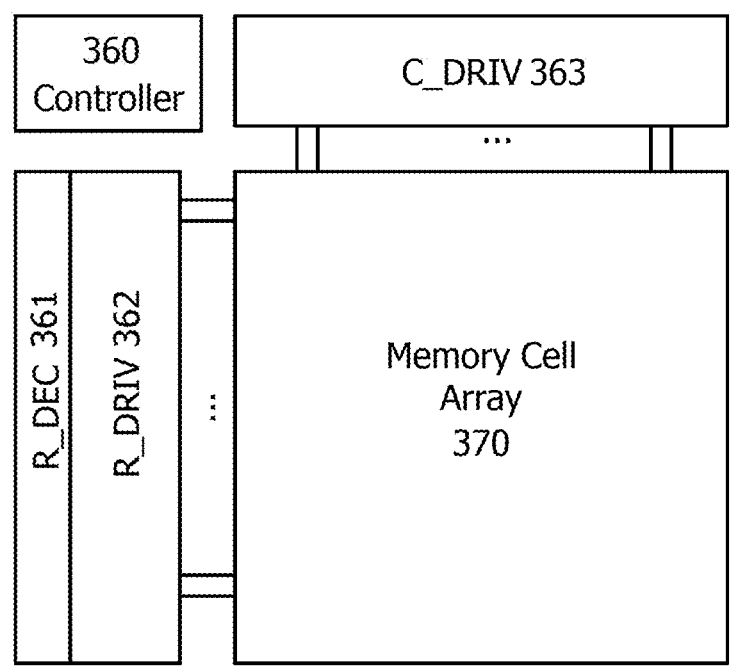
FIG. 29 is a block diagram illustrating one embodiment of the present invention.

FIG. 29 is a block diagram illustrating a structure example of the memory circuit 409. The memory circuit 409 includes a controller 360, a row decoder circuit 361, a row driver circuit 362, a column driver circuit 363, and a memory cell array 370.

The controller 360 is a control circuit for the memory circuit 409 and is capable of generating control signals for controlling the row decoder circuit 361, the row driver circuit 362, and the column driver circuit 363 in accordance with access requirement by a logic portion. The row decoder circuit 361, the row driver circuit 362, and the column driver circuit 363 are capable of generating driving signals for driving the memory cell array 370 in accordance with the control signals from the controller 360.

Figure 30:
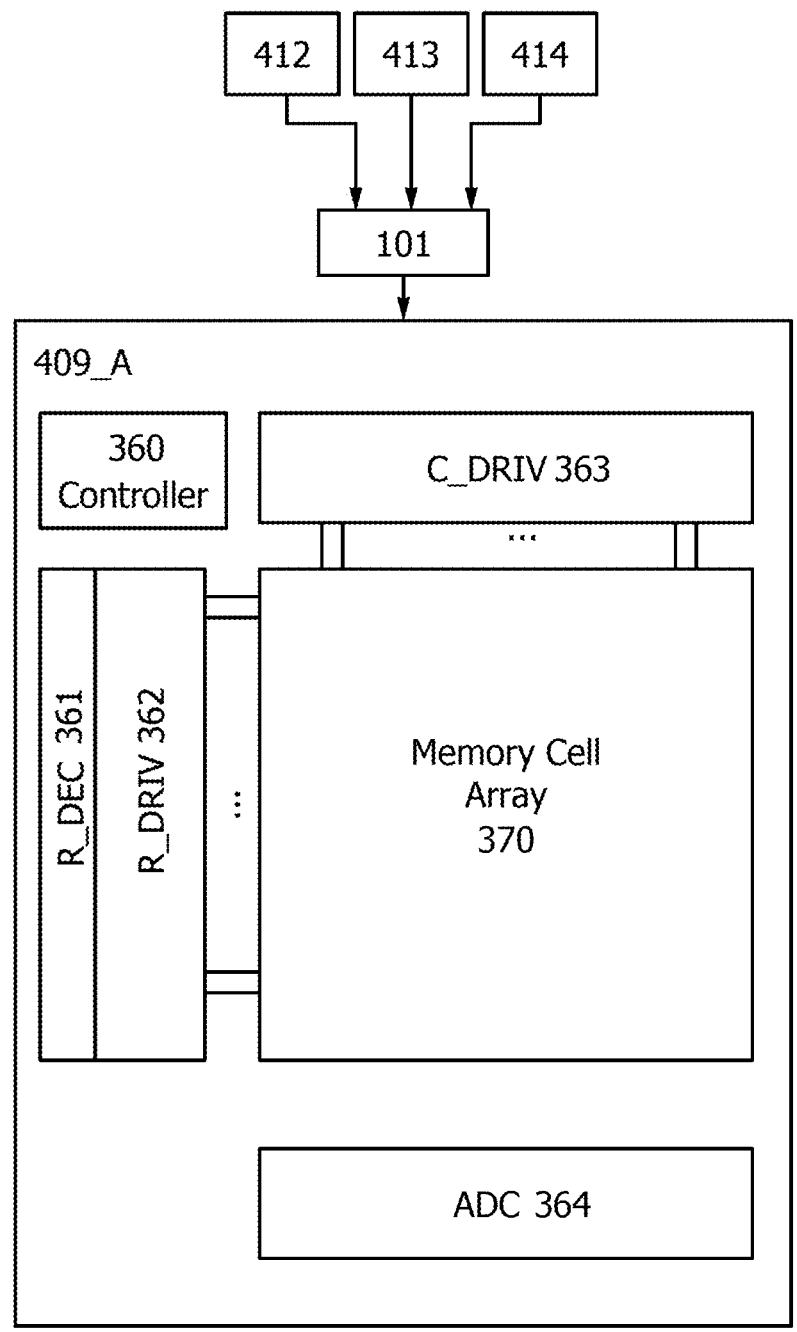
FIG. 30 is a block diagram illustrating one embodiment of the present invention.

When multivalued data is stored in the memory cell array 370, a structure illustrated as a memory cell 409_A in FIG. 30 in which an analog-to-digital converter circuit 364 is provided may be employed. For example, as illustrated in FIG. 30, analog data output from the sensor elements 412 to 414 may be held in the sample-and-hold circuit 101 and then input to the memory circuit 409_A. The analog data input to the memory circuit 409_A may be converted into digital data by the analog-to-digital converter circuit 364. The analog-to-digital converter circuit 364 may be a flash type, a delta-sigma type, a pipeline type, an integration type, or a successive approximation type. In the case of a successive approximation analog-to-digital converter circuit, the analog-to-digital converter circuit described in the above embodiment is favorably used.

Figure 31:
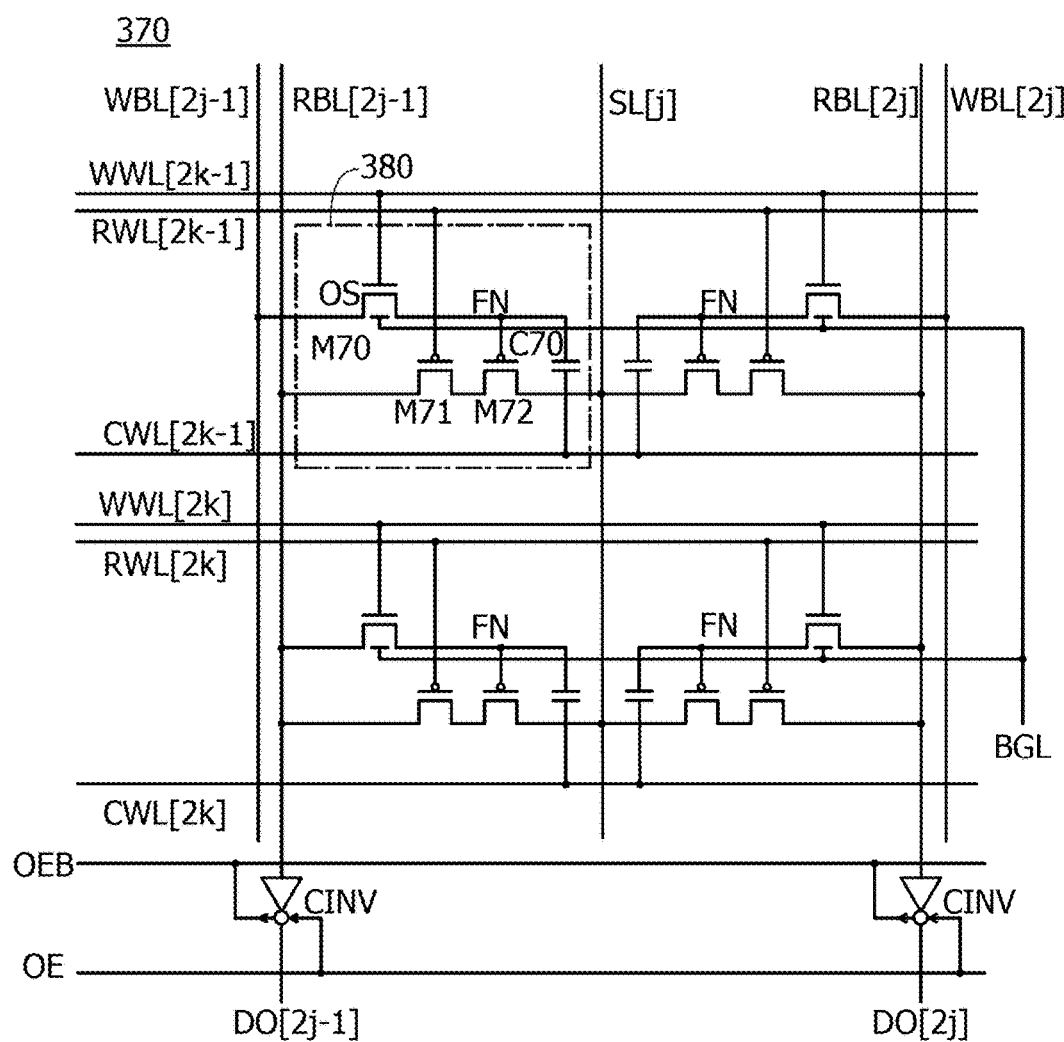
FIG. 31 is a circuit diagram illustrating one embodiment of the present invention.

The memory cell array 370 is a circuit in which a plurality of memory cells are arranged in an array. FIG. 31 is a circuit diagram illustrating a structure example of the memory cell array 370. FIG. 31 typically illustrates four memory cells 380 in [2j−1, 2k−1] to [2j, 2k] (j and k are integers of 1 or more).

The memory cells 380 each include transistors M70 to M72 and a capacitor C70. Here, the transistor M70 is an n-channel OS transistor. In addition, the transistors M71 and M72 are p-channel Si transistors. A node FN is a data storage portion of the memory cell array 370 that holds data as charge; in this example, the node FN is a gate of the transistor M72.

Figure 32:
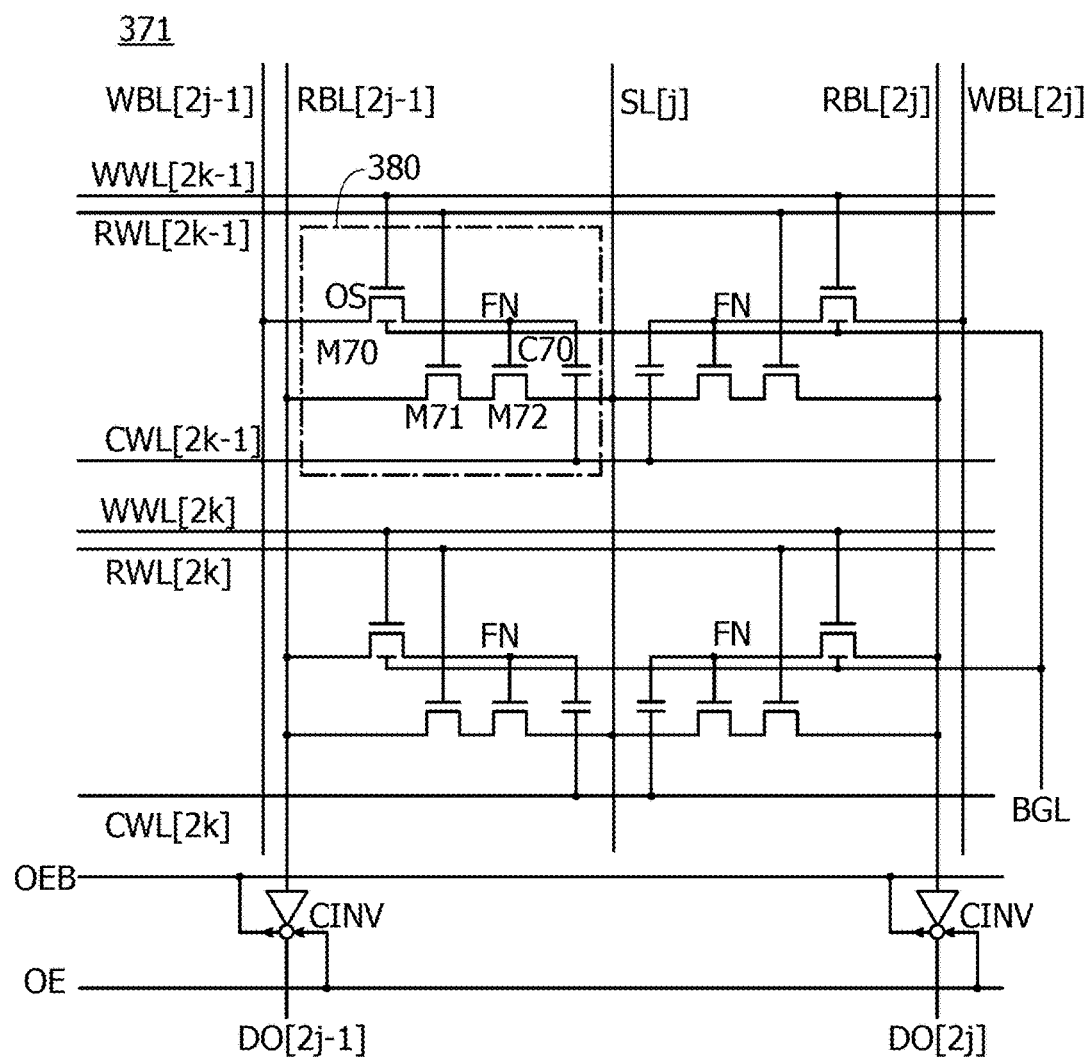
FIG. 32 is a circuit diagram illustrating one embodiment of the present invention.

The transistors M71 and M72 may also be n-channel transistors. An example of a circuit diagram of the memory cell array in that case is illustrated in FIG. 32. When the transistors M71 and M72 are n-channel transistors, a wiring CWL connected to the capacitor C70 can be omitted, and a wiring SL can be connected to the capacitor C70. Since the wiring CWL can be omitted, the circuit area can be reduced.

The memory cell array 370 is provided with wirings (WWL, RWL, CWL, SL, WBL, RBL) in accordance with the arrangement of the memory cells 380. The memory cells 380 are connected to these wirings in the corresponding rows and columns. Moreover, a wiring BGL is provided as a common wiring in the memory cell array 370. A back gate of the transistor M70 in each memory cell 380 is connected to the wiring BGL.

The wirings WWL and RWL function as a writing word line and a reading word line, respectively, and are both connected to the row driver circuit 362. The wiring CWL is capable of supplying a voltage to be applied to the capacitor C70.

The wiring SL functions as a source line and is provided in every other column. The wiring WBL functions as a writing bit line and is a wiring to which memory data to be written to the memory cells 380 is supplied from the column driver circuit 363. The wiring RBL functions as a reading bit line and is a wiring to which memory data read out from the memory cells 380 is output. The wirings SL, WBL, and RBL are connected to the column driver circuit 363.

A clocked inverter CINV is connected to an output of the wiring RBL because the voltage level (high/low) of a signal read from the wiring RBL is opposite from the voltage level of written data. In the example illustrated in FIG. 31, the voltage of the wiring RBL is high when the voltage of written data is low, while the voltage of the wiring RBL is low when the voltage of written data is high. Wirings OE and OEB are wirings that supply a signal for controlling an output signal of the clocked inverter CINV. The output signal of the clocked inverter CINV (memory data) is output from a wiring DO.

The capacitor C70 functions as a capacitor for holding charge of the node FN. One terminal of the capacitor C70 is connected to the node FN, and the other terminal of the capacitor C70 is connected to the wiring CWL. The wiring CWL is connected to the row driver circuit 362. Note that in the case where charge of the node FN can be held by a capacitor between wirings of the memory cell 380, the capacitor C70 and the wiring CWL are not necessarily provided.

By turning on the transistor M70, a voltage corresponding to the data value ("0", "1") is applied to the node FN. In addition, by turning off the transistor M70, the node FN is brought into an electrically floating state, and the memory cell 380 is brought into a data holding state. Since the transistor M70 is an OS transistor, the leakage current flowing between a source and a drain of the transistor M70 in an off state is extremely low. Therefore, the memory cell 380 can hold data for a period of years (e.g., 10 years, approximately) without refresh operation; thus, the memory cell 380 can be used as a nonvolatile memory cell. Moreover, since Vth of the transistor M70 is shifted in the positive direction by applying VBG to the back gate, a voltage lower than Vth can be more certainly applied to the gate of the transistor M70 in the data holding state; accordingly, the memory cell 380 with little data holding errors can be obtained.

Accordingly, data can be held in the memory circuit 409 even in the state where the semiconductor device 400 does not receive a radio wave. The operation of the memory cell array 370 (the memory circuit 409) is described below in more detail with reference to FIG. 33.

Note that in a memory circuit that utilizes an extremely low off-state current of an OS transistor, a predetermined voltage might keep being supplied to the transistor in a period for holding data. For example, a voltage that turns off the transistor completely might keep being supplied to a gate of the transistor. Alternatively, a voltage that shifts the threshold voltage of the transistor to make the transistor in a normally-off state may keep being supplied to a back gate of the transistor. In these cases, the voltage is supplied to the memory circuit in the period for holding data. However, because almost no current flows, little power is consumed. Because of little power consumption, the memory circuit can be regarded as being substantially nonvolatile even if a predetermined voltage is supplied to the memory circuit.

Figure 33:
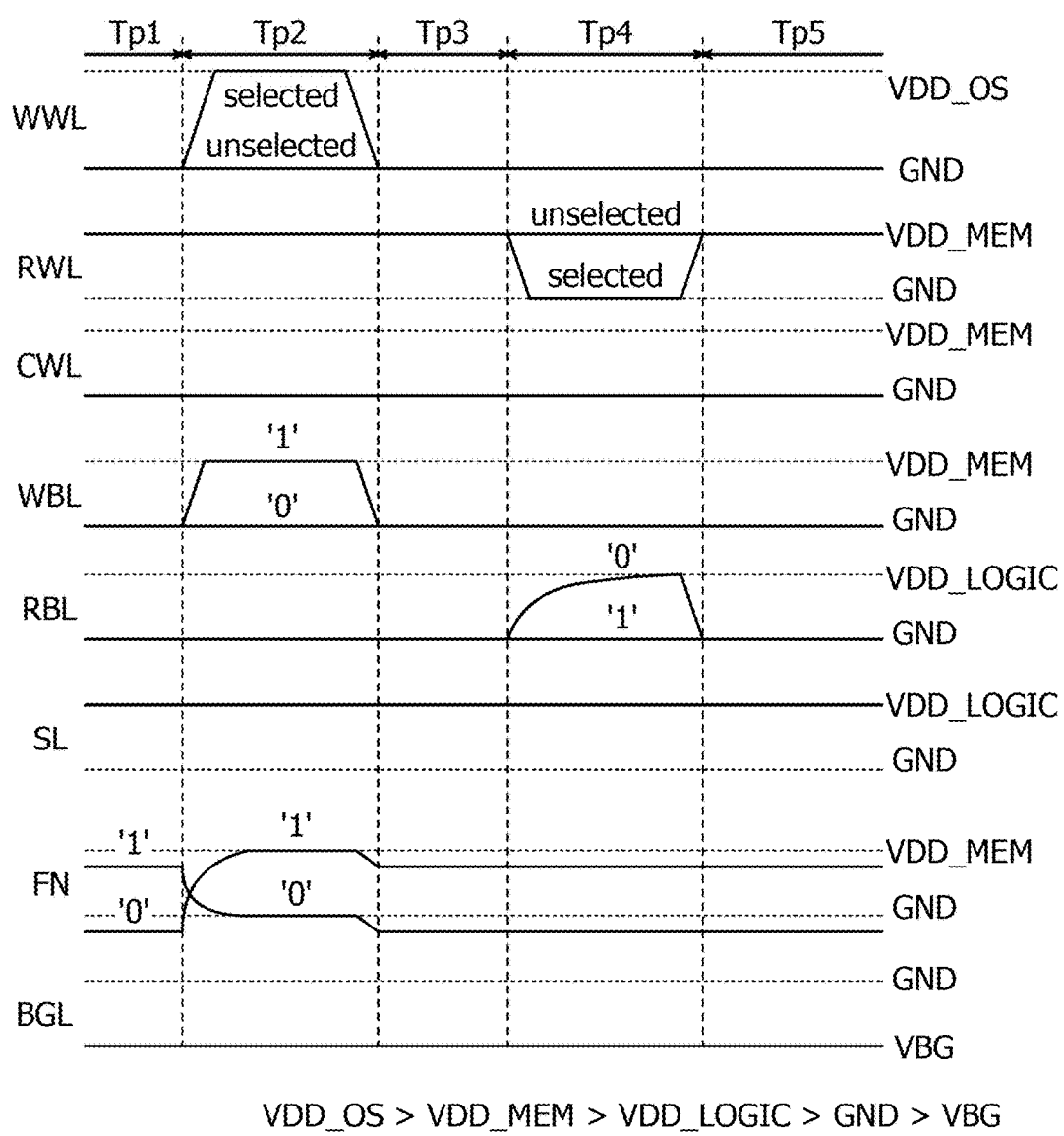
FIG. 33 is a timing chart of one embodiment of the present invention.

FIG. 33 is a timing chart showing an operation example of the memory cell array 370 (memory circuit 409). Specifically, FIG. 33 shows waveforms of signals that are input to the memory cell array 370 and the voltages (high level ("H")/low level ("L")) of wirings and nodes included in the memory cell array 370. In this example, a constant voltage is applied to the wirings CWL, SL, and BGL.

In a period Tp1, the memory circuit 409 is in a stand-by state (Stdby). The stand-by state refers to the state where VIN is generated in the semiconductor device 400; in this state, the memory circuit 409 is in a data holding state. The wirings WWL, WBL, and RBL are set low, and the wiring RWL is set high. In the case where "1" is written to the memory cell 380, the voltage of the node FN is "H", while in the case where "0" is written to the memory cell 380, the voltage of the node FN is "L".

A period Tp2 is a writing operation period. The wiring WWL in a row to which data is written is set at "H", whereby the transistor M70 is turned on, so that the node FN and the wiring WBL are connected to each other. In the case of writing "1", the wiring WBL is set at "H"; accordingly, the node FN is also set at "H". In contrast, in the case of writing "0", the wiring WBL is set at "L"; accordingly, the node FN is also set at "L". By setting the wiring WWL at "L" to turn off the transistor M70, the data writing operation is terminated, and the memory cell 380 is brought into a stand-by state.

In a period Tp3 (stand-by period), the transistor M70 is changed from an on state to an off state, which makes the voltage of the node FN decrease by the threshold voltage of the transistor M70. As described above, because Vth of the transistor M70 is shifted in the positive direction by applying a negative voltage VBG to a back gate, the leakage current of the transistor M70 is extremely low. Therefore, the voltage that is recognized as the data "1" can be held at the node FN for a period of years (e.g., 10 years, approximately).

A period Tp4 is a reading operation period. The wiring RWL in a row from which data is read is set at "L", thereby turning on the transistor M71 in the row. The wirings RWL in the other rows remain at "H". In the case where "1" is stored in the memory cell 380, the transistor M72 is in an off state, and thus, the wiring RBL remains at "L". In the case where "0" is stored, the transistor M72 is also in an on state, so that the transistors M71 and M72 connect the wiring RBL to the wiring SL; accordingly, the voltage level of the wiring RBL becomes "H". The voltage level of a signal read to the wiring RBL is inverted by the inverter CINV, and the signal is output to the wiring DO.

In a period Tp5, the memory circuit 409 is in a stand-by state, in which the voltage levels of the node FN and the wirings are the same as those in the period Tp1.

Figure 34:
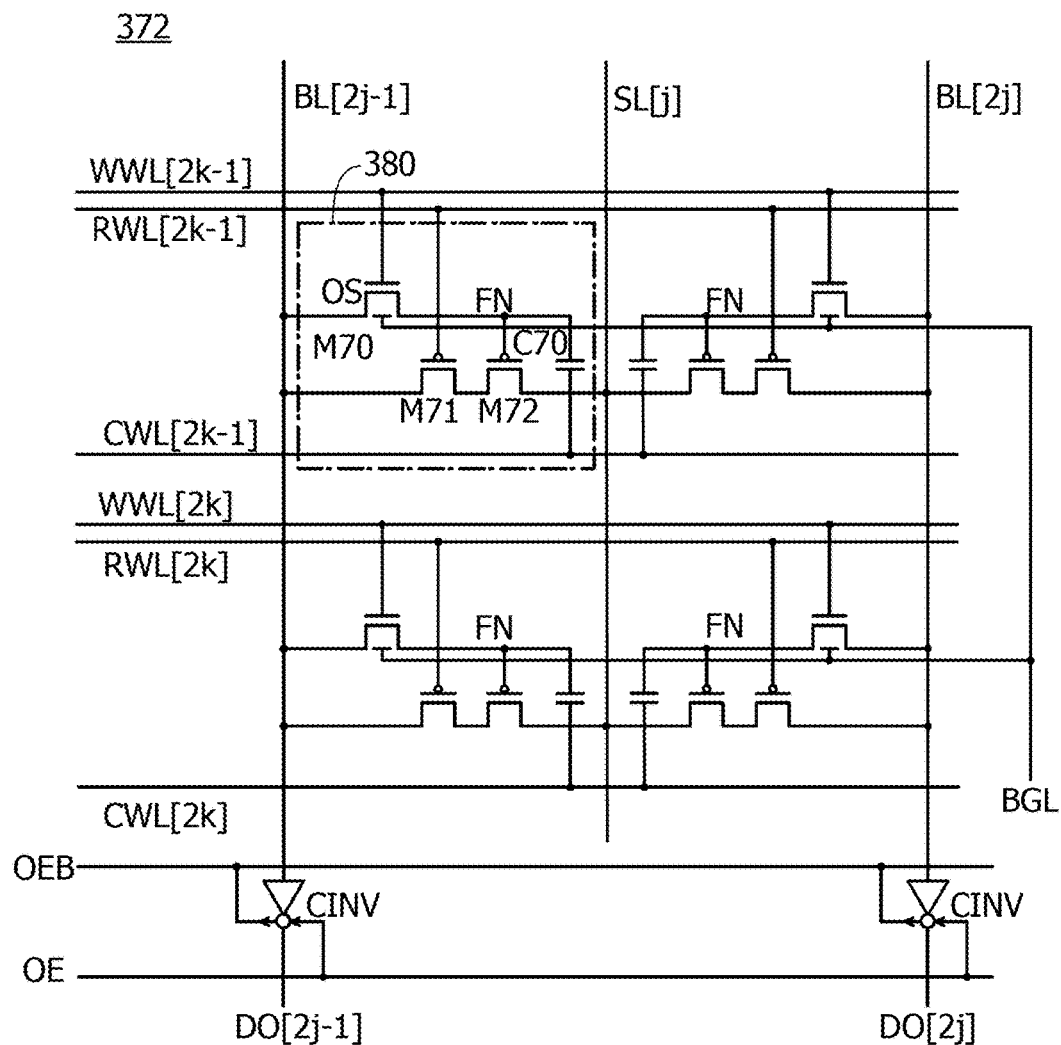
FIG. 34 is a circuit diagram illustrating one embodiment of the present invention.

FIG. 34 illustrates another structure example of the memory cell array. A memory cell array 372 illustrated in FIG. 34 is a modified example of the memory cell array 370. The memory cell array 372 is different from the memory cell array 370 in having a wiring BL serving as both the wiring WBL and the wiring RBL. That is, in the example illustrated in FIG. 31, two kinds of bit lines which are for writing and for reading are provided, while in the example illustrated in FIG. 34, one kind of bit line is provided.

Figure 35:
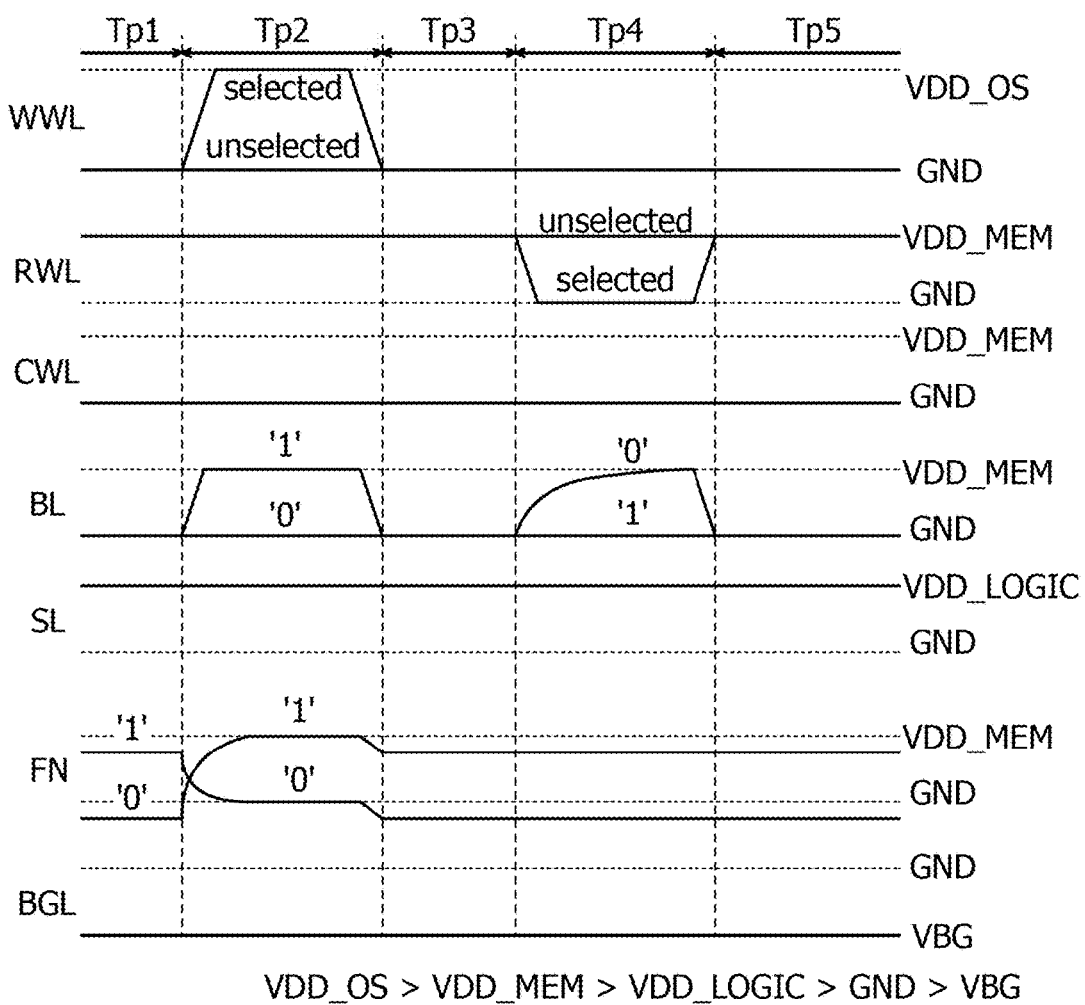
FIG. 35 is a timing chart of one embodiment of the present invention.

FIG. 35 is a timing chart showing an operation example of the memory cell array 372. As shown in FIG. 35, the memory cell array 372 can be driven in a manner similar to that of the memory cell array 370. The wiring BL has both functions of the wirings WBL and RBL. In the writing operation period (Tp2), in the case of writing "1" to the memory cell 380, the wiring BL is set at "H"; while in the case of writing "0", the wiring BL is set at "L". In the reading operation period (Tp4), in the case where "1" is stored in the memory cell 380, the transistor M72 is in an off state, and thus, the wiring BL remains at "L". In the case where "0" is stored, the transistor M72 is also in an on state, so that the transistors M71 and M72 connect the wiring BL to the wiring SL; accordingly, the voltage level of the wiring BL becomes "H". The logic value of a signal read to the wiring BL is inverted by the clocked inverter CINV, and the signal is output to the wiring DO.

(Embodiment 4)

In this embodiment, an example of a cross-sectional structure of a semiconductor device will be described with reference to FIG. 36. In the example of this embodiment, an OS transistor is stacked over a circuit formed with a transistor including silicon (a Si transistor).

Figure 36:
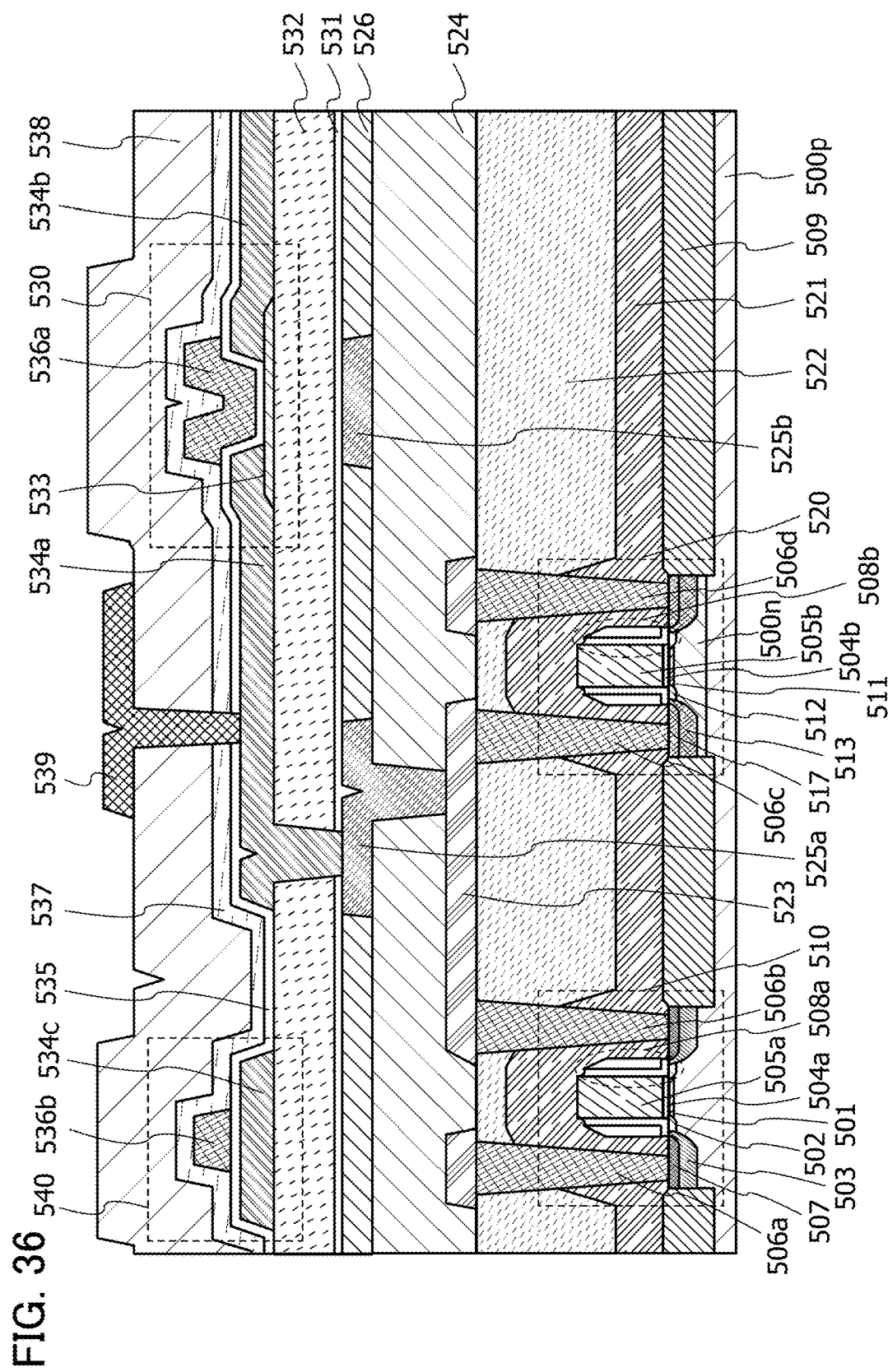
FIG. 36 is a cross-sectional view illustrating one embodiment of the present invention.

FIG. 36 illustrates the cross section of part of a semiconductor device. The semiconductor device illustrated in FIG. 36 includes an n-channel transistor and a p-channel transistor each including a first semiconductor material (e.g., silicon) in a lower portion, and a transistor including a second semiconductor material (e.g., an oxide semiconductor) and a capacitor in an upper portion.

<Structures of Transistors in Lower Portion>

An n-channel transistor 510 includes a channel formation region 501 provided in a p-type well 500p, low-concentration impurity regions 502 and high-concentration impurity regions 503 (collectively simply referred to as impurity regions in some cases) with the channel formation region 501 provided between the impurity regions, conductive regions 507 provided in contact with the impurity regions, a gate insulating film 504a provided over the channel formation region 501, a gate electrode 505a provided over the gate insulating film 504a, and a source electrode 506a and a drain electrode 506b provided in contact with the conductive regions 507. A sidewall insulating film 508a is provided on a side surface of the gate electrode 505a. An interlayer insulating film 521 and an interlayer insulating film 522 are provided so as to cover the transistor 510. The source electrode 506a and the drain electrode 506b are connected to the conductive regions 507 through openings formed in the interlayer insulating films 521 and 522. The conductive regions 507 can be formed using metal silicide or the like.

A p-channel transistor 520 includes a channel formation region 511 provided in an n-type well 500n, low-concentration impurity regions 512 and high-concentration impurity regions 513 (collectively simply referred to as impurity regions in some cases) with the channel formation region 511 provided between the impurity regions, conductive regions 517 provided in contact with the impurity regions, a gate insulating film 504b provided over the channel formation region 511, a gate electrode 505b provided over the gate insulating film 504b, and a source electrode 506c and a drain electrode 506d provided in contact with the conductive regions 517. A sidewall insulating film 508b is provided on a side surface of the gate electrode 505b. The interlayer insulating films 521 and 522 are provided so as to cover the transistor 520. The source electrode 506c and the drain electrode 506d are connected to the conductive regions 517 through openings formed in the interlayer insulating films 521 and 522.

Furthermore, an element separation insulating film 509 is provided so as to surround the transistors 510 and 520.

Although FIG. 36 illustrates the case where a triple-well structure is employed, a double-well structure, a twin-well structure, or a single-well structure may alternatively be employed. Although the case where the channels of the transistors 510 and 520 are formed in the p-type well 500p and the n-type well 500n formed in a substrate, respectively, is illustrated in FIG. 36, the channels of the transistors 510 and 520 may also be formed in an amorphous semiconductor film or a polycrystalline semiconductor film formed over an insulating surface. Alternatively, the channels of the transistors may be formed in a single crystal semiconductor film, as in the case of using an SOI substrate.

When the transistors 510 and 520 are formed using a single crystal semiconductor substrate, the transistors 510 and 520 can operate at high speed, and the thresholds can be precisely controlled. Therefore, for example, part or all of the sample-and-hold circuit, comparator, successive approximation register, analog-to-digital converter circuit, timing controller, and oscillator circuit in the circuit described in the above embodiment are preferably formed using a single crystal semiconductor substrate.

The transistors 510 and 520 are connected to each other through a wiring 523, and an insulating film 524 is provided over the wiring 523. Furthermore, conductive layers 525a and 525b and an insulating film 526 are provided over the insulating film 524. The insulating film 526 is preferably formed in such a manner that after the conductive layers 525a and 525b are formed over the insulating film 524, the insulating film 526 is formed over the conductive layers 525a and 525b and then the insulating film 526 is subjected to polishing treatment until upper surfaces of the conductive layers 525a and 525b are exposed.

<Structure of Transistor in Upper Portion>

A transistor 530 in an upper portion is an OS transistor. The transistor 530 includes the conductive layer 525a provided over the insulating film 524, an insulating film 531 and an insulating film 532 provided over the conductive layer 525a, a semiconductor film 533 provided over the insulating film 532, a source electrode 534a and a drain electrode 534b provided in contact with the semiconductor film 533, a gate insulating film 535 provided over the semiconductor film 533, the source electrode 534a, and the drain electrode 534b, and a gate electrode 536a provided over the gate insulating film 535. Note that the conductive layer 525b serves as a gate electrode.

FIG. 36 illustrates the case where upper and lower two gate electrodes are provided with the semiconductor film provided therebetween. Both the gate electrodes may be supplied with a signal for controlling whether to turn on or off the transistor, or only one of the gate electrodes may be supplied with a fixed potential such as a ground potential. The level of the fixed potential is controlled, so that the threshold of the transistor can be controlled.

A conductive layer 534c is provided over the insulating film 532, the gate insulating film 535 is provided over the conductive layer 534c, and a conductive layer 536b is provided over the gate insulating film 535. The conductive layer 534c, the gate insulating film 535, and the conductive layer 536b form a capacitor 540.

Furthermore, an interlayer insulating film 537 and an interlayer insulating film 538 are provided so as to cover the transistor 530 and the capacitor 540. The source electrode 534a is connected to a wiring 539 through an opening formed in the interlayer insulating films 537 and 538.

An oxide semiconductor is used for the semiconductor film 533. The oxide semiconductor will be described in detail in an embodiment below.

The insulating film 532 can have a function of supplying oxygen to the semiconductor film 533 formed using an oxide semiconductor. For this reason, the insulating film 532 is preferably an insulating film containing oxygen; more preferably, the insulating film 532 is an insulating film containing oxygen in which the oxygen content is higher than that in the stoichiometric composition. The insulating film 532 also serves as an interlayer insulating film. In that case, since the insulating film 532 has an uneven surface, the insulating film 532 is preferably subjected to planarization treatment such as chemical mechanical polishing (CMP) treatment so as to have a flat surface.

The gate insulating film 535 can be formed of an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, hafnium oxide, aluminum oxide, aluminum silicate, neodymium oxide, and tantalum oxide. In the case where a material of the gate insulating film 535 has a high relative dielectric constant, the gate insulating film 535 can be formed thick. For example, in the case of using hafnium oxide with a relative dielectric constant of 16, the gate insulating film 535 can be formed approximately four times as thick as the gate insulating film 535 using silicon oxide with a relative dielectric constant of 3.9. Thus, the leakage current flowing through the gate insulating film 535 can be suppressed.

For example, part of the gate insulating film 535 may be formed of a material having a lot of electron trap states, such as hafnium oxide, aluminum oxide, tantalum oxide, or silicon nitride, as in the case of the gate insulating film 535 including a stack of silicon oxide and hafnium oxide, or a floating gate is used, and the state where the potential of the gate electrode 536a is higher than that of the source electrode 534a or the drain electrode 534b may be maintained for one second or longer, typically one minute or longer, at a higher temperature (a temperature of higher than the operating temperature or the storage temperature of the semiconductor device, or a temperature of higher than or equal to 125° C. and lower than or equal to 450° C., typically a temperature of higher than or equal to 150° C. and lower than or equal to 300° C.).

Thus, electrons transfer from the semiconductor film 533 to the gate electrode 536a, and some of the electrons are trapped by the electron trap states. In the transistor in which necessary electrons are trapped by the electron trap states in this manner, the threshold shifts in the positive direction. By controlling the voltage of the gate electrode 536a, the amount of electrons to be trapped can be controlled, and thus, the threshold can be controlled. Furthermore, the treatment for trapping the electrons may be performed in the manufacturing process of the transistor.

For example, the treatment for trapping the electrons may be performed at any of the following timings before leaving the factory: after pre-process (wafer process), after wafer dicing, and after packaging. In either case, it is preferable that the semiconductor device be not exposed to temperatures of higher than or equal to 125° C. for one hour or longer after the treatment for trapping electrons.

For the gate electrode 536a and the conductive layer 536b, a conductive film of Al, Ti, Cr, Co, Ni, Cu, Y, Zr, Mo, Ru, Ag, Ta, W, or the like can be used. Alternatively, a stack of the above materials may be used. Alternatively, a conductive film containing nitrogen may be used. For example, a stack in which a titanium nitride film and a tungsten film are stacked in this order, a stack in which a tungsten nitride film and a tungsten film are stacked in this order, a stack in which a tantalum nitride film and a tungsten film are stacked in this order, or the like can be used.

The interlayer insulating film 537 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The interlayer insulating film 537 may also be a stack of any of the above materials.

The interlayer insulating film 537 is preferably an oxide insulating film containing excess oxygen. An oxide insulating film containing excess oxygen refers to an oxide insulating film from which oxygen can be released by heat treatment or the like. The film is preferably a film in which the amount of released oxygen converted into oxygen atoms is greater than or equal to $1.0\times10^{19}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. Oxygen released from the oxide insulating film can be diffused to the channel formation region in the semiconductor film 533 that is formed using an oxide semiconductor, so that oxygen vacancies formed in the channel formation region can be filled with the oxygen. In this manner, stable electrical characteristics of the transistor can be achieved.

(Embodiment 5)

In this embodiment, the OS transistor described in the above embodiment will be described.

<Characteristics of OS Transistor>

The off-state current of the OS transistor can be reduced by reducing the concentration of impurities in an oxide semiconductor to make the oxide semiconductor intrinsic or substantially intrinsic. The term "substantially intrinsic" refers to the state where an oxide semiconductor has a carrier density of lower than $1\times10^{17}$/cm$^3$, preferably lower than $1\times10^{15}$/cm$^3$, more preferably lower than $1\times10^{13}$/cm$^3$. In the oxide semiconductor, hydrogen, nitrogen, carbon, silicon, and metal elements that are not main components are impurities. For example, hydrogen and nitrogen form donor states to increase the carrier density.

A transistor including an intrinsic or substantially intrinsic oxide semiconductor has a low carrier density and is thus less likely to have negative threshold voltage. In addition, because of few carrier traps in the oxide semiconductor, the transistor including the oxide semiconductor has small variation in electrical characteristics and high reliability. Furthermore, the transistor including the oxide semiconductor can have an extremely low off-state current.

For example, the OS transistor with a reduced off-state current can exhibit a normalized off-state current per micrometer in channel width of lower than or equal to $1\times10^{-18}$ A, preferably lower than or equal to $1\times10^{-21}$ A, more preferably lower than or equal to $1\times10^{-24}$ A at room temperature (approximately 25° C.), or lower than or equal to $1\times10^{-15}$ A, preferably lower than or equal to $1\times10^{-18}$ A, more preferably lower than or equal to $1\times10^{-21}$ A at 85° C.

<Off-state Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to off-state current at given Vgs, off-state current at Vgs in a given range, or off-state current at Vgs at which sufficiently low off-state current is obtained.

As an example, the assumption is made of an n-channel transistor in which the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is lower than or equal to $1\times10^{-19}$ A at Vgs of −0.5 V or at Vgs in the range of −0.8 V to −0.5 V; therefore, it can be said that the off-state current of the transistor is lower than or equal to $1\times10^{-19}$ A. Since there is Vgs at which the drain current of the transistor is lower than or equal to $1\times10^{-22}$ A, it can be said that the off-state current of the transistor is lower than or equal to $1\times10^{-22}$ A.

In this specification, the off-state current of a transistor with a channel width W is sometimes represented by a current value per channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperatures in the range of 5° C. to 35° C.) is lower than or equal to I, it can be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds at which the semiconductor device or the like is used. When Vds has a given value and there is Vgs at which the off-state current of a transistor is lower than or equal to I, it can be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds at which the semiconductor device or the like is used.

In the above description of the off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

Note that at least indium (In) or zinc (Zn) is preferably contained as an oxide semiconductor used for a semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

<Impurity in Oxide Semiconductor>

When an oxide semiconductor film included in the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment), and oxygen vacancies therein are filled by the oxygen adding treatment, so that the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

<Structure of Oxide Semiconductor>

Next, a structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 40A:
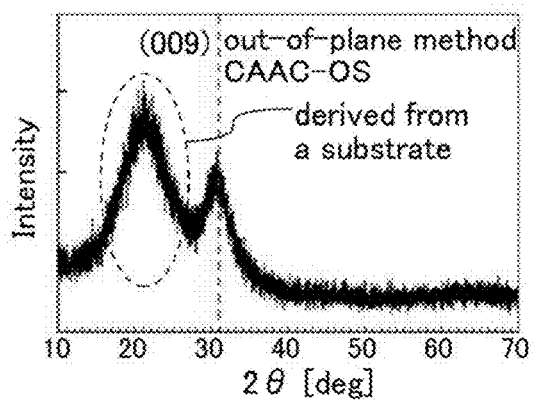
FIGS. 40A to 40E show structural analyses of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 40A. This peak is derived from the (009) plane of the InGaZnO$_4$ crystal, which indicates that crystals in the CAAC-OS have c-axis alignment, and that the c-axes are aligned in a direction substantially perpendicular to a surface over which a CAAC-OS film is formed (also referred to as a formation surface) or the top surface of the CAAC-OS film. Note that a peak sometimes appears at 2θ of around 36° in addition to the peak at 2θ of around 31°. The peak at 2θ of around 36° is derived from a crystal structure classified into the space group Fd-3m; thus, this peak is preferably not exhibited in a CAAC-OS.

Figure 40B:
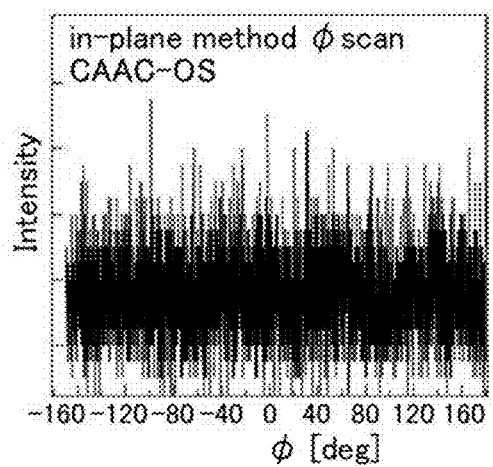
Figure 40C:
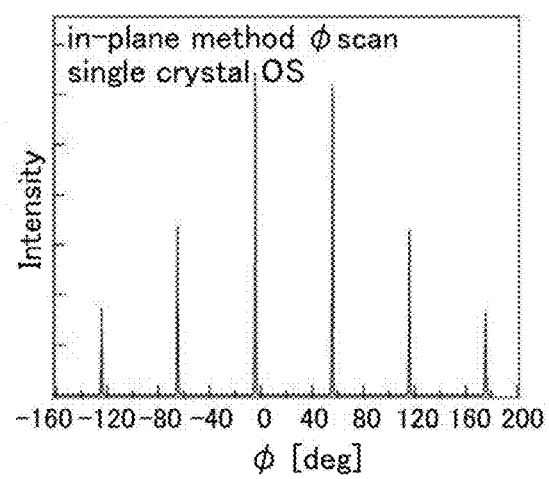

On the other hand, in structural analysis of a CAAC-OS by an in-plane method in which an X-ray is incident on the CAAC-OS in a direction parallel to the formation surface, a peak appears at 2θ of around 56°. This peak is derived from the (110) plane of the $InGaZnO_4$ crystal. When analysis (ϕ scan) is performed with 2θ fixed at around 56° and with the sample rotated using a normal vector to the sample surface as an axis (ϕ axis), as shown in FIG. 40B, a peak is not clearly observed. In contrast, in the case where single crystal $InGaZnO_4$ is subjected to ϕ scan with 2θ fixed at around 56°, as shown in FIG. 40C, six peaks which are derived from crystal planes equivalent to the (110) plane are observed. Accordingly, the structural analysis using XRD shows that the directions of a-axes and b-axes are irregularly oriented in a CAAC-OS.

Figure 40D:
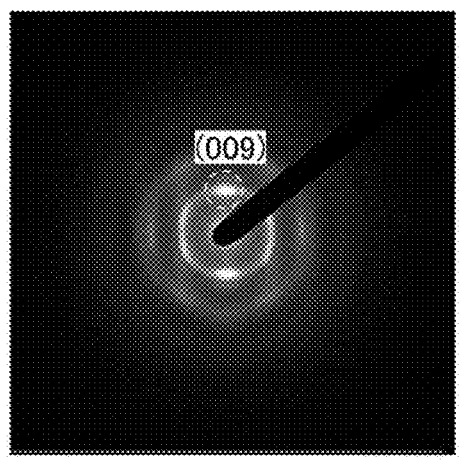
Figure 40E:
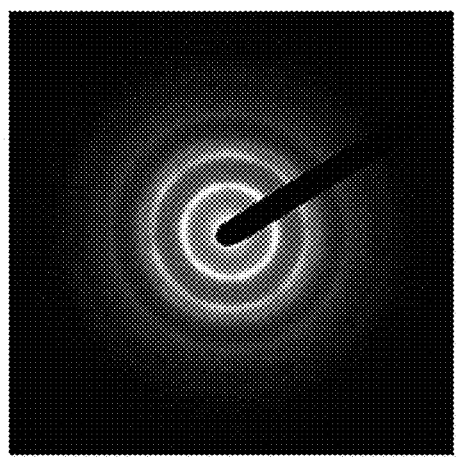

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 40D can be obtained in some cases. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 40E shows a diffraction pattern obtained in such a manner that an electron beam with a probe diameter of 300 nm is incident on the same sample in a direction perpendicular to the sample surface. As shown in FIG. 40E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 40E is considered to be derived from the (010) plane, the (100) plane, and the like of the $InGaZnO_4$ crystal. Furthermore, it is supposed that the second ring in FIG. 40E is derived from the (110) plane and the like.

In a combined analysis image (also referred to as a high-resolution TEM image) of a bright-field image and a diffraction pattern of a CAAC-OS, which is obtained with a transmission electron microscope (TEM), a plurality of pellets can be observed. However, even in the high-resolution TEM image, a boundary between pellets, that is, a grain boundary is not clearly observed in some cases. Thus, in a CAAC-OS, a reduction in electron mobility due to the grain boundary is less likely to occur.

Figure 41A:
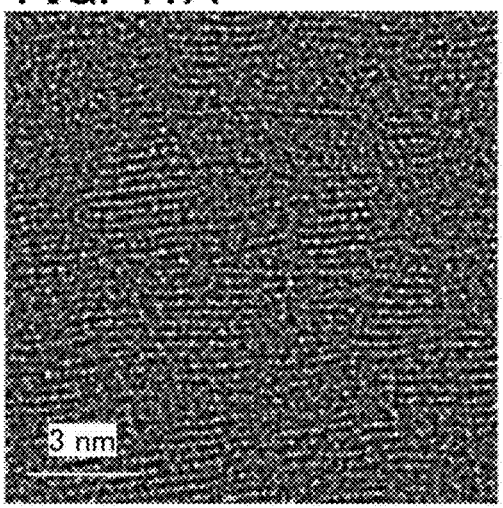
FIGS. 41A to 41E are a cross-sectional TEM image and plan-view TEM images of a CAAC-OS and images obtained through analyses thereof.

FIG. 41A shows a high-resolution TEM image of a cross section of a CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 41A shows pellets in which metal atoms are arranged in a layered manner. FIG. 41A proves that the size of a pellet is greater than or equal to 1 nm, or greater than or equal to 3 nm. Therefore, the pellet can also be referred to as a nanocrystal (nc). Furthermore, a CAAC-OS can also be referred to as an oxide semiconductor including c-axis aligned nanocrystals (CANC). A pellet reflects unevenness of a formation surface or a top surface of a CAAC-OS, and is parallel to the formation surface or the top surface of a CAAC-OS.

Figure 41B:
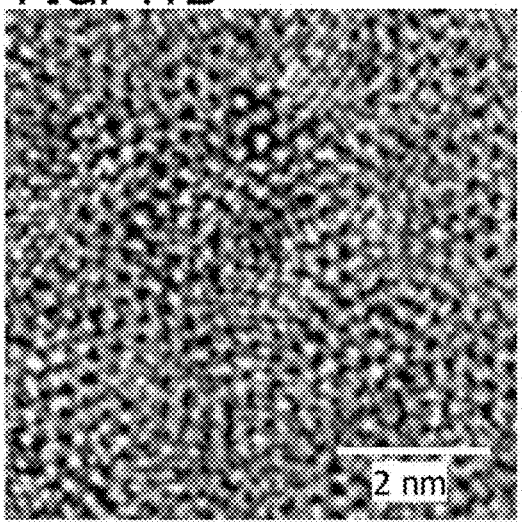
Figure 41C:
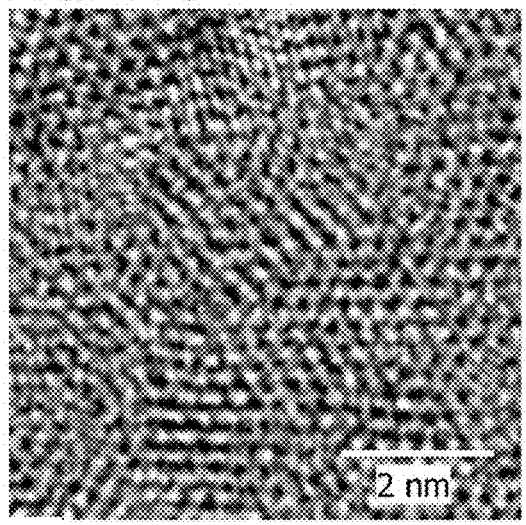
Figure 41D:
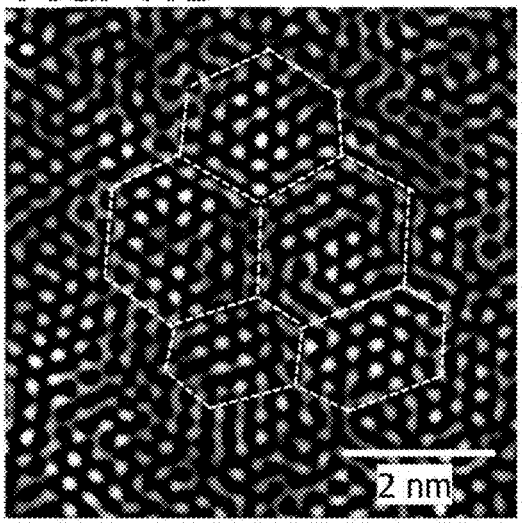
Figure 41E:
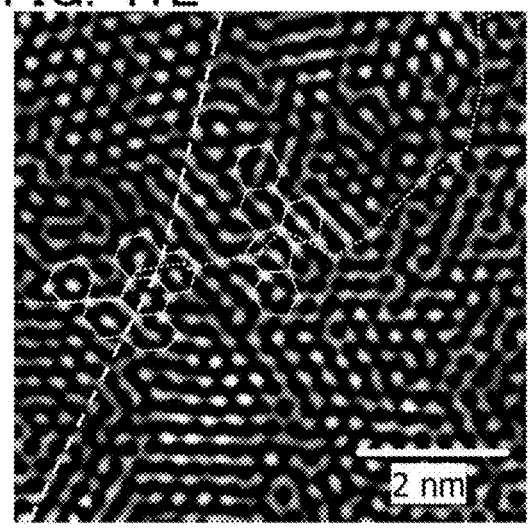

FIGS. 41B and 41C show Cs-corrected high-resolution TEM images of a plane of a CAAC-OS observed from a direction substantially perpendicular to the sample surface. FIGS. 41D and 41E are images obtained through image processing of FIGS. 41B and 41C. The method of image processing is as follows. The image in FIG. 41B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted and shows a lattice arrangement.

In FIG. 41D, a portion where a lattice arrangement is broken is denoted by a dashed line. A region surrounded by a dashed line is one pellet. A portion denoted by a dashed line is a junction of pellets. The dashed line draws a hexagon, which means that the pellet has a hexagonal shape. Note that the shape of the pellet is not always a regular hexagon but is a non-regular hexagon in many cases.

In FIG. 41E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon can be formed, for example. That is, a lattice arrangement is distorted so that formation of a crystal grain boundary is inhibited. This is probably because a CAAC-OS can tolerate distortion owing to a low density of the atomic arrangement in an a-b plane direction, an interatomic bond distance changed by substitution of a metal element, and the like.

As described above, a CAAC-OS has c-axis alignment, its pellets (nanocrystals) are connected in an a-b plane direction, and the crystal structure has distortion. For this reason, a CAAC-OS can also be referred to as an oxide semiconductor including c-axis-aligned a-b-plane-anchored (CAA) crystals.

A CAAC-OS is an oxide semiconductor with high crystallinity. Entry of impurities, formation of defects, or the like might decrease the crystallinity of an oxide semiconductor. This means that a CAAC-OS has small amounts of impurities and defects (e.g., oxygen vacancies).

Note that the impurity means an element other than the main components of an oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius) and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

A CAAC-OS having small amounts of impurities and oxygen vacancies is an oxide semiconductor with a low carrier density (specifically, lower than $8 \times 10^{11}/cm^3$, preferably lower than $1 \times 10^{11}/cm^3$, more preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, a CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 42A:
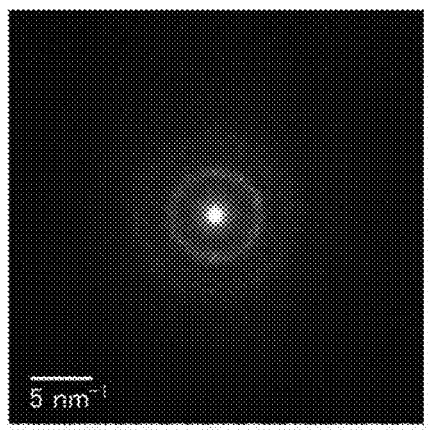
FIGS. 42A to 42D show electron diffraction patterns and a cross-sectional TEM image of an nc-OS.
Figure 42B:
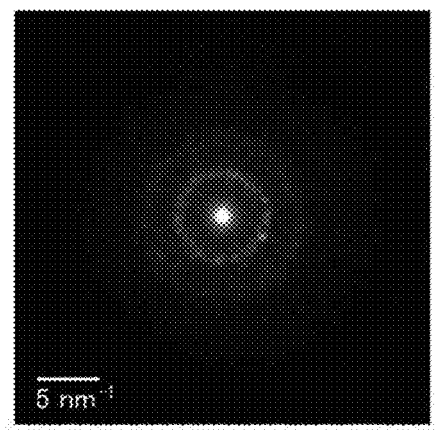

For example, when an electron beam with a probe diameter of 50 nm is incident on a 34-nm-thick region of a thinned nc-OS including an $InGaZnO_4$ crystal in a direction parallel to the formation surface, a ring-like diffraction pattern (a nanobeam electron diffraction pattern) shown in FIG. 42A is observed. FIG. 42B shows a diffraction pattern obtained when an electron beam with a probe diameter of 1 nm is incident on the same sample. As shown in FIG. 42B, a plurality of spots are observed in a ring-like region. In other words, ordering in an nc-OS is not observed with an electron beam with a probe diameter of 50 nm but is observed with an electron beam with a probe diameter of 1 nm.

Figure 42C:
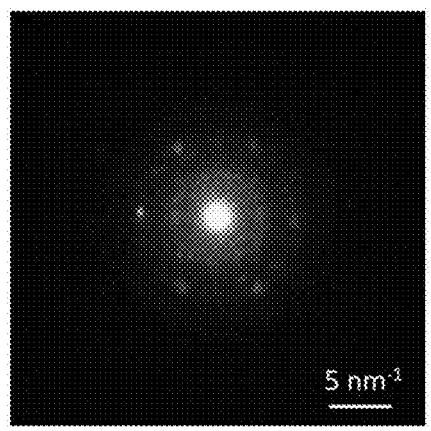

Furthermore, an electron diffraction pattern in which spots are arranged in an approximately regular hexagonal shape is observed in some cases as shown in FIG. 42C when an electron beam with a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 42D:
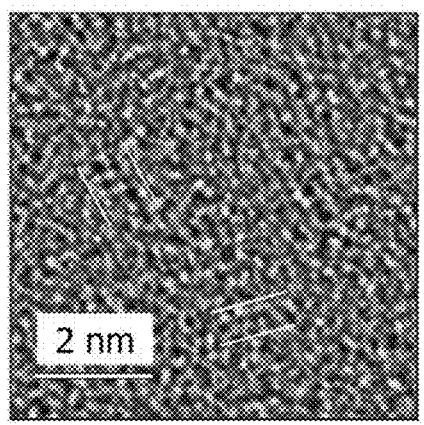

FIG. 42D shows a Cs-corrected high-resolution TEM image of a cross section of an nc-OS observed from the direction substantially parallel to the formation surface. In a high-resolution TEM image, an nc-OS has a region where a crystal part is observed, such as the part indicated by additional lines in FIG. 42D, and a region where a crystal part is not clearly observed. In most cases, the size of a crystal part included in an nc-OS is greater than or equal to 1 nm and less than or equal to 10 nm, specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of an nc-OS, for example, a grain boundary is not always observed clearly. Note that there is a possibility that the origin of the nanocrystal is the same as that of a pellet in a CAAC-OS. Therefore, a crystal part of an nc-OS may be referred to as a pellet in the following description.

As described above, in an nc-OS, a microscopic region (for example, a region with a size of greater than or equal to 1 nm and less than or equal to 10 nm, in particular, a region with a size of greater than or equal to 1 nm and less than or equal to 3 nm) has a periodic atomic arrangement. There is no regularity of crystal orientation between different pellets in an nc-OS. Thus, the orientation of the whole film is not observed. Accordingly, an nc-OS cannot be distinguished from an a-like OS or an amorphous oxide semiconductor, depending on an analysis method.

Since there is no regularity of crystal orientation between the pellets (nanocrystals) as mentioned above, an nc-OS can also be referred to as an oxide semiconductor including random aligned nanocrystals (RANC) or an oxide semiconductor including non-aligned nanocrystals (NANC).

An nc-OS is an oxide semiconductor that has high regularity as compared with an amorphous oxide semiconductor. Therefore, an nc-OS is likely to have a lower density of defect states than an a-like OS and an amorphous oxide semiconductor. Note that there is no regularity of crystal orientation between different pellets in an nc-OS. Therefore, an nc-OS has a higher density of defect states than a CAAC-OS.

<a-like OS>

An a-like OS has a structure intermediate between those of an nc-OS and an amorphous oxide semiconductor.

FIGS. 43A and 43B are high-resolution cross-sectional TEM images of an a-like OS. FIG. 43A is the high-resolution cross-sectional TEM image of the a-like OS at the start of electron irradiation. FIG. 43B is the high-resolution cross-sectional TEM image of the a-like OS after the electron ($e^-$) irradiation at $4.3 \times 10^8$ $e^-/nm^2$. FIGS. 43A and 43B show that stripe-like bright regions extending vertically are observed in the a-like OS from the start of the electron irradiation. It can be also found that the shape of the bright region changes after the electron irradiation. Note that the bright region is presumably a void or a low-density region.

An a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 44:
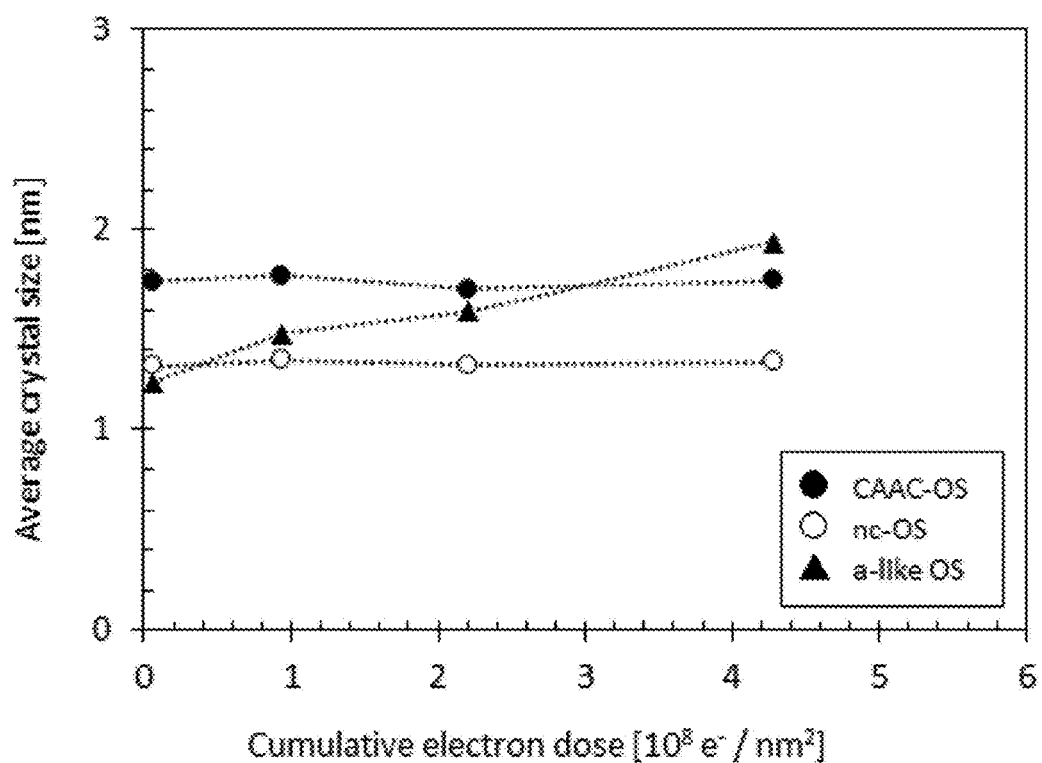
FIG. 44 shows changes in crystal parts of In—Ga—Zn oxides caused by electron irradiation.

FIG. 44 shows a change in the average size of crystal parts (at 22 points to 30 points) in each sample. Note that the crystal part size corresponds to the length of a lattice fringe. FIG. 44 indicates that the crystal part size in an a-like OS increases with an increase in the cumulative electron dose in obtaining the TEM images, for example. As shown in FIG. 44, a crystal part of approximately 1.2 nm (also referred to as an initial nucleus) at the start of TEM observation grows to a size of approximately 1.9 nm at a cumulative electron (e⁻) dose of $4.2×10^8$ e⁻/nm². In contrast, the crystal part size in an nc-OS and a CAAC-OS shows little change from the start of electron irradiation to a cumulative electron dose of $4.2×10^8$ e⁻/nm². As shown in FIG. 44, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the acceleration voltage was 300 kV; the current density was $6.7×10^5$ e⁻/(nm²·s); and the diameter of an irradiation region was 230 nm.

In this manner, growth of the crystal part in an a-like OS is induced by electron irradiation in some cases. In contrast, in an nc-OS and a CAAC-OS, growth of the crystal part is hardly induced by electron irradiation. Therefore, an a-like OS has an unstable structure as compared with an nc-OS and a CAAC-OS.

An a-like OS has a lower density than an nc-OS and a CAAC-OS because it contains a void. Specifically, the density of an a-like OS is higher than or equal to 78.6% and lower than 92.3% of the density of a single crystal oxide semiconductor having the same composition. The density of each of an nc-OS and a CAAC-OS is higher than or equal to 92.3% and lower than 100% of the density of a single crystal oxide semiconductor having the same composition. Note that it is difficult to deposit an oxide semiconductor having a density of lower than 78% of the density of a single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of an a-like OS is higher than or equal to 5.0 g/cm³ and lower than 5.9 g/cm³. For example, in the case of the oxide semiconductor having an atomic ratio of In:Ga:Zn=1:1:1, the density of each of an nc-OS and a CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate the density equivalent to that of a single crystal oxide semiconductor having a desired composition. The density of the single crystal oxide semiconductor having the desired composition can be calculated using a weighted average according to the combination ratio of the single crystal oxide semiconductors having different compositions. Note that it is preferable to use as few kinds of single crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The OS transistor can achieve extremely favorable off-state current characteristics.

(Embodiment 6)

In this embodiment, electronic devices each including the semiconductor device described in the above embodiment will be described. Examples of the electronic devices include devices including wireless communication units, such as computers, various portable information terminals (including mobile phones, portable game machines, audio reproducing devices, and the like), e-book readers, and wireless keyboards. A refrigerator, an air conditioner, an automobile, a washing machine, or a cooking device (e.g., a microwave oven) may also be provided with a wireless communication unit including the semiconductor device described in the above embodiment, so as to be remotely controlled by a computer or any of various portable information terminals.

Figure 37A:
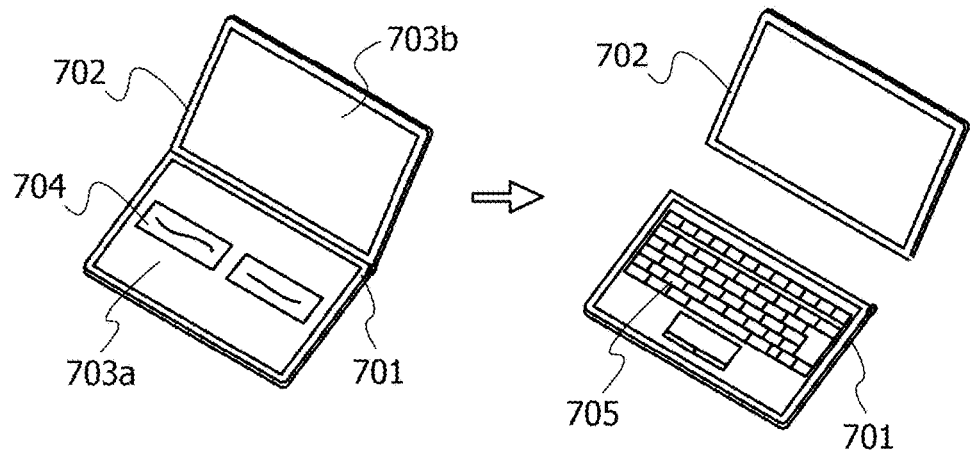
FIGS. 37A to 37D each illustrate an electronic device of one embodiment of the present invention.

FIG. 37A illustrates a portable information terminal, which includes a housing 701, a housing 702, a first display portion 703a, a second display portion 703b, and the like. The semiconductor device described in the above embodiment is provided in at least part of the housings 701 and 702. Thus, the portable information terminal can achieve low power consumption.

The first display portion 703a is a panel having a touch input function, and for example, as illustrated in a left part of FIG. 37A, which of "touch input" and "keyboard input" is performed can be selected by selection buttons 704 displayed on the first display portion 703a. Since selection buttons with a variety of sizes can be displayed, the portable information terminal can be easily used by people of any generation. In the case where "keyboard input" is selected, for example, a keyboard 705 is displayed on the first display portion 703a as illustrated in a right part of FIG. 37A. With such a structure, letters can be input quickly by keyboard input as in the case of using a conventional information terminal, for example.

Furthermore, one of the first display portion 703a and the second display portion 703b can be detached from the portable information terminal as illustrated in the right part of FIG. 37A. When the second display portion 703b is also a panel having a touch input function, the portable information terminal has a further reduced weight and is thus easy to carry, which is convenient because operation can be performed with one hand while the other hand supports the housing 702.

The portable information terminal illustrated in FIG. 37A can have a function of displaying various kinds of information (e.g., a still image, a moving image, and a text image), a function of displaying a calendar, a date, the time, or the like on the display portion, a function of operating or editing information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

With the portable information terminal illustrated in FIG. 37A, desired book data or the like can be purchased and downloaded from an electronic book server through wireless communication. Furthermore, the housing 702 illustrated in FIG. 37A may have an antenna, a microphone function, or a wireless communication function to be used as a mobile phone. Note that data communication between the housings 701 and 702 that are separated from each other can be performed through wireless communication.

Figure 37B:
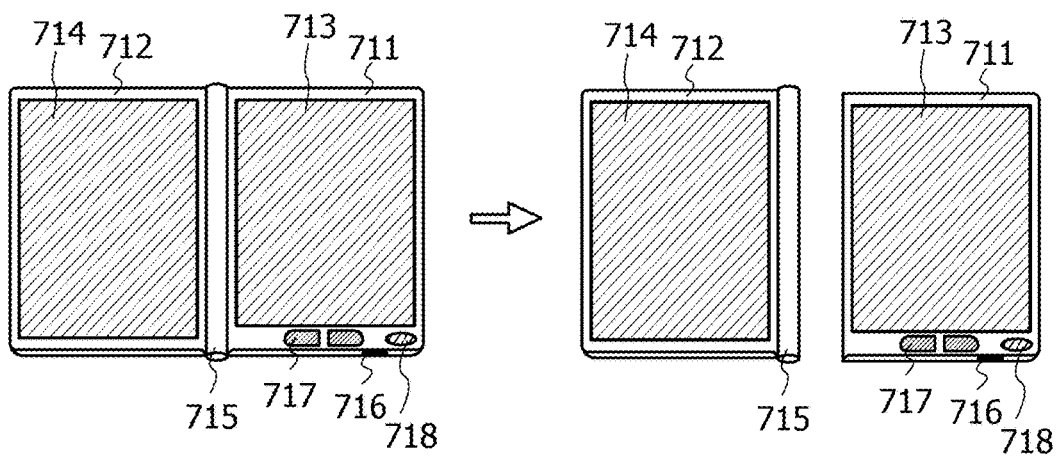

FIG. 37B illustrates an e-book reader incorporating electronic paper, which includes two housings, a housing 711 and a housing 712. The housing 711 and the housing 712 include a display portion 713 and a display portion 714, respectively. For example, the display portion 714 may be formed using electronic paper, and the display portion 713 may be formed using a display device that has a high response speed and is favorable for displaying a moving image, such as a liquid crystal display device or an organic light-emitting display device.

The housing 711 is connected to the housing 712 through a hinge 715, so that the e-book reader can be opened and closed using the hinge 715 as an axis. The housing 711 is provided with a power switch 716, operation keys 717, a speaker 718, and the like. At least one of the housings 711 and 712 is provided with the semiconductor device described in the above embodiment. Thus, the e-book reader can achieve low power consumption.

The housings 711 and 712 may each be provided with a secondary battery so as to be separately driven as in a right part of FIG. 37B, for example. For example, the housing 712 may be provided with a communication device that can be connected to a mobile phone line and a device that complies with a short-distance wireless communication standard (e.g., wireless LAN or Bluetooth), and the housing 711 may be provided with a short-distance wireless communication device. In that case, data received by the housing 712 through the mobile phone line is transferred to the housing 711 using a short-distance wireless communication standard. Data input from the housing 711 is transmitted to the housing 712 using a short-distance wireless communication standard and then transmitted to the mobile phone line. That is, the housing 712 functions as a wireless modem.

The housings 711 and 712 can be configured to sound an alarm, or the display portion 713 can be configured to display a message in the case where communication is (or might be) unintentionally interrupted when the distance between the housings 711 and 712 increases. In this manner, a risk of losing the housings can be reduced.

In the case of such usage, for example, the housing 712 is usually put in a bag, and the housing 711 is held with a hand or placed at a position from which the housing 711 can be easily taken out (e.g., in a pocket of clothes), so that simple operation can be performed by the housing 711. For example, part or all of data can be stored in the housing 712 or transmitted to the housing 712 using a short-distance wireless communication standard to be read or viewed on the housing 712 as needed.

Figure 37C:
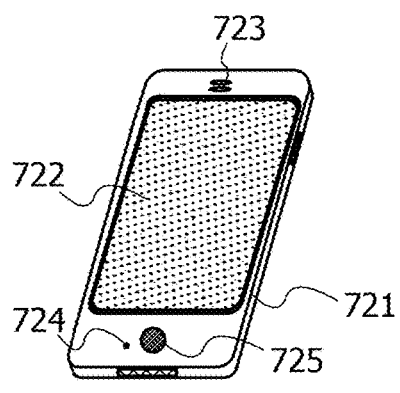

FIG. 37C illustrates a smartphone. A housing 721 of the smartphone is provided with a display portion 722, a speaker 723, a microphone 724, an operation button 725, and the like. The housing 721 is provided with the semiconductor device described in the above embodiment. It is thus possible to obtain a smartphone.

Figure 37D:
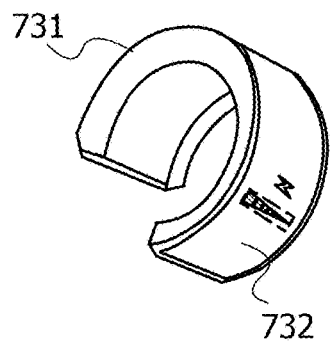

FIG. 37D illustrates a wristband type display device including a housing 731, a display portion 732, and the like. The semiconductor device described in the above embodiment is provided in the housing 731. Thus, the wristband type display device can achieve low power consumption.

(Supplementary Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that a content (or may be part of the content) described in one embodiment may be applied to, combined with, or replaced with a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each embodiment, one embodiment of the present invention has been described; however, one embodiment of the present invention is not limited to the described embodiment. For example, although an example in which an analog potential is held in the sample-and-hold circuit 101 by utilizing the transistor 112 and power supply to the buffer circuit 111 or the like is stopped is shown as one embodiment of the present invention in Embodiment 2, one embodiment of the present invention is not limited thereto. Depending on circumstances, a structure in which an analog potential is held in the sample-and-hold circuit 101 without the use of the transistor 112 and power supply to the buffer circuit 111 or the like is stopped may be taken as one embodiment of the present invention. Alternatively, depending on circumstances, a structure in which power supply to the buffer circuit 111 or the like is not stopped may be taken as one embodiment of the present invention.

<Notes on the Description of Drawings>

In this specification and the like, terms for describing arrangement, such as "over" and "under", are used for convenience to indicate a positional relation between components with reference to the drawings. Furthermore, the positional relation between components is changed as appropriate in accordance with a direction in which the components are described. Therefore, the terms for describing arrangement are not limited to those used in this specification and may be changed to other terms as appropriate depending on circumstances.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is the case where one circuit is concerned with a plurality of functions or the case where a plurality of circuits are concerned with one function. Therefore, the segmentation of a block in the block diagrams is not limited by any of the components described in the specification, and can be differently determined as appropriate depending on circumstances.

In the drawings, the size, the layer thickness, or the region is determined arbitrarily for description convenience. Therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In the drawings such as top views (also referred to as plan view or layout views) and perspective views, some of components might not be illustrated for clarity of the drawings.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on circumstances.

In addition, in this specification and the like, the term such as an "electrode" or a "wiring" does not limit a function of a component. For example, an "electrode" is used as part of a "wiring" in some cases, and vice versa. Furthermore, the term such as an "electrode" or a "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and a potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Although a circuit structure in which charge is held with the use of one OS transistor and one capacitor is shown in this specification and the like, one embodiment of the present invention is not limited thereto. Charge can be held with a circuit structure including two or more transistors and two or more capacitors. Any of other various circuit structures including other wirings can also be used.

<Notes on Definitions of Terms>

Definitions of terms that are not mentioned in the above embodiments are described below.

<<Switch>>

In this specification and the like, a switch is conducting (on state) or not conducting (off state) to determine whether current flows therethrough or not. Alternatively, a switch has a function of selecting and changing a current path.

For example, an electrical switch, a mechanical switch, or the like can be used as a switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state where a source and a drain of the transistor are electrically short-circuited. Furthermore, an "off state" of the transistor refers to a state where the source and the drain of the transistor are electrically disconnected. In the case where a transistor operates just as a switch, the polarity (conductivity type) of the transistor is not particularly limited to a certain type.

An example of a mechanical switch is a switch formed using MEMS (micro electro mechanical system) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other, or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions are necessarily the same. In other words, a channel width of one transistor is not limited to one value in some cases. Therefore, in this specification, a channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the one in the case where an effective channel width is used for the calculation is obtained in some cases.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation to the expressions. Here, X, Y, Z1, and Z2 each denote an object (e.g., a device, an element, a circuit, a wiring, an electrode, a terminal, a conductive film, or a layer).

EXAMPLE 1

In this example, the following test was carried out in order to examine communication characteristics of the semiconductor device of one embodiment of the present invention provided inside a tire.

First, a tire, a wireless tag, and an interrogator were prepared. A spectrum analyzer was also prepared in order to analyze a radio wave from the interrogator.

As the tire, B-style RV manufactured by Bridgestone Corporation was used. The specifications of the tire were as follows: the tire width was 215 mm, the aspect ratio was 65%, the radial structure was used, the rim diameter was 16 inches, the load index was 98 (the maximum load capability was 750 kg), and the speed range was 210 km/h.

As the wireless tag, a wireless tag manufactured by SMARTRAC. N.V. was used. On the wireless tag, Monza 4D manufactured by Impinj, Inc. was mounted. As the interrogator (reader/writer), V750-BC50C04-JP manufactured by OMRON Corporation was used. The frequency was 915.7 MHz to 921.5 MHz, and FM0 encoding was used.

As the spectrum analyzer, RSA3408A manufactured by Tektronix, Inc. was used. A probe of the spectrum analyzer was put inside the tire.

Figure 38A:
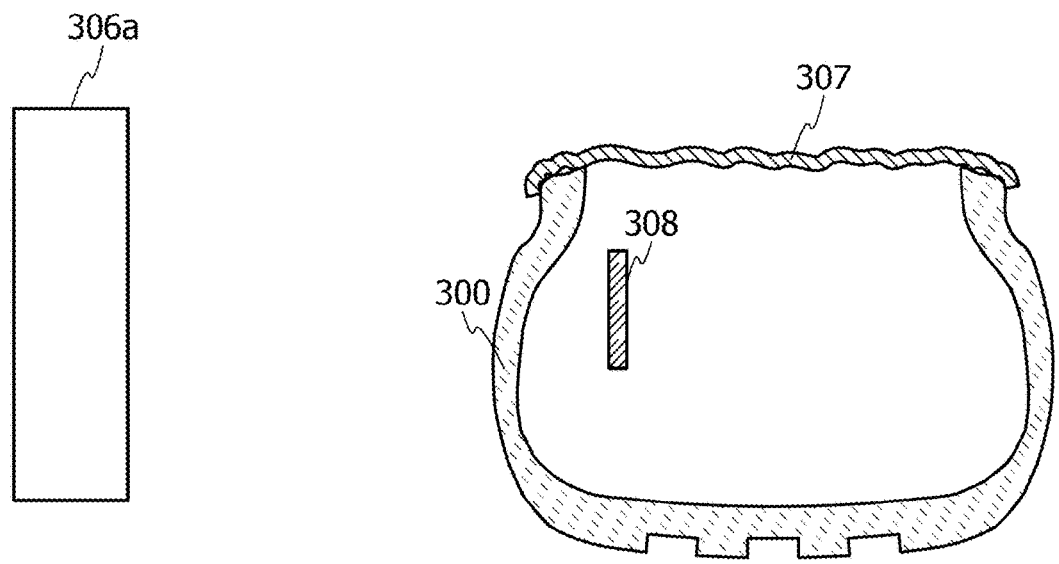
FIGS. 38A and 38B are schematic views each illustrating one embodiment of the present invention.

The wireless tag and the probe of the spectrum analyzer were positioned on the side portion inside the tire, and an opening of the tire was covered with aluminum foil. The interrogator was disposed outside the tire. The interrogator was disposed such that an antenna of the interrogator and an antenna of the wireless tag were substantially parallel to each other. FIG. 38A schematically illustrates a positional relation of an antenna 306*a* of the interrogator, a wireless tag 308, a tire 300, and aluminum foil 307. Note that FIGS. 38A and 38B are cross-sectional views.

Figure 39:
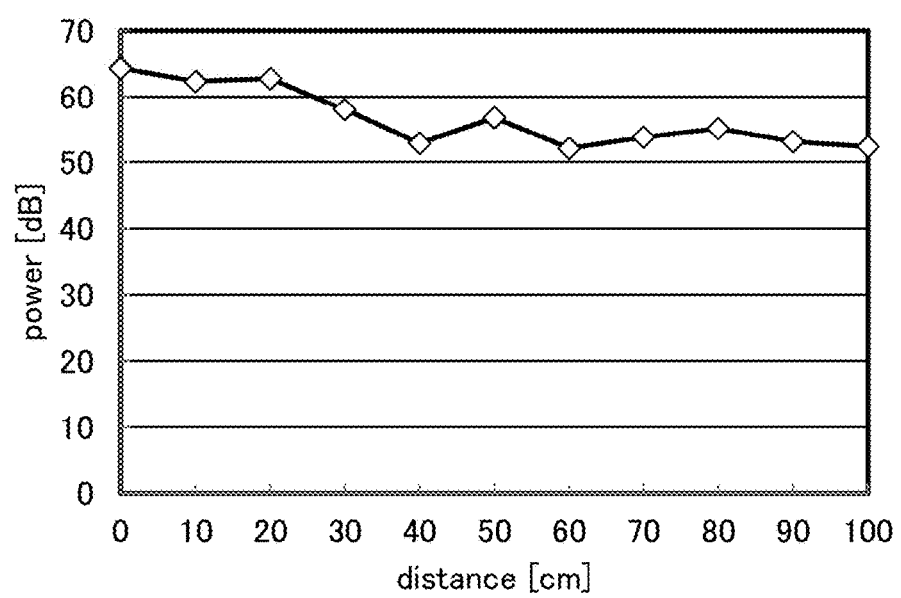
FIG. 39 is a graph showing a relation between the distance and the power.

A relation between the power of a radio wave and the distance between the interrogator and the probe of the spectrum analyzer was examined. The power of a radio wave was 64.374, 62.36, 62.775, 58.017, 52.843, 56.733, 52.07, 53.727, 55.092, 53.072, and 52.318 [dB] with a distance of 0, 10, 20, 30, 40, 50, 60, 70, 80, 90, and 100 [cm], respectively. The power of a radio wave was determined on the basis of the level of a radio wave which the antenna receives when a radio wave is not transmitted. FIG. 39 shows a relation between the distance and the power of a radio wave. A response of the wireless tag was confirmed in the range of the distance of 0 cm to 100 cm. In the case where the tire was provided between the interrogator and the probe of the spectrum analyzer, the distance is a distance from the surface of the inside portion of the tire. In the case where the tire was not provided therebetween, the power of a radio wave was 72.772 dB with a distance between the interrogator and the probe of the spectrum analyzer of 0 cm.

Figure 38B:
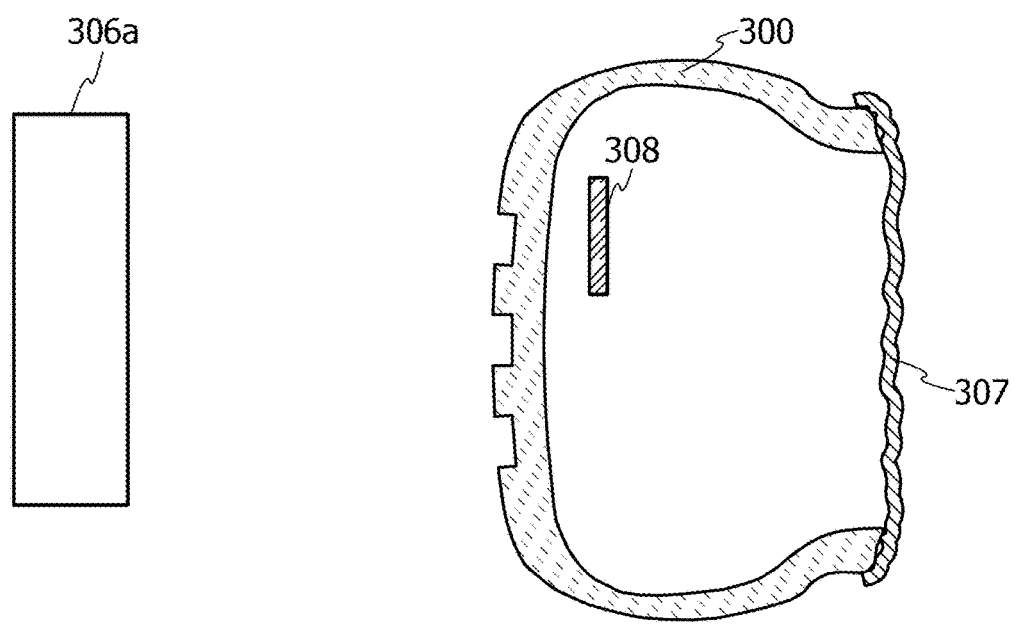

When the wireless tag was provided at the bottom of the tire as in the arrangement in FIG. 38B and the test was carried out, a response of the wireless tag was not able to be confirmed under the same condition as that in FIG. 38A. As compared with the side portion, the bottom of the tire has a high content of a metal; thus, it is possible that the intensity of a radio wave needs to be high.

This application is based on Japanese Patent Application serial no. 2015-096575 filed with Japan Patent Office on May 11, 2015, the entire contents of which are hereby incorporated by reference.

What is claimed is:

1. A tire comprising a semiconductor device, the semiconductor device comprising:
   a first circuit portion comprising an analog-to-digital converter circuit and a sample-and-hold circuit;
   an antenna electrically connected to the first circuit portion; and
   a sensor element electrically connected to the first circuit portion,
   wherein the sensor element is configured to measure an air pressure of the tire,
   wherein the sample-and-hold circuit comprises a buffer circuit and a second circuit portion,
   wherein the second circuit portion comprises a transistor and a capacitor,
   wherein an analog potential is supplied to one of a source and a drain of the transistor through the buffer circuit,
   wherein charge corresponding to the analog potential is held at the other of the source and the drain of the transistor and in the capacitor by turning off the transistor, and
   wherein supply of a power supply voltage to the buffer circuit is stopped when the charge corresponding to the analog potential is held.

2. The tire according to claim 1, wherein the transistor comprises an oxide semiconductor.

3. The tire according to claim 1, wherein the semiconductor device is capable of wireless communication.

4. The tire according to claim 1, wherein the semiconductor device is positioned on a side surface of the tire.

5. A semiconductor device comprising:
   a first circuit portion comprising an analog-to-digital converter circuit and a plurality of sample-and-hold circuits;
   an antenna electrically connected to the first circuit portion; and
   a plurality of sensor elements electrically connected to the first circuit portion,
   wherein each of the sample-and-hold circuits comprises a buffer circuit and a second circuit portion,
   wherein the second circuit portion comprises a transistor and a capacitor,
   wherein an analog potential is supplied to one of a source and a drain of the transistor through the buffer circuit,
   wherein, in the second circuit portion, charge corresponding to the analog potential is held at the other of the source and the drain of the transistor and in the capacitor by turning off the transistor,
   wherein supply of a power supply voltage to the buffer circuit is stopped when the charge corresponding to the analog potential is held, and
   wherein the plurality of sensor elements are configured to measure two or more of a pressure, a temperature, strain, and acceleration.

6. The semiconductor device according to claim 5, wherein the semiconductor device is disposed in a sealed space.

7. The semiconductor device according to claim 5, wherein the analog-to-digital converter circuit comprises a comparator, a successive approximation register, and a digital-to-analog converter circuit.

8. The semiconductor device according to claim 5, wherein the transistor comprises an oxide semiconductor.

9. A tire comprising the semiconductor device according to claim 5.

10. A moving object comprising:
    the semiconductor device according to claim 5; and
    an interrogator,
    wherein the semiconductor device is positioned inside a tire, and
    wherein the interrogator is positioned outside the tire.

11. A moving object comprising:
    the semiconductor device according to claim 5; and
    an interrogator,
    wherein a distance between the semiconductor device and the interrogator is greater than or equal to 5 cm and less than or equal to 2 m.

12. A method for driving a semiconductor device, the semiconductor device comprising a wireless circuit comprising a circuit portion, an antenna, and m sensor elements, wherein the circuit portion comprises an analog-to-digital converter circuit and n sample-and-hold circuits, and wherein an x-th sensor element is connected to a corresponding sample-and-hold circuit of the n sample-and-hold circuits, the method comprising:
    a first step in which analog potentials output from the m sensor elements are each input to a corresponding sample-and-hold circuit of the n sample-and-hold circuits,
    a second step in which the analog potentials input to the n sample-and-hold circuits are held, and
    a third step in which the analog potentials output from first to n-th sample-and-hold circuits are sequentially input to the analog-to-digital converter circuit,
    wherein m is an integer,
    wherein n is an integer, and wherein x is an integer of greater than or equal to 1 and less than or equal to m.

13. The method for driving a semiconductor device, according to claim 12,
- wherein a y-th sample-and-hold circuit comprises a buffer circuit and a y-th circuit,
- wherein y is an integer of greater than or equal to 1 and less than or equal to n,
- wherein the y-th circuit comprises a y-th transistor and a y-th capacitor,
- wherein an analog potential is supplied to one of a source and a drain of the y-th transistor through the buffer circuit,
- wherein charge corresponding to the analog potential is held at the other of the source and the drain of the y-th transistor and in the y-th capacitor by turning off the y-th transistor,
- wherein supply of a power supply voltage to the buffer circuit is stopped when the charge corresponding to the analog potential is held, and
- wherein the y-th transistor comprises an oxide semiconductor.

14. The method for driving a semiconductor device, according to claim 12,
- wherein n is greater than or equal to m.

15. The method for driving a semiconductor device, according to claim 12,
- wherein the semiconductor device is mounted on a tire, and
- wherein at least one of the m sensor elements is configured to measure an air pressure of the tire.

16. The method for driving a semiconductor device, according to claim 12,
- wherein the semiconductor device is positioned on a side surface of a tire.

* * * * *